(12) United States Patent
Inagaki

(10) Patent No.: US 10,784,125 B2
(45) Date of Patent: Sep. 22, 2020

(54) SUBSTRATE TREATING APPARATUS

(71) Applicant: SCREEN Holdings Co., Ltd., Kyoto (JP)

(72) Inventor: Yukihiko Inagaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 16/353,033

(22) Filed: Mar. 14, 2019

(65) Prior Publication Data
US 2019/0295863 A1    Sep. 26, 2019

(30) Foreign Application Priority Data

Mar. 26, 2018 (JP) ................. 2018-058433

(51) Int. Cl.
*H01L 21/67* (2006.01)
*G03F 7/30* (2006.01)
*G03F 7/16* (2006.01)

(52) U.S. Cl.
CPC ........ *H01L 21/67017* (2013.01); *G03F 7/16* (2013.01); *G03F 7/30* (2013.01); *H01L 21/6715* (2013.01); *H01L 21/67173* (2013.01); *H01L 21/67184* (2013.01); *H01L 21/67225* (2013.01)

(58) Field of Classification Search
CPC ....... G03F 7/16; G03F 7/30; H01L 21/67017; H01L 21/6715; H01L 21/67173; H01L 21/67184; H01L 21/67225
See application file for complete search history.

(56) References Cited

U.S. PATENT DOCUMENTS

| | | | | |
|---|---|---|---|---|
| 6,063,439 | A | 5/2000 | Semba et al. | 427/240 |
| 6,332,724 | B1 * | 12/2001 | Yano | H01L 21/67109 118/52 |
| 6,715,943 | B2 * | 4/2004 | Nagamine | H01L 21/67051 118/52 |

(Continued)

FOREIGN PATENT DOCUMENTS

| | | |
|---|---|---|
| JP | H11-003851 A | 1/1999 |
| KR | 10-1999-0006894 A | 1/1999 |

(Continued)

OTHER PUBLICATIONS

Office Action dated Apr. 21, 2020 for corresponding Taiwan Patent Application No. 108109288.

(Continued)

*Primary Examiner* — Deoram Persaud
(74) *Attorney, Agent, or Firm* — Ostrolenk Faber LLP

(57) ABSTRACT

Disclosed is a substrate treating apparatus including a first liquid treatment chamber that performs a liquid treatment to a substrate, a second liquid treatment chamber that is disposed below the first liquid treatment chamber and performs a liquid treatment to a substrate, a first feed channel that supplies gases to the first liquid treatment chamber, and a second feed channel that supplies gases to the second liquid treatment chamber. The first feed channel includes a first vertical member that extends substantially vertically. The second feed channel includes a second vertical member that extends substantially vertically. The first vertical member and the second vertical member both extend to a position lower in level than the second liquid treatment chamber.

22 Claims, 18 Drawing Sheets

(56) References Cited

U.S. PATENT DOCUMENTS

| | | | |
|---|---|---|---|
| 2002/0053319 A1 | 5/2002 | Nagamine | 118/52 |
| 2008/0078327 A1* | 4/2008 | Dong-Hun | H01L 21/67017 |
| | | | 118/724 |
| 2017/0136489 A1 | 5/2017 | Maeda | |
| 2019/0157118 A1* | 5/2019 | Hombo | H01L 21/67173 |

FOREIGN PATENT DOCUMENTS

| | | |
|---|---|---|
| KR | 10-2008-0007413 A | 1/2008 |
| TW | 201719723 A | 6/2017 |

OTHER PUBLICATIONS

Office Action dated May 26, 2020 for corresponding Korean Patent Application No. 10-2019-0033613.

* cited by examiner

SUBSTRATE TREATING APPARATUS

CROSS-REFERENCE TO RELATED APPLICATIONS

This application claims priority to Japanese Patent Application No. 2018-058433 filed Mar. 26, 2018, the disclosure of which is hereby incorporated herein by reference in its entirety for all purposes.

BACKGROUND OF THE INVENTION

Field of the Invention

Technical Field

The present invention relates to a substrate treating apparatus that performs treatment to substrates. Examples of the substrates include a semiconductor wafer, a glass substrate for photomask, a substrate for liquid crystal display, a substrate for organic electroluminescence (EL), a substrate for flat panel display (FPD), a substrate for plasma display, a substrate for optical display, a magnetic disk substrate, a magneto-optical disk substrate, a substrate for photomask, and a solar cell substrate.

DESCRIPTION OF THE RELATED ART

Japanese Unexamined Patent Publication No. H11-3851A discloses a currently-used substrate treating apparatus including a resist liquid coating device and a developing device. The resist liquid coating device is disposed below the developing device.

The substrate treating apparatus further includes a first subchamber, a second subchamber, and a wall duct. The first subchamber feeds gases to the resist liquid coating device. The first subchamber is disposed above the resist liquid coating device. The second subchamber feeds gases to the developing device. The second subchamber is disposed above the developing device. The wall duct supplies gases to both the first subchamber and the second subchamber. The wall duct is disposed laterally of the resist liquid coating device and the developing device. The wall duct extends vertically. The wall duct is connected to the first subchamber at a position substantially equal in level to that of the resist liquid coating device. The wall duct is connected to the second subchamber at a position substantially equal in level to that of the developing device.

One wall duct conveys gases for the resist liquid coating device to a position substantially equal in level to that of the resist liquid coating device, and coveys the gases for the developing device to a position substantially equal in level to that of the developing device. Accordingly, flow paths of the first subchamber and the second subchamber are each short.

SUMMARY OF THE INVENTION

However, the conventional example with such a structure as above possesses the following drawback. Specifically, a supply amount of gases to the resist liquid coating device may influence a supply amount of gases to the developing device mutually.

Such a drawback that both the supply amounts of gases may produce the influence mutually is to be described taking as one example the case where a user controls the supply amount of gases to the resist liquid coating device.

The user intentionally changes the supply amount of gases to the resist liquid coating device. For instance, the user operates a first damper provided in the first subchamber. At this time, the supply amount of gases to the developing device varies in spite of user's inoperative second damper that is provided in the second subchamber. In this manner, the supply amount of gases to the developing device varies depending on variation in supply amount of gases to the resist liquid coating device.

Then, the user intentionally controls the supply amount of gases to the developing device through operation of the second damper. At this time, the supply amount of gases to the resist liquid coating device varies in spite of the inoperative first damper. In this manner, the supply amount of gases to the resist liquid coating device varies depending on variation in supply amount of gases to the developing device.

As a result, the user has to control again the supply amount of gases to the resist liquid coating device.

As described above, the supply amount gases to the resist liquid coating device may influence the supply amount of gases to the developing device mutually. Accordingly, it becomes difficult to appropriately control the supply amount of gases to the resist liquid coating device and the supply amount of gases to the developing device.

Such a drawback that both the supply amounts of gases may produce the influence mutually is not limited to the case where the user controls the supply amounts of gases. For instance, if abnormality of the first subchamber causes variation in supply amount of gases to the resist liquid coating device, the variation in supply amount of gases to the resist liquid coating device causes variation in supply amount of gases to the developing device.

The drawback that the supply amounts of gases may provide mutual influence is not limited to the resist liquid coating device and the developing device. Even if the substrate treating apparatus includes a structure to supply gases to a plurality of transport chambers, it is understood that supply amounts of gases to the transport chambers provide mutual influence.

It is further understood that a similar drawback occurs to an exhaust amounts of gases. Even if the substrate treating apparatus includes a structure to exhaust gases into a plurality of liquid treatment chambers, it is understood that exhaust amounts of gases from the liquid treatment chambers provide mutual influence. Even if the substrate treating apparatus includes a structure to exhaust gases in a plurality of transport chambers, it is understood that exhaust amounts of gases from the transport chambers provide mutual influence. Even if the substrate treating apparatus includes a structure to exhaust gases of a plurality of heat treatment chambers, it is understood that exhaust amounts of gases from the heat treatment chambers provide mutual influence.

The present invention has been made regarding the state of the art noted above. A first object of the present invention is to provide a substrate treating apparatus that is capable of suitably suppressing mutual influence among supply amounts of gases to liquid treatment chambers. A second object of the present invention is to provide a substrate treating apparatus that is capable of suitably suppressing mutual influence among supply amounts of gases to transport chambers. A third object of the present invention is to provide a substrate treating apparatus that is capable of suitably suppressing mutual influence among exhaust amounts of gases from liquid treatment chambers. A fourth object of the present invention is to provide a substrate treating apparatus that is capable of suitably suppressing mutual influence among exhaust amounts of gases from transport chambers. A fifth object of the present invention is to provide a substrate treating apparatus that is capable of suitably suppressing mutual influence between exhaust amounts of gases from heat treatment chambers.

The present invention is constituted as stated below to achieve the first object. Specifically, one aspect of the present invention discloses a substrate treating apparatus including a first liquid treatment chamber that performs a liquid treatment to a substrate, a second liquid treatment chamber that is disposed below the first liquid treatment chamber and performs a liquid treatment to a substrate, a first feed channel that supplies gases to the first liquid treatment chamber, and a second feed channel that supplies gases to the second liquid treatment chamber. The first feed channel includes a first vertical member that extends substantially vertically. The second feed channel includes a second vertical member that extends substantially vertically. The first vertical member and the second vertical member both extend to at least either a position higher in level than the first liquid treatment chamber or a position lower in level than the second liquid treatment chamber.

Although the second liquid treatment chamber is disposed below the first liquid treatment chamber, the first feed channel includes the first vertical member and the second feed channel includes the second vertical member. The first vertical member and the second vertical member both extend to at least either the position higher in level than the first liquid treatment chamber or the position lower in level than the second liquid treatment chamber. Accordingly, the first vertical member and the second vertical member are each relatively long. In other words, the first feed channel and the second feed channel are each relatively long. Consequently, this achieves suitable suppression in mutual influence between a supply amount of gases of the first feed channel to the first liquid treatment chamber and a supply amount of gases of the second feed channel to the second liquid treatment chamber. Consequently, this achieves suitable suppression in mutual influence between a supply amount of gases to the first liquid treatment chamber and a supply amount of gases to the second liquid treatment chamber.

As noted above, the substrate treating apparatus achieves suitable suppression in mutual influence among the supply amounts of gases to the liquid treatment chambers.

It is preferred in the substrate treating apparatus mentioned above that one of the first vertical member and the second vertical member is longer than the other of the first vertical member and the second vertical member, and that the one of the first vertical member and the second vertical member has a channel sectional area larger than that of the other of the first vertical member and the second vertical member. When the first vertical member is longer than the second vertical member, the first vertical member has a channel sectional area larger than the second vertical member. Consequently, this achieves suppression of excessive increase in pressure loss of the first vertical member relative to pressure loss of the second vertical member. When the second vertical member is longer than the first vertical member, the second vertical member has a channel sectional area larger than the first vertical member. Consequently, this achieves suppression of excessive increase in pressure loss of the second vertical member relative to pressure loss of the first vertical member.

It is preferred that the substrate treating apparatus mentioned above further includes a first regulator that is provided on the first feed channel and regulates a flow rate of the gases flowing in the first feed channel, and a second regulator that is provided on the second feed channel and regulates a flow rate of the gases flowing in the second feed channel, and that the first regulator is disposed downstream of the first vertical member and the second regulator is disposed downstream of the second vertical member. The first regulator is disposed downstream of the first vertical member. Accordingly, a part of the first feed channel disposed upstream of the first regulator includes the first vertical member. Consequently, the part of the first feed channel disposed upstream of the first regulator is relatively long. The second regulator is disposed downstream of the second vertical member. Accordingly, a part of the second feed channel disposed upstream of the second regulator includes the second vertical member. Consequently, the part of the second feed channel disposed upstream of the second regulator is relatively long. Consequently, this achieves more suitable suppression in mutual influence between a supply amount of gases to the first liquid treatment chamber and a supply amount of gases to the second liquid treatment chamber.

It is preferred that the substrate treating apparatus mentioned above further includes a distributing pipe that is connected to the first feed channel and the second feed channel for supplying gases to the first feed channel and the second feed channel, and that the distributing pipe is connected to both the first feed channel and the second feed channel at either a position higher in level than the first liquid treatment chamber or a position lower in level than the second liquid treatment chamber. This achieves suitable connection between the first feed channel and the distributing pipe in spite of presence of the first vertical member of the first feed channel. Likewise, this achieves suitable connection between the second feed channel and the distributing pipe in spite of presence of the second vertical member of the second feed channel.

It is preferred in the substrate treating apparatus mentioned above that the first feed channel includes a upstream end, the second feed channel includes a upstream end, and the distributing pipe includes a connector that connects the upstream end of the first feed channel and the upstream end of the second feed channel, and that the connector extends in a direction substantially equal to a direction where the upstream end of the first feed channel extends, and the connector extends in a direction substantially equal to a direction where the upstream end of the second feed channel extends. The extending direction of the connector is substantially equal to that of the upstream end of the first feed channel. Accordingly, this achieves smooth flow of gases from the connector of the distributing pipe to the upstream end of the first feed channel. In other words, the distributing pipe is capable of supplying the gases to the first feed channel smoothly. The extending direction of the connector is substantially equal to that of the upstream end of the second feed channel. Accordingly, this achieves smooth flow of gases from the connector of the distributing pipe to the upstream end of the second feed channel. In other words, the distributing pipe is capable of supplying the gases to the second feed channel smoothly.

It is preferred that the substrate treating apparatus mentioned above further includes a first transport chamber that is disposed laterally of the first liquid treatment chamber and transports the substrate to the first liquid treatment chamber, a second transport chamber that is disposed below the first transport chamber and laterally of the second liquid treatment chamber and transports the substrate to the second liquid treatment chamber, a feed channel that supplies gases to the first transport chamber, and a feed channel that supplies gases to the second transport chamber, and that the distributing pipe is connected to the feed channel for the first transport chamber and the feed channel for the second transport chamber to supply gases to the feed channel for the first transport chamber and the feed channel for the second transport chamber. One distributing pipe achieves suitable supply of the gases to the first feed channel, the second feed channel, the feed channel for the first transport chamber, and the feed channel for the second transport chamber.

It is preferred that the substrate treating apparatus mentioned above further includes a box that extends substantially vertically, and a partition member arranged in the box, that the first vertical member and the second vertical member are formed in the box, and that the partition member separates the first vertical member from the second vertical member. This achieves a simplified structure of the first vertical member and the second vertical member.

It is preferred in the substrate treating apparatus mentioned above that the box includes a front wall that faces the first liquid treatment chamber and the second liquid treatment chamber and extends substantially vertically, and lateral walls that are connected to the front wall and are substantially perpendicular to the front wall, and that the front wall has a width larger than a width of each of the lateral walls. This achieves appropriate reduction in thickness of the box. Accordingly, an installation space for the box is easily obtainable with a suppressed upsizing of the substrate treating apparatus.

Moreover, it is preferred that the substrate treating apparatus includes a third feed channel that supplies gases to the first liquid treatment chamber, and a fourth feed channel that supplies gases to the second liquid treatment chamber, and that the third feed channel includes a third vertical member that extends substantially vertically, the fourth feed channel includes a fourth vertical member that extends substantially vertically, the third vertical member and the fourth vertical member both extend to at least either a position higher in level than the first liquid treatment chamber or a position lower in level than the second liquid treatment chamber. Although the second liquid treatment chamber is disposed below the first liquid treatment chamber, the third feed channel includes the third vertical member and the fourth feed channel includes the fourth vertical member. The third vertical member and the fourth vertical member both extend to at least either the position higher in level than the first liquid treatment chamber or the position lower in level than the second liquid treatment chamber. Accordingly, the third vertical member and the fourth vertical member are each relatively long. In other words, the third feed channel and the fourth feed channel are each relatively long. Consequently, this achieves suitable suppression in mutual influence among a supply amount of gases of the first feed channel to the first liquid treatment chamber, a supply amount of gases of the second feed channel to the second liquid treatment chamber, a supply amount of gases of the third feed channel to the first liquid treatment chamber, and a supply amount of gases of the fourth feed channel to the second liquid treatment chamber. Consequently, this achieves more suitable suppression in mutual influence between a supply amount of gases to the first liquid treatment chamber and a supply amount of gases to the second liquid treatment chamber. Moreover, the first feed channel and the third feed channel achieve effective supply of gases to the first liquid treatment chamber. Moreover, the second feed channel and the fourth feed channel achieve effective supply of gases to the second liquid treatment chamber.

It is preferred that the substrate treating apparatus mentioned above further includes a first blowing unit that is provided in the first liquid treatment chamber and blows gases into the first liquid treatment chamber, and a second blowing unit that is provided in the second liquid treatment chamber and blows gases into the second liquid treatment chamber, and that both the first feed channel and the third feed channel are connected to the first blowing unit to supply gases through the first blowing unit to the first liquid treatment chamber, and both the second feed channel and the fourth feed channel are connected to the second blowing unit to supply gases through the second blowing unit to the second liquid treatment chamber. The first feed channel and the third feed channel supply the gases through the first blowing unit to the first liquid treatment chamber. Accordingly, the first feed channel and the third feed channel are capable of supplying the gases to the first liquid treatment chamber in the same manner. Likewise, the second feed channel and the fourth feed channel supply the gases through the second blowing unit to the second liquid treatment chamber. Accordingly, the second feed channel and the fourth feed channel are capable of supplying the gases to the second liquid treatment chamber in the same manner.

It is preferred that the substrate treating apparatus mentioned above further includes a gas controller that controls a temperature and a humidity of gases, and supplies gases with a controlled temperature and humidity to the first feed channel and the second feed channel. The gases with the controlled temperature and humidity are capable of being supplied to the first liquid treatment chamber and second liquid treatment chamber.

The present invention is constituted as stated below to achieve the second object. Specifically, another aspect of the present invention discloses a substrate treating apparatus including a first transport chamber for transporting a substrate, a second transport chamber that is disposed below the first transport chamber and transports a substrate, a first feed channel that supplies gases to the first transport chamber, and a second feed channel that supplies gases to the second transport chamber. The first feed channel includes a first vertical member that extends substantially vertically. The second feed channel includes a second vertical member that extends substantially vertically. The first vertical member and the second vertical member both extend to at least either a position higher in level than the first transport chamber or a position lower in level than the second transport chamber.

Although the second transport chamber is disposed below the first transport chamber, the first feed channel includes the first vertical member and the second feed channel includes the second vertical member. The first vertical member and the second vertical member both extend to at least either the position higher in level than the first transport chamber or the position lower in level than the second transport chamber. Accordingly, the first vertical member and the second vertical member are each relatively long. In other words, the first feed channel and the second feed channel are each relatively long. Consequently, this achieves suitable suppression in mutual influence between a supply amount of gases of the first feed channel to the first transport chamber and a supply amount of gases of the second feed channel to the second transport chamber. Consequently, this achieves suitable suppression in mutual influence between a supply amount of gases to the first transport chamber and a supply amount of gases to the second transport chamber.

As noted above, the substrate treating apparatus achieves suitable suppression in mutual influence among the supply amounts of gases to the transport chambers.

It is preferred in the substrate treating apparatus mentioned above that one of the first vertical member and the second vertical member is longer than the other of the first vertical member and the second vertical member, and that the one of the first vertical member and the second vertical member has a channel sectional area larger than that of the other of the first vertical member and the second vertical member. When the first vertical member is longer than the second vertical member, the first vertical member has a channel sectional area larger than the second vertical member. Consequently, this achieves suppression of excessive increase in pressure loss of the first vertical member relative to pressure loss of the second vertical member. When the second vertical member is longer than the first vertical member, the second vertical member has a channel sectional area larger than the first vertical member.

Consequently, this achieves suppression of excessive increase in pressure loss of the second vertical member relative to pressure loss of the first vertical member.

It is preferred that the substrate treating apparatus mentioned above further includes an gas supplying unit that supplies gases, outside the substrate treating apparatus, into the first feed channel and the second feed channel. The gases outside the substrate treating apparatus are capable of being supplied to the first transport chamber and the second transport chamber suitably.

The present invention is constituted as stated below to achieve the third object. Specifically, another aspect of the present invention discloses a substrate treating apparatus including a first liquid treatment chamber that performs a liquid treatment to a substrate, a second liquid treatment chamber that is disposed below the first liquid treatment chamber and performs a liquid treatment to a substrate, a first exhaust channel that exhausts gases of the first liquid treatment chamber, and a second exhaust channel that exhausts gases of the second liquid treatment chamber. The first exhaust channel includes a first vertical member that extends substantially vertically. The second exhaust channel includes a second vertical member that extends substantially vertically. The first vertical member and the second vertical member both extend to at least either a position higher in level than the first liquid treatment chamber or a position lower in level than the second liquid treatment chamber.

Although the second liquid treatment chamber is disposed below the first liquid treatment chamber, the first exhaust channel includes the first vertical member and the second exhaust channel includes the second vertical member. The first vertical member and the second vertical member both extend to at least either the position higher in level than the first liquid treatment chamber or the position lower in level than the second liquid treatment chamber. Accordingly, the first vertical member and the second vertical member are each relatively long. In other words, the first exhaust channel and the second exhaust channel are each relatively long. Consequently, this achieves suitable suppression in mutual influence between an exhaust amount of gases of the first exhaust channel from the first liquid treatment chamber and an exhaust amount of gases of the second exhaust channel from the second liquid treatment chamber. Consequently, this achieves suitable suppression in mutual influence between the exhaust amount of gases from the first liquid treatment chamber and the exhaust amount of gases from the second liquid treatment chamber.

As noted above, the substrate treating apparatus achieves suitable suppression in mutual influence among the exhaust amount of gases from the liquid treatment chambers.

It is preferred in the substrate treating apparatus mentioned above that one of the first vertical member and the second vertical member is longer than the other of the first vertical member and the second vertical member, and that the one of the first vertical member and the second vertical member has a channel sectional area larger than that of the other of the first vertical member and the second vertical member. When the first vertical member is longer than the second vertical member, the first vertical member has a channel sectional area larger than the second vertical member. Consequently, this achieves suppression of excessive increase in pressure loss of the first vertical member relative to pressure loss of the second vertical member. When the second vertical member is longer than the first vertical member, the second vertical member has a channel sectional area larger than the first vertical member. Consequently, this achieves suppression of excessive increase in pressure loss of the second vertical member relative to pressure loss of the first vertical member.

The present invention is constituted as stated below to achieve the fourth object. Specifically, another aspect of the present invention discloses a substrate treating apparatus including a first transport chamber for transporting a substrate, a second transport chamber that is disposed below the first transport chamber and transports a substrate, a first exhaust channel that exhausts gases of the first transport chamber, and a second exhaust channel that exhausts gases of the second transport chamber. The first exhaust channel includes a first vertical member that extends substantially vertically. The second exhaust channel includes a second vertical member that extends substantially vertically. The first vertical member and the second vertical member both extend to at least either a position higher in level than the first transport chamber or a position lower in level than the second transport chamber.

Although the second transport chamber is disposed below the first transport chamber, the first exhaust channel includes the first vertical member and the second exhaust channel includes the second vertical member. The first vertical member and the second vertical member both extend to at least either the position higher in level than the first transport chamber or the position lower in level than the second transport chamber. Accordingly, the first vertical member and the second vertical member are each relatively long. In other words, the first exhaust channel and the second exhaust channel are each relatively long. Consequently, this achieves suitable suppression in mutual influence between an exhaust amount of gases of the first exhaust channel from the first transport chamber and an exhaust amount of gases of the second exhaust channel from the second transport chamber. Consequently, this achieves suitable suppression in mutual influence between the exhaust amount of gases from the first transport chamber and the exhaust amount of gases from the second transport chamber.

As noted above, the substrate treating apparatus achieves suitable suppression in mutual influence among the exhaust amount of gases from the transport chambers.

It is preferred in the substrate treating apparatus mentioned above that one of the first vertical member and the second vertical member is longer than the other of the first vertical member and the second vertical member, and that the one of the first vertical member and the second vertical member has a channel sectional area larger than that of the other of the first vertical member and the second vertical member. When the first vertical member is longer than the second vertical member, the first vertical member has a channel sectional area larger than the second vertical member. Consequently, this achieves suppression of excessive increase in pressure loss of the first vertical member relative to pressure loss of the second vertical member. When the second vertical member is longer than the first vertical member, the second vertical member has a channel sectional area larger than the first vertical member. Consequently, this achieves suppression of excessive increase in pressure loss of the second vertical member relative to pressure loss of the first vertical member.

Moreover, it is preferred that the substrate treating apparatus includes a third exhaust channel that exhausts gases of the first transport chamber, and a fourth exhaust channel that exhausts gases of the second transport chamber, and that the third exhaust channel includes a third vertical member that extends substantially vertically, the fourth exhaust channel includes a fourth vertical member that extends substantially vertically, and that the third vertical member and the fourth vertical member both extend to at least either a position higher in level than the first transport chamber or a position lower in level than the second transport chamber. Although the second transport chamber is disposed below the first transport chamber, the third exhaust channel includes the third vertical member and the fourth exhaust channel includes the fourth vertical member. The third vertical member and the fourth vertical member both extend to at least either a position higher in level than the first transport chamber or a position lower in level than the second transport chamber. Accordingly, the third vertical member and the fourth vertical member are each relatively long. That is, the third exhaust channel and the fourth exhaust channel are each relatively long.

Consequently, this achieves suitable suppression in mutual influence among an exhaust amount of gases of the first exhaust channel from the first transport chamber, an exhaust amount of gases of the second exhaust channel from the second transport chamber, an exhaust amount of gases of the third exhaust channel from the first transport chamber, and an exhaust amount of gases of the fourth exhaust channel from the second transport chamber. Consequently, this achieves more suitable suppression in mutual influence between the exhaust amount of gases from the first transport chamber and the exhaust amount of gases from the second transport chamber. Moreover, the first exhaust channel and the third exhaust channel achieve effective exhaust of gases from the first transport chamber. Moreover, the second exhaust channel and the fourth exhaust channel achieve effective exhaust of gases from the second transport chamber.

It is preferred that the substrate treating apparatus mentioned above further includes a first suction unit that is provided in the first transport chamber and sucks gases of the first transport chamber, and a second suction unit that is provided in the second transport chamber and sucks gases of the second transport chamber, and that both the first exhaust channel and the third exhaust channel are connected to the first suction unit, and exhaust gases of the first transport chamber through the first suction unit, and that both the second exhaust channel and the fourth exhaust channel are connected to the second suction unit, and exhaust gases of the second transport chamber through the second suction unit. Both the first exhaust channel and the third exhaust channel exhaust the gases of the first transport chamber through the first suction unit. Accordingly, the first exhaust channel and the third exhaust channel are capable of exhausting the gases of the first transport chamber in the same manner. Likewise, both the second exhaust channel and the fourth exhaust channel exhaust the gases of the second transport chamber through the second suction unit. Accordingly, the second exhaust channel and the fourth exhaust channel are capable of exhausting the gases of the second transport chamber in the same manner.

The present invention is constituted as stated below to achieve the fifth object. Specifically, another aspect of the present invention discloses a substrate treating apparatus including a first heat treatment chamber that performs a heat treatment to a substrate, a second heat treatment chamber that is disposed below the first heat treatment chamber and performs a heat treatment to a substrate, a first exhaust channel that exhausts gases in the first heat treatment chamber, and a second exhaust channel that exhausts gases in the second heat treatment chamber. The first exhaust channel includes a first vertical member that extends substantially vertically. The second exhaust channel includes a second vertical member that extends substantially vertically. The first vertical member and the second vertical member both extend to at least either a position higher in level than the first heat treatment chamber or a position lower in level than the second heat treatment chamber.

Although the second heat treatment chamber is disposed below the first heat treatment chamber, the first exhaust channel includes the first vertical member and the second exhaust channel includes the second vertical member. The first vertical member and the second vertical member both extend to at least either a position higher in level than the first heat treatment chamber or a position lower in level than the second heat treatment chamber. Accordingly, the first vertical member and the second vertical member are each relatively long. In other words, the first exhaust channel and the second exhaust channel are each relatively long. Consequently, this achieves suitable suppression in mutual influence between an exhaust amount of gases of the first exhaust channel from the first heat treatment chamber and an exhaust amount of gases of the second exhaust channel from the second heat treatment chamber. Consequently, this achieves suitable suppression in mutual influence between the exhaust amount of gases from the first heat treatment chamber and the exhaust amount of gases from the second heat treatment chamber.

As noted above, the substrate treating apparatus achieves suitable suppression in mutual influence among the exhaust amount of gases from the heat treatment chambers.

It is preferred in the substrate treating apparatus mentioned above that one of the first vertical member and the second vertical member is longer than the other of the first vertical member and the second vertical member, and that the one of the first vertical member and the second vertical member has a channel sectional area larger than that of the other of the first vertical member and the second vertical member. When the first vertical member is longer than the second vertical member, the first vertical member has a channel sectional area larger than the second vertical member. Consequently, this achieves suppression of excessive increase in pressure loss of the first vertical member relative to pressure loss of the second vertical member. When the second vertical member is longer than the first vertical member, the second vertical member has a channel sectional area larger than the first vertical member. Consequently, this achieves suppression of excessive increase in pressure loss of the second vertical member relative to pressure loss of the first vertical member.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

DESCRIPTION OF EMBODIMENTS

<1. Summary of Substrate Treating Apparatus>

Figure 1:
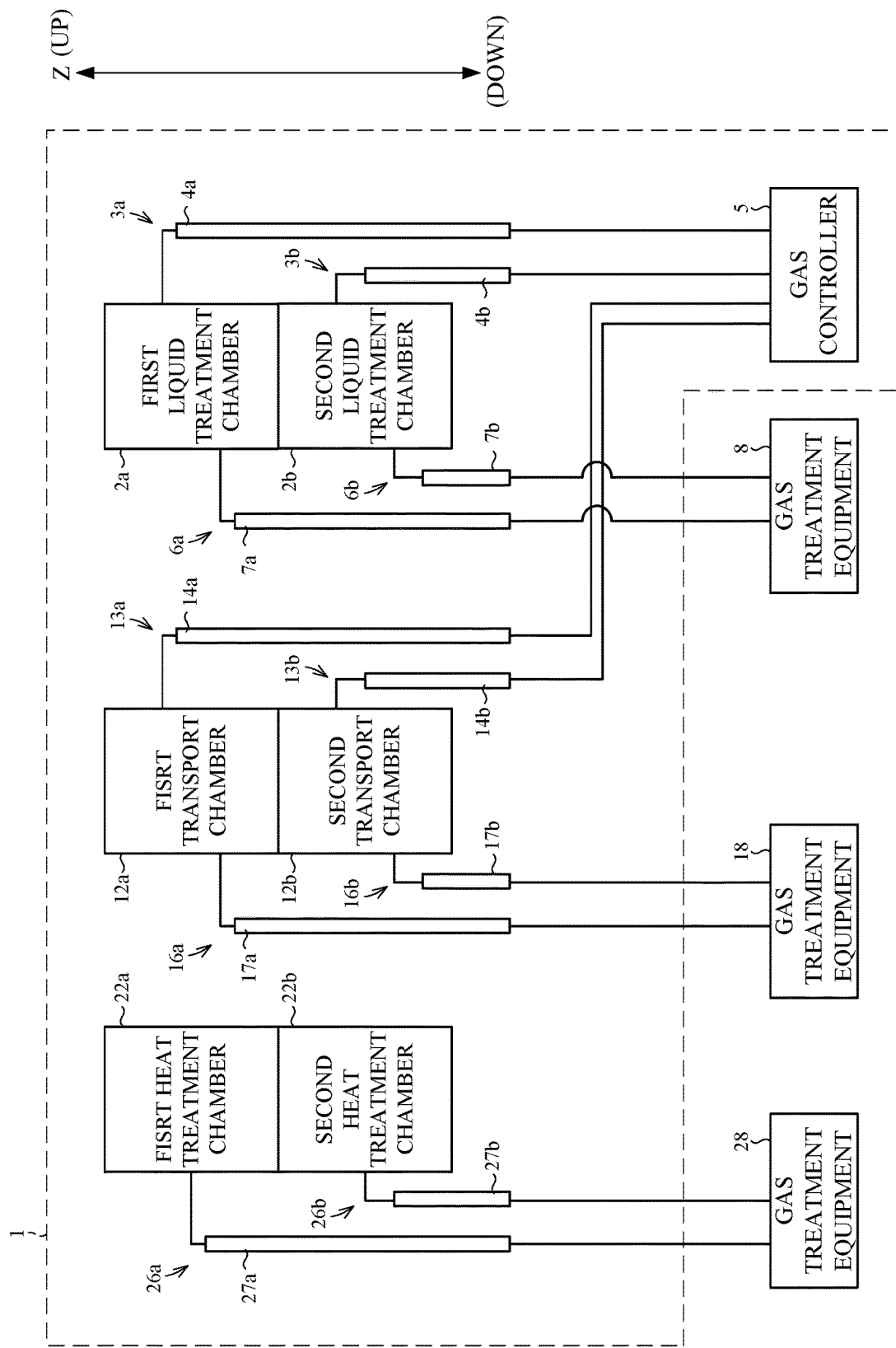
FIG. 1 is a conceptual view of a substrate treating apparatus according to one embodiment.

FIG. 1 is a conceptual view of a substrate treating apparatus according to one embodiment. FIG. 1 illustrates the elements in a vertical direction Z. Here, one direction of the vertical direction Z is referred to as a term "upward". The direction opposite to the upward direction is referred to as a term "downward". In FIG. 1 and the like, the terms upward and downward are each described as terms "up" and "down", respectively.

A substrate treating apparatus 1 according to Embodiment 1 performs a liquid treatment and a heat treatment to substrates (e.g., semiconductor wafers). Here, examples of the substrates include a semiconductor wafer, a glass substrate for photomask, a substrate for liquid crystal display, a substrate for organic electroluminescence (EL), a substrate for flat panel display (FPD), a substrate for plasma display, a substrate for optical display, a magnetic disk substrate, an optical magnetic disk substrate, a substrate for photomask, and a solar cell substrate.

The substrate treating apparatus 1 includes a first liquid treatment chamber 2a, and a second liquid treatment chamber 2b. The first liquid treatment chamber 2a is a space where the liquid treatment is performed to the substrate. The second liquid treatment chamber 2b is a space where the liquid treatment is performed to the substrate. The second liquid treatment chamber 2b is disposed below the first liquid treatment chamber 2a.

The substrate treating apparatus 1 includes a first feed channel 3a, and a second feed channel 3b. The first feed channel 3a is in communication with the first liquid treatment chamber 2a. The first feed channel 3a supplies gases to the first liquid treatment chamber 2a. More specifically, the first feed channel 3a supplies gases to the first liquid treatment chamber 2a without supplying gases to the second liquid treatment chamber 2b. The second feed channel 3b is in communication with the second liquid treatment chamber 2b. The second feed channel 3b supplies gases to the second liquid treatment chamber 2b. More specifically, the second feed channel 3b supplies gases to the second liquid treatment chamber 2b without supplying gases to the first liquid treatment chamber 2a.

The first feed channel 3a includes a first vertical member 4a that extends in a substantially vertical direction Z. The second feed channel 3b includes a second vertical member 4b that extends in a substantially vertical direction Z. The first vertical member 4a and the second vertical member 4b both extend to a position lower in level than the second liquid treatment chamber 2b.

The substrate treating apparatus 1 includes a gas controller 5. The gas controller 5 is in communication with the first feed channel 3a and the second feed channel 3b. The gas controller 5 controls a temperature and humidity of gases, and feed the gases with the regulated temperature and humidity to the first feed channel 3a and the second feed channel 3b. Examples of the gases include air.

As noted above, the first feed channel 3a includes the first vertical member 4a. Accordingly, the first feed channel 3a is relatively long. Moreover, the second feed channel 3b includes the second vertical member 4b. Accordingly, the second feed channel 3b is relatively long. Consequently, this achieves suitable suppression in variation of a supply amount of gases of the second feed channel 3b depending on variation in supply amount of gases of the first feed channel 3a. In addition, this achieves suitable suppression in variation of a supply amount of gases of the first feed channel 3a depending on variation in supply amount of gases of the second feed channel 3b. In other words, this achieves suitable suppression in mutual influence between the supply amount of gases of the first feed channel 3a to the first liquid treatment chamber 2a and the supply amount of gases of the second feed channel 3b to the second liquid treatment chamber 2b. Consequently, this achieves suitable suppression in mutual influence between the supply amount of gases to the first liquid treatment chamber 2a and the supply amount of gases to the second liquid treatment chamber. 2b.

The substrate treating apparatus 1 includes a first exhaust channel 6a and a second exhaust channel 6b. The first exhaust channel 6a is in communication with the first liquid treatment chamber 2a. The first exhaust channel 6a exhausts gases of the first liquid treatment chamber 2a. More specifically, the first exhaust channel 6a exhausts gases of the first liquid treatment chamber 2a without exhausting gases of the second liquid treatment chamber 2b. The second exhaust channel 6b is in communication with the second liquid treatment chamber 2b. The second exhaust channel 6b exhausts gases of the second liquid treatment chamber 2b. More specifically, the second exhaust channel 6b exhausts gases of the second liquid treatment chamber 2b without exhausting gases of the first liquid treatment chamber 2a.

The first exhaust channel 6a includes a first vertical member 7a that extends in a substantially vertical direction Z. The second exhaust channel 6b includes a second vertical member 7b that extends in a substantially vertical direction Z. The first vertical member 7a and the second vertical member 7b both extend to a position lower in level than the second liquid treatment chamber 2b.

The first exhaust channel 6a and the second exhaust channel 6b are in communication with a gas treatment equipment 8. The gas treatment equipment 8 sucks gases and treats the sucked gases. Specifically, the gas treatment equipment 8 processes gases exhausted through the first exhaust channel 6a and the second exhaust channel 6b. For instance, the gas treatment equipment 8 performs treatment that changes harmful gases into harmless gases As noted above, the first exhaust channel 6a includes the first vertical member 7a. Accordingly, the first exhaust channel 6a is relatively long. The second exhaust channel 6b includes the second vertical member 7b. Accordingly, the second exhaust channel 6b is relatively long. Consequently, this achieves suitable suppression in variation of an exhaust amount of gases of the second exhaust channel 6b depending on variation in exhaust amount of gases of the first exhaust channel 6a. Moreover, this achieves suitable suppression in variation of an exhaust amount of gases of the first exhaust channel 6a depending on variation in exhaust amount of gases of the second exhaust channel 6b. In other words, this achieves suitable suppression in mutual influence between the exhaust amount of gases of the first exhaust channel 6a from the first liquid treatment chamber 2a and the exhaust amount of gases of the second exhaust channel 6b from the second liquid treatment chamber 2b. Consequently, this achieves suitable suppression in mutual influence between the exhaust amount of gases from the first liquid treatment chamber 2a and the exhaust amount of gases from the second liquid treatment chamber 2b.

The substrate treating apparatus 1 includes a first transport chamber 12a and a second transport chamber 12b. The first transport chamber 12a is a space where the substrate is transported. The second transport chamber 12b is a space where the substrate is transported. The second transport chamber 12b is disposed below the first transport chamber 12a.

The substrate treating apparatus 1 includes a first feed channel 13a, and a second feed channel 13b. The first feed channel 13a is in communication with the first transport chamber 12a. The first feed channel 13a supplies gases to the first transport chamber 12a. More specifically, the first feed channel 13a supplies gases to the first transport chamber 12a without supplying gases to the second transport chamber 12b. The second feed channel 13b is in communication with the second transport chamber 12b. The second feed channel 13b supplies gases to the second transport chamber 12b. More specifically, the second feed channel 13b supplies gases to the second transport chamber 12b without supplying gases to the first transport chamber 12a.

The first feed channel 13a includes a first vertical member 14a that extends in a substantially vertical direction Z. The second feed channel 13b includes a second vertical member 14b that extends in a substantially vertical direction Z. The first vertical member 14a and the vertical member 14b both extend to a position lower in level than the second transport chamber 12b.

The gas controller 5 is in communication with the first feed channel 13a and the second feed channel 13b. The gas controller 5 supplies the gases with the controlled temperature and humidity to the first feed channel 13a and the second feed channel 13b.

As noted above, the first feed channel 13a includes the first vertical member 14a. Accordingly, the first feed channel 13a is relatively long. Moreover, the second feed channel 13b includes the second vertical member 14b. Accordingly, the second feed channel 13b is relatively long. Consequently, this achieves suitable suppression in variation of a supply amount of gases of the second feed channel 13b depending on variation in supply amount of gases of the first feed channel 13a. In addition, this achieves suitable suppression in variation of a supply amount of gases of the first feed channel 13a depending on variation in supply amount of gases of the second feed channel 13b. In other words, this achieves suitable suppression in mutual influence between the supply amount of gases of the first feed channel 13a to the first transport chamber 12a and the supply amount of gases of the second feed channel 13b to the second transport chamber 12b. Consequently, this achieves suitable suppression in mutual influence between the supply amount of gases to the first transport chamber 12a and the supply amount of gases to the second transport chamber 12b.

The substrate treating apparatus 1 includes a first exhaust channel 16a and a second exhaust channel 16b. The first exhaust channel 16a is in communication with the first transport chamber 12a. The first exhaust channel 16a exhausts gases of the first transport chamber 12a. More specifically, the first exhaust channel 16a exhausts gases of the first transport chamber 12a without exhausting gases of the second transport chamber 12b. The second exhaust channel 16b is in communication with the second transport chamber 12b. The second exhaust channel 16b exhausts gases of the second transport chamber 12b. More specifically, the second exhaust channel 16b exhausts gases of the second transport chamber 12b without exhausting gases of the first transport chamber 12a.

The first exhaust channel 16a includes a first vertical member 17a that extends in the substantially vertical direction Z. The second exhaust channel 16b includes a second vertical member 17b that extends in the substantially vertical direction Z. The first vertical member 17a and the second vertical member 17b both extend to a position lower in level than the second transport chamber 12b.

The first exhaust channel 16a and the second exhaust channel 16b are in communication with a gas treatment equipment 18. The gas treatment equipment 18 sucks gases and treats the sucked gases. Specifically, the gas treatment equipment 18 processes gases exhausted through the first exhaust channel 16a and the second exhaust channel 16b.

As noted above, the first exhaust channel 16a includes the first vertical member 17a. Accordingly, the first exhaust channel 16a is relatively long. The second exhaust channel 16b includes the second vertical member 17b. Accordingly, the second exhaust channel 16b is relatively long. Consequently, this achieves suitable suppression in variation of an exhaust amount of gases of the second exhaust channel 16b depending on variation in exhaust amount of gases of the first exhaust channel 16a. Moreover, this achieves suitable suppression in variation of an exhaust amount of gases of the first exhaust channel 16a depending on variation in exhaust amount of gases of the second exhaust channel 16b. In other words, this achieves suitable suppression in mutual influence between the exhaust amount of gases of the first exhaust channel 16a from the first transport chamber 12a and the exhaust amount of gases of the second exhaust channel 16b from the second transport chamber 12b. Consequently, this achieves suitable suppression in mutual influence between the exhaust amount of gases from the first transport chamber 12a and the exhaust amount of gases from the second transport chamber 12b.

The substrate treating apparatus 1 includes a first heat treatment chamber 22a, and a second heat treatment chamber 22b. The first heat treatment chamber 22a is a space where a heat treatment is performed to the substrate. The second heat treatment chamber 22b is a space where a heat treatment is performed to the substrate. The second heat treatment chamber 22b is disposed below the first heat treatment chamber 22a.

The substrate treating apparatus 1 includes a first exhaust channel 26a and a second exhaust channel 26b. The first exhaust channel 26a is in communication with the first heat treatment chamber 22a. The first exhaust channel 26a exhausts gases of the heat treatment chamber 22a. More specifically, the first exhaust channel 26a exhausts gases of the first heat treatment chamber 22a without exhausting gases of the second heat treatment chamber 22b. The second exhaust channel 26b is in communication with the second heat treatment chamber 22b. The second exhaust channel 26b exhausts gases of the second heat treatment chamber 22b. More specifically, the second exhaust channel 26b exhausts gases of the second heat treatment chamber 22b without exhausting gases of the first heat treatment chamber 22a.

The first exhaust channel 26a includes a first vertical member 27a that extends in the substantially vertical direction Z. The second exhaust channel 26b includes a second vertical member 27b that extends in the substantially vertical direction Z. The first vertical member 27a and the second vertical member 27b both extend to a position lower in level than the second heat treatment chamber 22b.

The first exhaust channel 26a and the second exhaust channel 26b are in communication with a gas treatment equipment 28. The gas treatment equipment 28 sucks gases and treats the sucked gases. Specifically, the gas treatment equipment 28 processes gases exhausted through the first exhaust channel 26a and the second exhaust channel 26b.

As described above, the second exhaust channel 26a includes the first vertical member 27a. Accordingly, the first exhaust channel 26a is relatively long. The second exhaust channel 26b includes the second vertical member 27b. Accordingly, the second exhaust channel 26b is relatively long. Consequently, this achieves suitable suppression in variation of an exhaust amount of gases of the second exhaust channel 26b depending on variation in exhaust amount of gases of the first exhaust channel 26a. Moreover, this achieves suitable suppression in variation of an exhaust amount of gases of the first exhaust channel 26a depending on variation in exhaust amount of gases of the second exhaust channel 26b.

In other words, this achieves suitable suppression in mutual influence between the exhaust amount of gases of the first exhaust channel 26a from the first heat treatment chamber 22a and the exhaust amount of gases of the second exhaust channel 26b from the second heat treatment chamber 22b. Consequently, this achieves suitable suppression in mutual influence between the exhaust amount of gases from the first heat treatment chamber 22a and the exhaust amount of gases from the second heat treatment chamber 22b.

The gas treatment equipments 8, 18, and 28 are not elements of the substrate treating apparatus 1. The gas treatment equipments 8, 18, and 28 are external devices of the substrate treating apparatus 1. The gas treatment equipments 8, 18, and 28 are each, for example, an utility equipment in a factory where the substrate treating apparatus 1 is installed.

<Structure of Substrate Treating Apparatus 1>

The following describes the substrate treating apparatus 1 in more detail.

Figure 2:
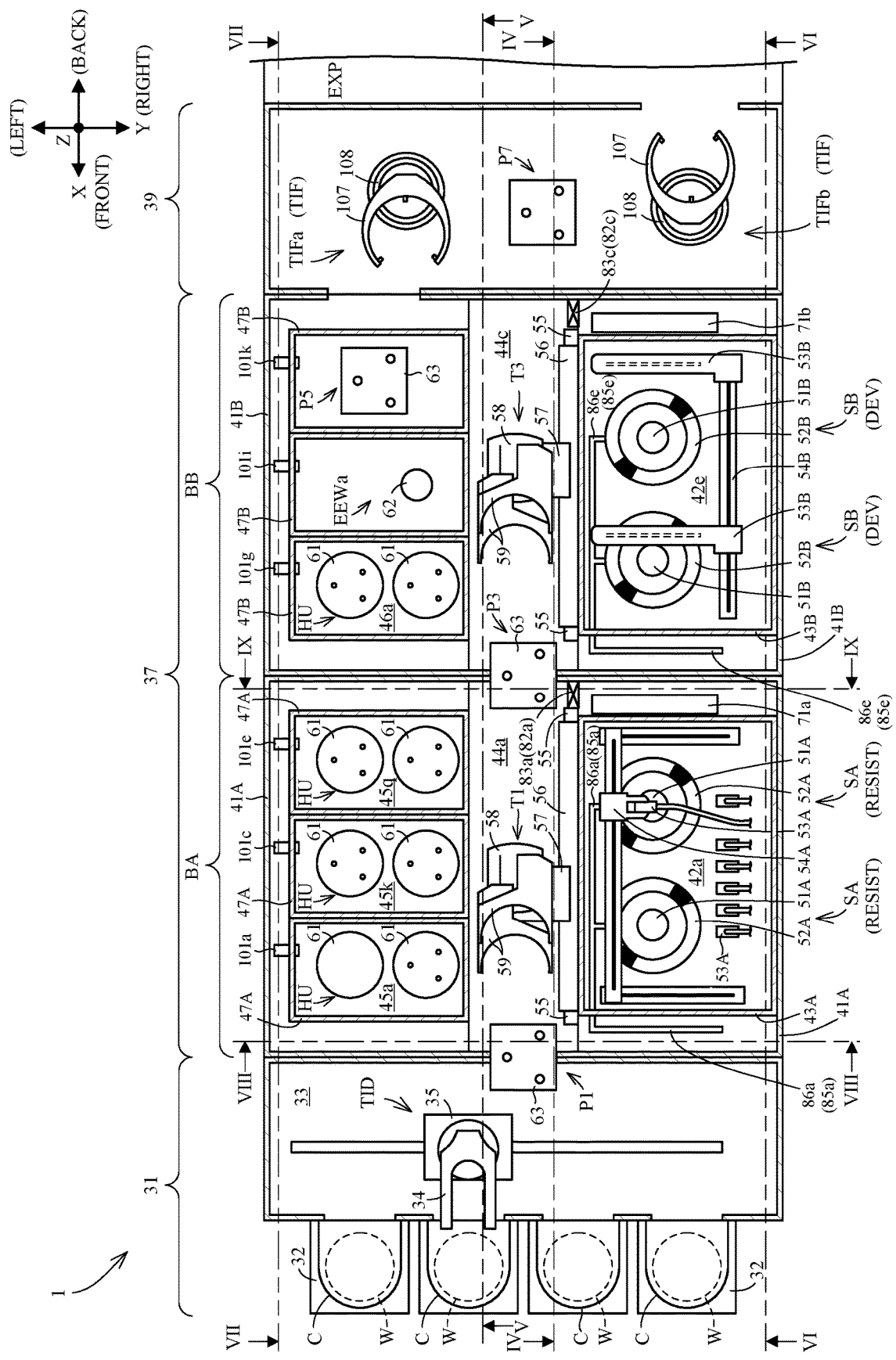
FIG. 2 is a plan view of an upper portion of the substrate treating apparatus.
Figure 3:
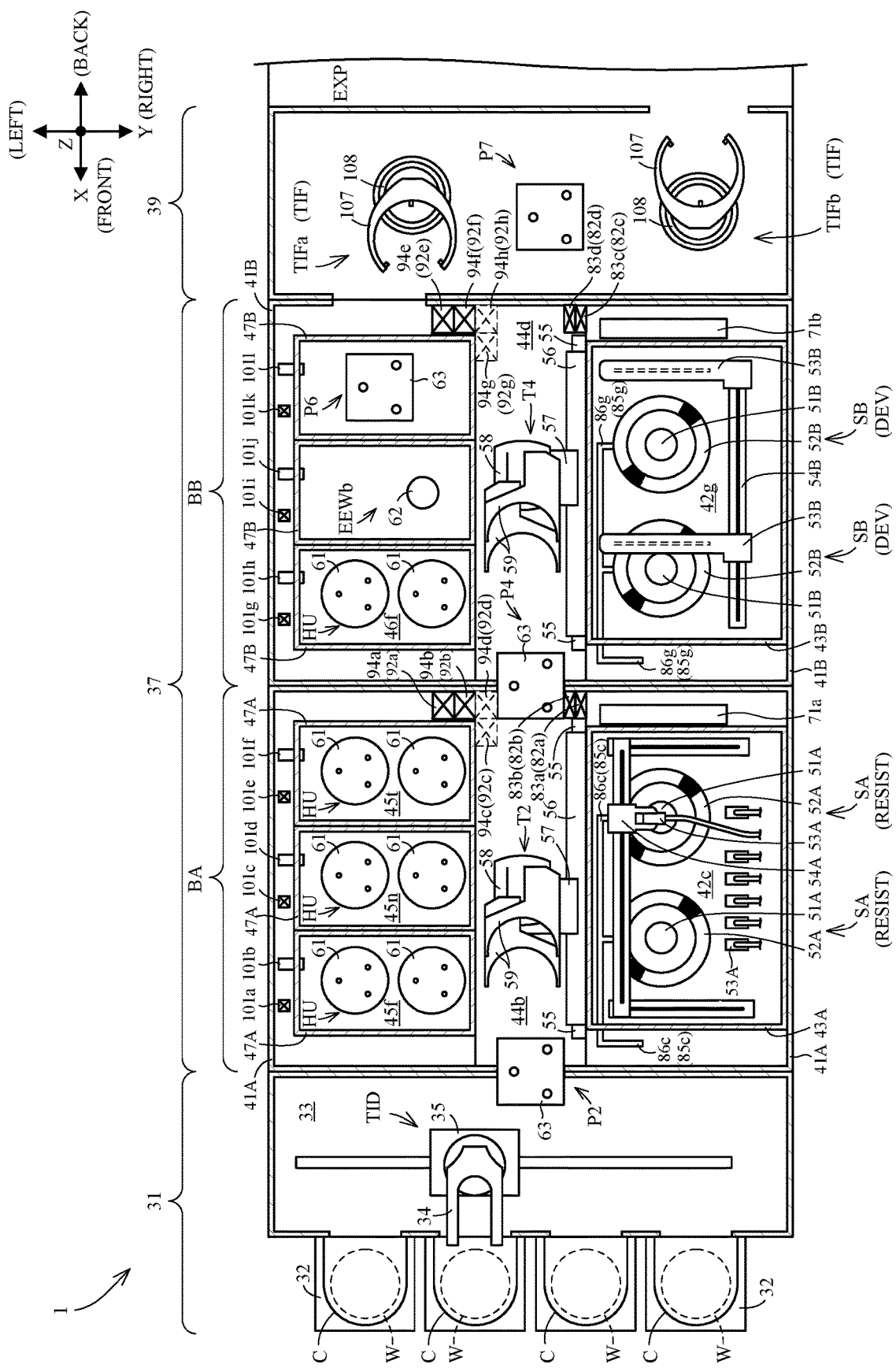
FIG. 3 is a plan view of a lower portion of the substrate treating apparatus.

FIG. 2 is a plan view of an upper portion of the substrate treating apparatus. FIG. 3 is a plan view of a lower portion of the substrate treating apparatus. The substrate treating apparatus 1 includes an indexer 31, a treatment section 37, and an interface 39. The indexer 31 is connected to the treatment section 37. The indexer 31 delivers a substrate W to and from the treatment section 37. The treatment section 37 performs the liquid treatment and the heat treatment to the substrate W. The interface 39 is connected to the treatment section 37. The interface 39 is further connected to an exposing machine EXP. The exposing machine EXP is not an element of the substrate treating apparatus 1. The exposing machine EXP is an external device of the substrate treating apparatus 1. The interface 39 transports the substrate W between the treatment section 37 and the exposing machine EXP. The exposing machine EXP performs exposure treatment to the substrate W. The indexer 31, the treatment section 37, the interface 39, and the exposing machine EXP are disposed in line in this order.

In the following description, a direction where the indexer 31, the treatment section 37, and the interface 39 are disposed is referred to as a "forward/backward direction X". The forward/backward direction X is horizontal. The forward/backward direction X is orthogonal to the vertical direction Z. A direction orthogonal to the forward/backward direction X is referred to as a "width direction Y". The width direction Y is orthogonal to the vertical direction Z. When no distinction is particularly made between the forward/backward direction X and the width direction Y, a simple term "horizontal direction" is to be described.

Here, one direction of the forward/backward direction X from the interface 39 to the indexer 31 is referred to as a "forward direction". The direction opposite to the forward direction is referred to as a "backward direction". Moreover, one direction of the width direction Y is referred to as a "rightward direction". The direction opposite to the rightward direction is referred to as a "leftward direction". In FIG. 2 and the like, the forward, backward, rightward, and the leftward directions are described as terms "front", "back", "right", and "left", respectively. When no distinction is particularly made among the forward, backward, rightward, and the leftward directions, a simple term "lateral" is to be described.

The treatment section 37 includes two treatment blocks BA, BB. The treatment blocks BA is disposed forward of the treatment block BB.

The indexer 31 is connected to the treatment block BA. The treatment block BA is connected to the treatment block BB. The treatment block BB is connected to the interface 39.

<Structure of Indexer 31>

Figure 4:
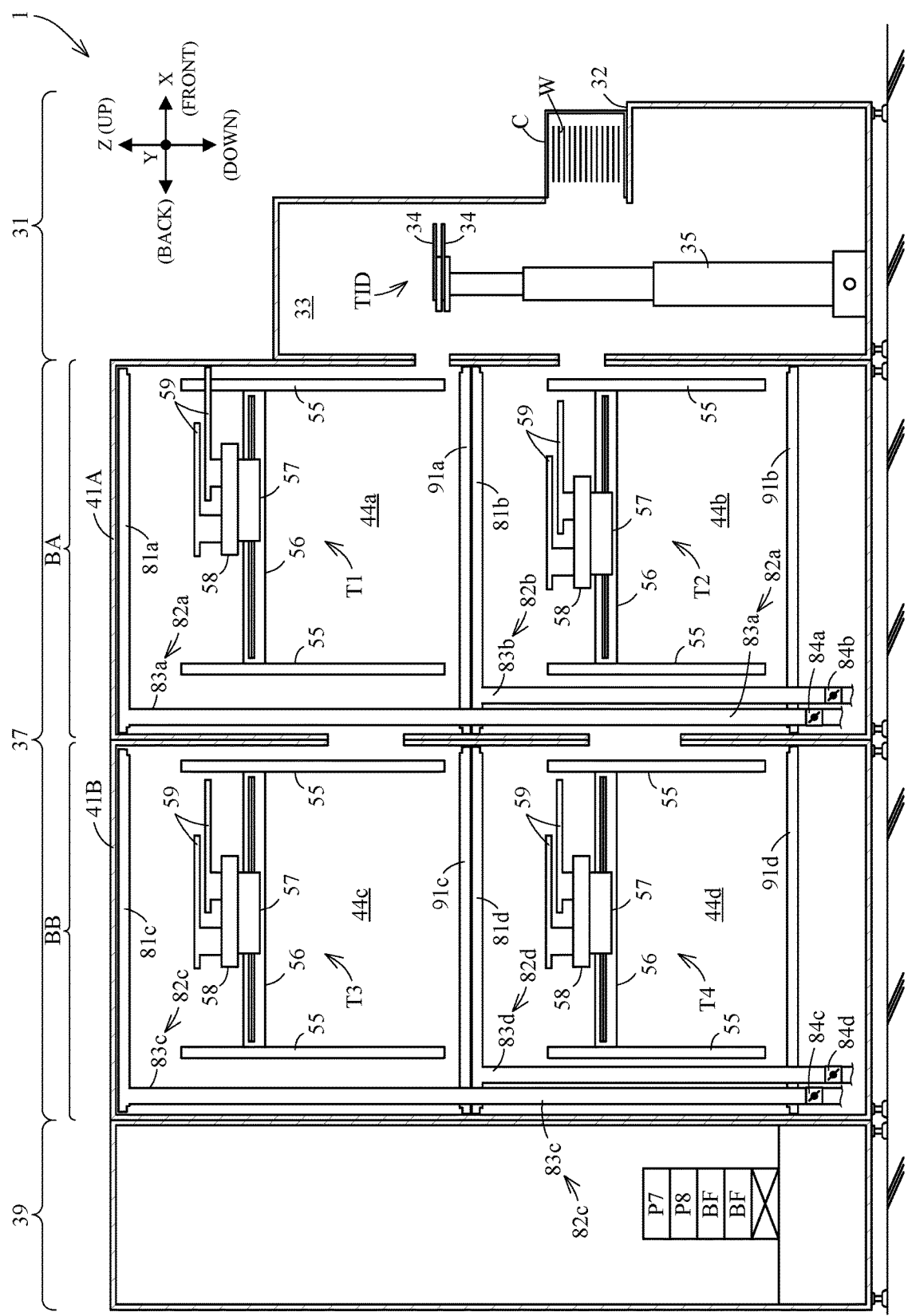
FIG. 4 is a side view along an arrow IV-IV of FIG. 2.
Figure 5:
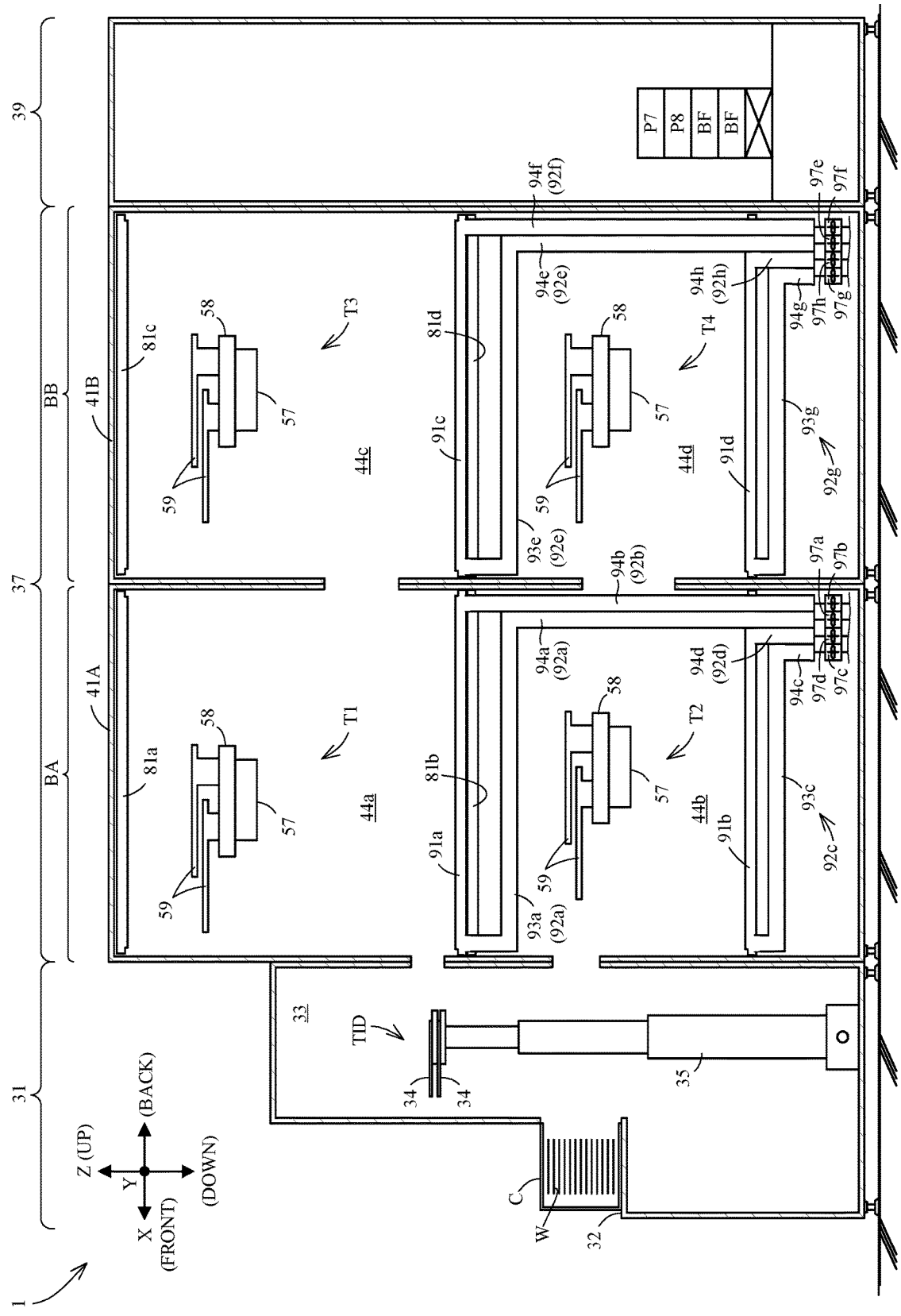
FIG. 5 is a side view along an arrow V-V of FIG. 2.

Reference is made to FIGS. 2 to 5. FIG. 4 is a side view along an arrow IV-IV of FIG. 2. FIG. 5 is a side view along an arrow V-V of FIG. 2. In FIGS. 4 and 5, the illustration of the exposing machine EXP is omitted. The indexer 31 includes carrier mount tables 32, a transport chamber 33, and an indexer transport mechanism TID.

Carriers C are placed on the carrier mount tables 32. The carrier C accommodates a plurality of substrates W. The carrier C is, for example, a front opening unified pod (FOUP). The carrier C is transported by an external transport mechanism, not shown, onto the carrier mount table 32.

The transport chamber 33 is disposed backward of the carrier mount table 32. The indexer transport mechanism TID is installed in the transport chamber 33. The indexer transport mechanism TID transports the substrate W between the carrier C and the treatment section 37 (specifically, the treatment block BA). Specifically, the indexer transport mechanism TID transports the substrate W from the carrier C to the treatment section 37 and transports the substrate W from the treatment section 37 to the carrier C.

The indexer transport mechanism TID includes, for example, two hands 34 that hold the substrate W, and a hand drive mechanism 35 that drives the hands 34. The hands 34 each hold one substrate W. The hand drive mechanism 35 causes the hands 34 to move in the forward/backward direction X, the width direction Y, and the vertical direction Z, and causes the hands 34 to rotate around the vertical direction Z. This causes the hands 34 to access the carrier C and the treatment section 37 (specifically, the treatment block BA).

<Structure of Treatment Section 37>

Figure 6:
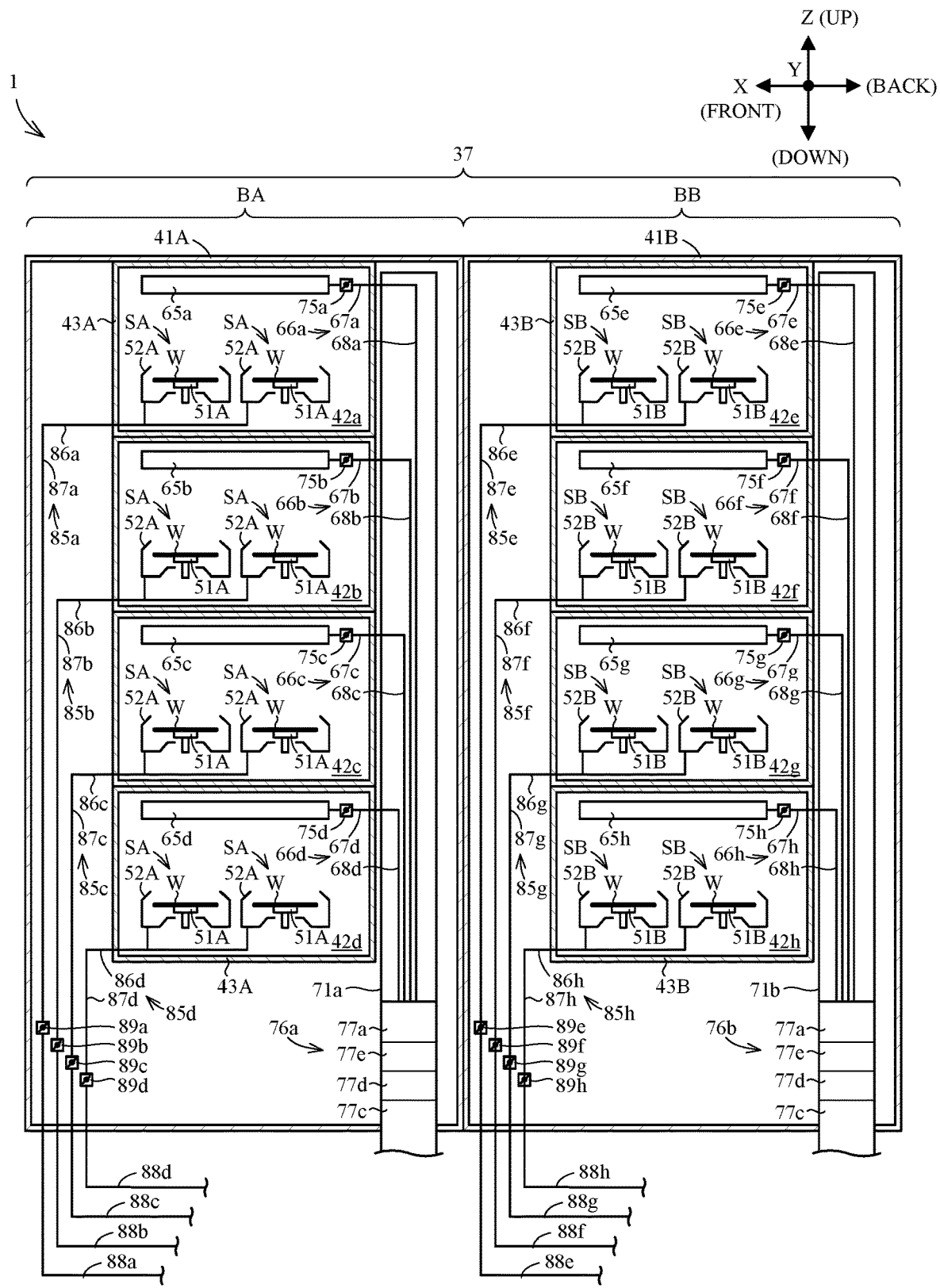
FIG. 6 is a side view along an arrow VI-VI of FIG. 2.
Figure 7:
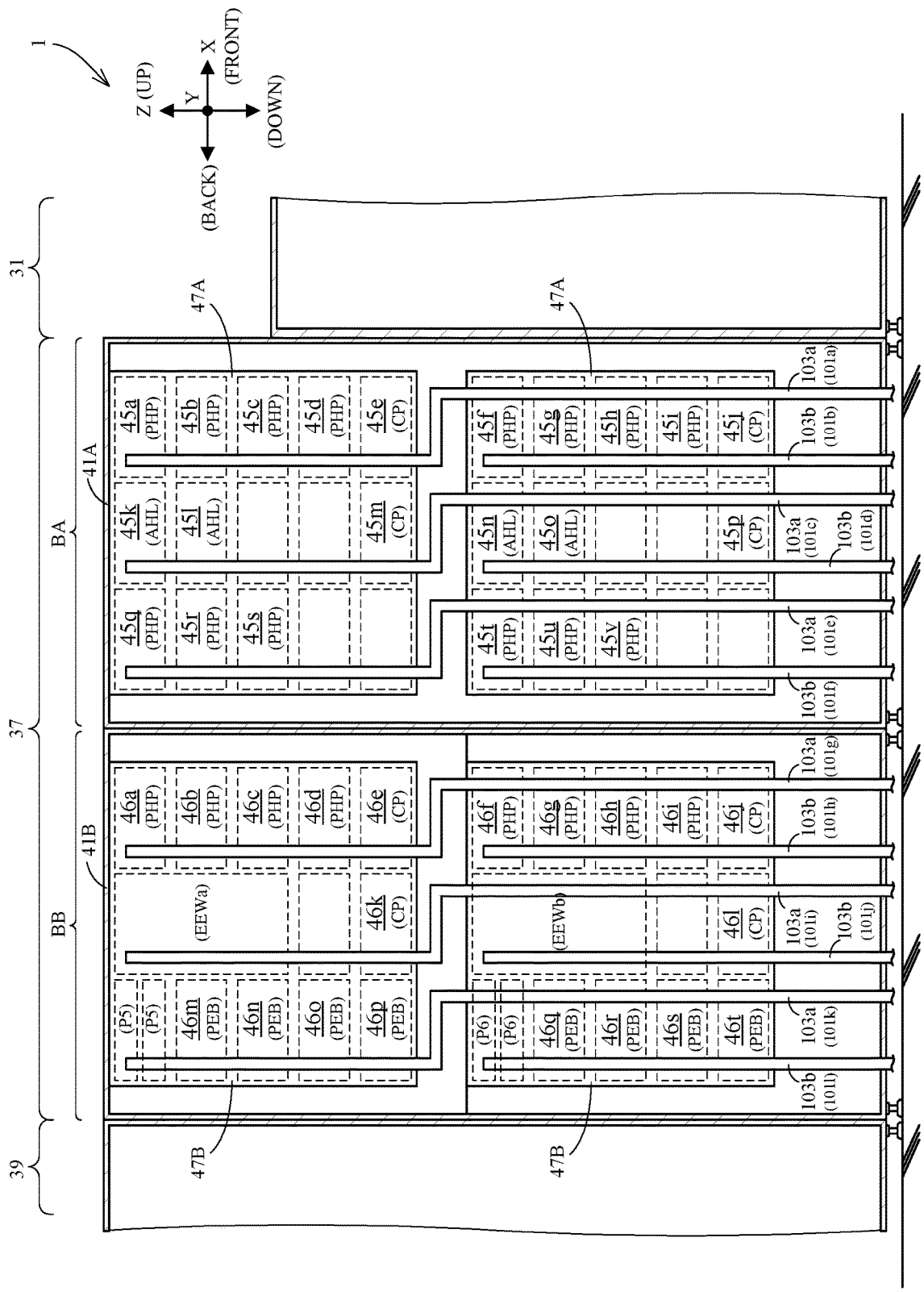
FIG. 7 is a side view along an arrow VII-VII of FIG. 2.
Figure 8:
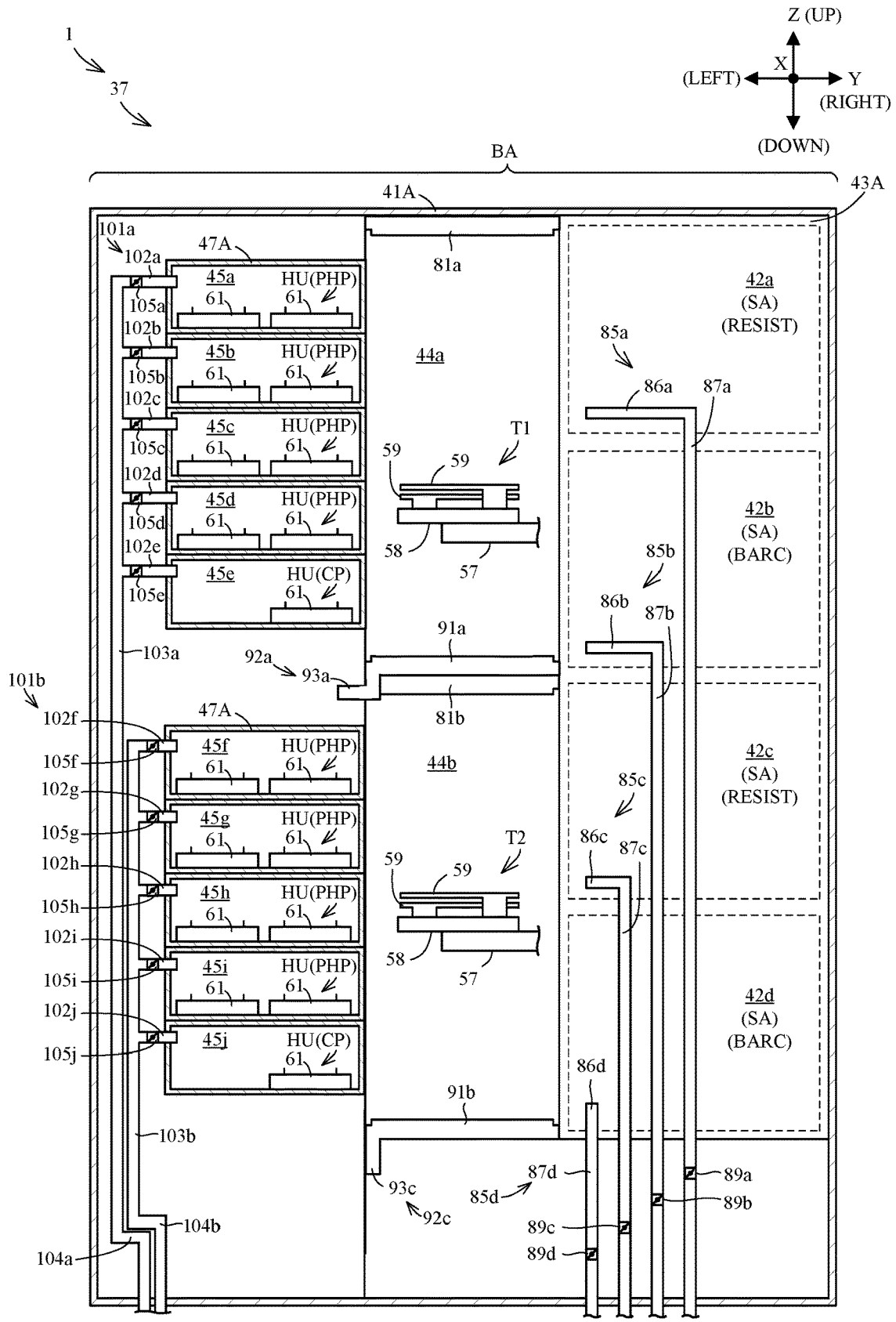
FIG. 8 is a front view along an arrow VIII-VIII of FIG. 2.
Figure 9:
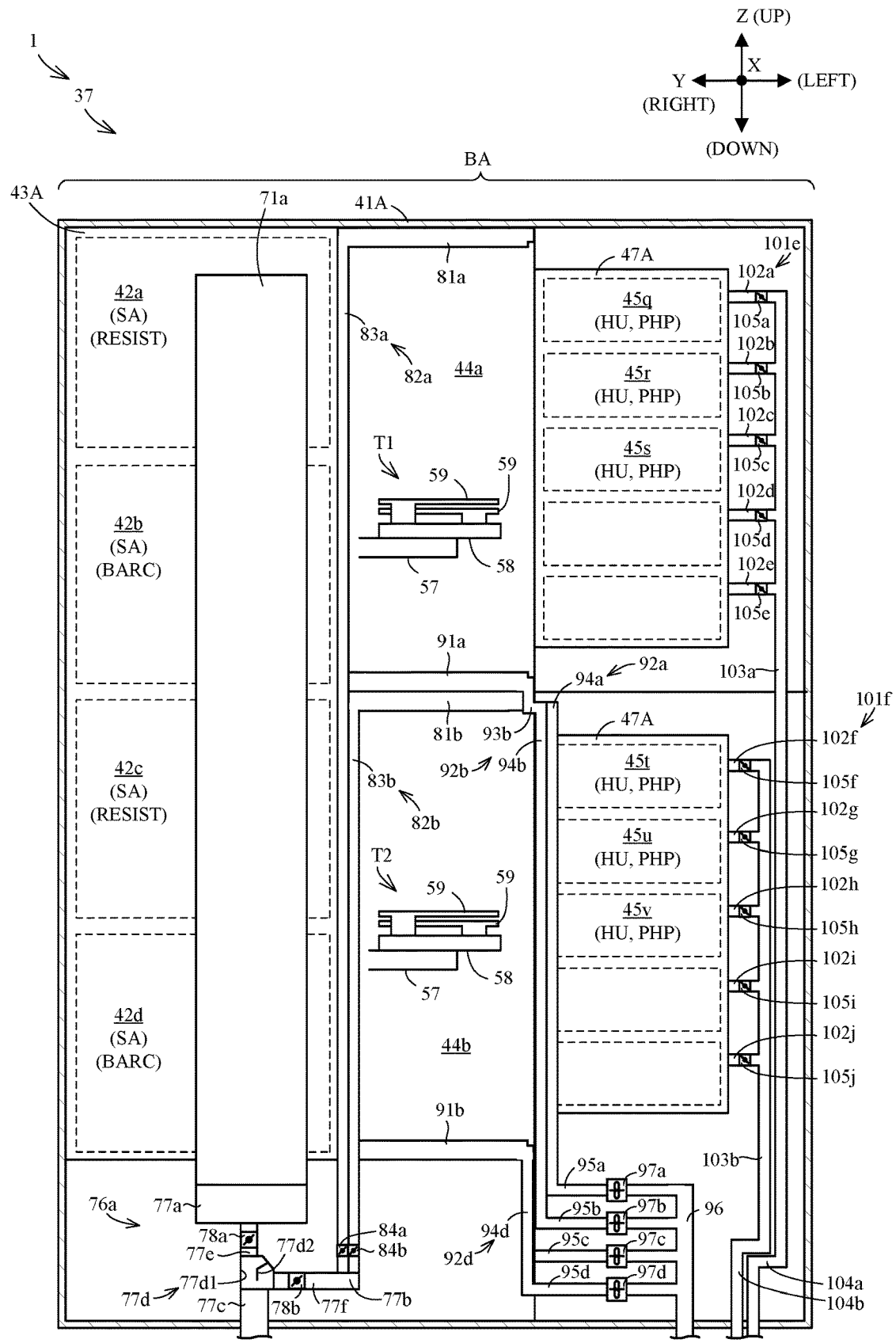
FIG. 9 is a front view along an arrow IX-IX of FIG. 2.

Reference is made to FIGS. 2, 3, and 6 to 9. FIGS. 6 and 7 are each a side view of the treatment section. Specifically, FIG. 6 is a side view along an arrow VI-VI of FIG. 2. FIG. 7 is a side view along an arrow VII-VII of FIG. 2. FIGS. 8 and 9 are each a front view of the treatment section. Specifically, FIG. 8 is a front view along an arrow VIII-VIII of FIG. 2. FIG. 9 is a front view along an arrow IX-IX of FIG. 2.

The treatment section 37 is substantially rectangular in plan view, in front view, and in side view.

The following describes the treatment block BA. The treatment block BA is substantially rectangular in plan view, in front view, and in side view. The treatment block BA includes a block casing 41A. The block casing 41A has a box shape. The treatment block BA is sectioned by the block casing 41A.

Reference is made to FIGS. 2 and 3. The treatment block BA includes liquid treatment chambers 42a to 42d, transport chambers 44a, 44b, and heat treatment chambers 45a to 45v. Now the liquid treatment chambers 42b and 42d are illustrated in FIGS. 6, 8, and 9. The heat treatment chamber 45b and the like are illustrated in FIG. 7. The liquid treatment chambers 42a to 42d, the transport chambers 44a, 44b, and the heat treatment chambers 45a to 45v are disposed in the treatment block BA (i.e., in the block casing 41A). The liquid treatment chambers 42a to 42d are disposed right portion of the treatment block BA. The transport chambers 44a, 44b are disposed in the midstream of the treatment block BA. The transport chambers 44a, 44b extend in the forward/backward direction X from a front portion to a rear portion of the treatment block BA. The heat treatment chambers 45a to 45v are disposed left portion of the treatment block BA.

Reference is made to FIG. 6. The liquid treatment chambers 42a to 42d are arranged downwardly in this order. In other words, the liquid treatment chamber 42b is disposed below the liquid treatment chamber 42a. The liquid treatment chamber 42c is disposed below the liquid treatment chamber 42b. The liquid treatment chamber 42d is disposed below the liquid treatment chamber 42c. The liquid treatment chambers 42a to 42d are disposed at substantially the same position in plan view.

The treatment block BA includes a unit casing 43A. The unit casing 43A is disposed in the treatment block BA. The unit casing 43A includes an interior space corresponding to the liquid treatment chambers 42a to 42d. The unit casing 43A sections the liquid treatment chambers 42a to 42d. That is, the liquid treatment chambers 42a to 42d are sectioned by the unit casing 43A.

Reference is made to FIGS. 4 and 5. The transport chamber 44b is disposed below the transport chamber 44a. The transport chamber 44b is disposed at a substantially the same position as that of the transport chamber 44a in plan view.

The transport chambers 44a, 44b are separated from each other. For instance, the transport chamber 44a, 44b are divided by at least either a blowing unit 81b or a suction unit 91a, which are to be mentioned later.

Reference is made to FIGS. 2, 3, and 8. The transport chamber 44a is disposed laterally (specifically, leftward) of the liquid treatment chambers 42a, 42b. That is, the transport chamber 44a is disposed at the same position in level as positions of the liquid treatment chambers 42a, 42b. The transport chamber 44b is disposed laterally (specifically, leftward) of the liquid treatment chambers 42c, 42d.

Reference is made to FIG. 7. The heat treatment chambers 45a to 45v are arranged in a matrix array in the forward/backward direction X and the vertical direction Z.

The heat treatment chambers 45a to 45j are disposed in the front portion of the treatment block BA. The heat treatment chambers 45a to 45j are arranged downwardly in this order. The heat treatment chambers 45a to 45j are disposed at substantially the same positions in plan view.

The heat treatment chambers 45k to 45p are disposed backward of the heat treatment chambers 45a to 45j. The heat treatment chambers 45k to 45p are arranged downwardly in this order. The heat treatment chambers 45k to 45p are disposed at substantially the same positions in plan view.

The heat treatment chambers 45q to 45v are disposed in the backward direction of the heat treatment chambers 45k to 45p. The heat treatment chambers 45q to 45v are disposed in the rear portion of the treatment block BA. The heat treatment chambers 45q to 45v are arranged downwardly in this order. The heat treatment chambers 45q to 45v are disposed at substantially the same positions in plan view.

The treatment block BA includes a unit casing 47A. The unit casing 47A is disposed in the treatment block BA. The unit casing 47A includes an interior space corresponding to the heat treatment chambers 45a to 45v. The unit casing 47A sections the heat treatment chambers 45a to 45v. That is, the heat treatment chambers 45a to 45v are sectioned by the unit casing 47A.

Reference is made to FIGS. 2, 3, and 8. The heat treatment chambers 45a to 45e, 45k to 45m, and 45q to 45s are disposed laterally (specifically, leftward) of the transport chamber 44a. The heat treatment chambers 45f to 45j, 45n to 45p, and 45t to 45v are disposed laterally (specifically, leftward) of the transport chamber 44b.

Reference is made to FIGS. 2 to 7. The following describes the treatment block BB. The treatment block BB has the structure similar to that of the treatment block BA. Accordingly, the description of the treatment block BB is to be omitted appropriately.

The treatment block BB includes a block casing 41B, liquid treatment chamber 42e to 42h, a unit casing 43B, transport chambers 44c, 44d, and a unit casing 47B. The block casing 41B is similar to the block casing 41A. The liquid treatment chambers 42e to 42h are similar to the liquid treatment chambers 42a to 42d. The unit casing 43B is similar to the unit casing 43A. The transport chambers 44c, 44d are similar to the transport chambers 44a, 44b. The unit casing 47B is similar to the unit casing 47A.

Reference is made to FIGS. 4 and 5. The transport chamber 44c is disposed backward of the transport chamber 44a. The transport chamber 44c is disposed at the same position as that of the transport chamber 44a. The transport chamber 44c is connected to the transport chamber 44a. A positional relationship between the transport chamber 44d and the transport chamber 44b is equal to that between the transport chamber 44c and the transport chamber 44a.

Reference is made to FIG. 7. The treatment block BB includes heat treatment chambers 46a to 46t. The heat treatment chambers 46a to 46t are arranged in a matrix array in the forward/backward direction X and the vertical direction Z. The heat treatment chambers 46a to 46j are arranged downwardly in this order. The heat treatment chamber 46l is disposed below the heat treatment chamber 46k. The heat treatment chambers 46m to 46t are arranged downwardly in this order. The heat treatment chambers 46a to 46e, 46k, 46m to 46p are disposed laterally (specifically, leftward) of the transport chamber 44c. The heat treatment chambers 46f to 46j, 46l, 46q to 46t are disposed laterally (specifically, leftward) of the transport chamber 44d.

When no distinction is particularly made among the liquid treatment chambers 42a to 42h, they are referred to as the "liquid treatment chamber 42". When no distinction is particularly made among the transport chambers 44a to 44d, they are referred to as the "transport chamber 44". When no distinction is particularly made among the heat treatment chambers 45a to 45v, they are referred to as the "heat treatment chamber 45". When no distinction is particularly made among the heat treatment chambers 46a to 46t, they are referred to as the "heat treatment chamber 46".

<Detailed Structure of Treatment Section 37>

Reference is made to FIG. 6. The treatment section 37 includes a plurality of liquid treatment units SA and a plurality of liquid treatment units SB. The liquid treatment units SA, SB each perform a liquid treatment to the substrate W. In the liquid treatment, a treatment liquid is supplied to the substrate W.

The liquid treatment unit SA is disposed in the treatment block BA. The liquid treatment chambers 42a to 42d each accommodate the two liquid treatment units SA. The two liquid treatment units SA disposed in the liquid treatment chamber 42a are arranged substantially horizontally (specifically, in the forward/backward direction X). The two liquid treatment units SA disposed in the liquid treatment chambers 42b to 42d, respectively, are arranged in the same manner.

The liquid treatment units SA each perform a coating treatment as the liquid treatment. The coating treatment is made by coating the substrate W with the treatment liquid to form a coating film on a surface of the substrate W.

Reference is made to FIGS. 8 and 9. The liquid treatment units SA are classified as a resist film coating unit RESIST and an antireflection film coating unit BARC depending on types of the liquid treatment. The resist film coating unit RESIST is each disposed in the liquid treatment chambers 42a, 42c, for example. The resist film coating unit RESIST performs resist film formation. The resist film formation is made by coating the substrate W with a resist film material to form a resist film on the surface of the substrate W. The antireflection film coating unit BARC is disposed in the liquid treatment chambers 42b, 42d, respectively, for example. The antireflection film coating unit BARC performs antireflection film formation. The antireflection film formation is made by coating the substrate W with an antireflection film material to form an antireflection film on the surface of the substrate W.

Reference is made to FIGS. 2, 3, and 6. The liquid treatment units SA each include a spin holder 51A, cups 52A, a nozzle 53A, and a nozzle transport mechanism 54A. The spin holder 51A holds the substrate W in a rotatable manner. The cup 52A surrounds the spin holder 51A. When the liquid treatment unit SA performs treatment to the substrate W, the cup 52A surrounds laterally of the substrate W held by the spin holder 51A. This causes the cup 52A to collect the treatment liquid scattered from the substrate W. FIGS. 2 and 3 illustrate the nozzle 53A and the nozzle transport mechanism 54A. The nozzle 53A dispenses the treatment liquid. More specifically, the nozzle 53A of the resist film coating unit RESIST dispenses a resist film material. The nozzle 53A of the antireflection film coating unit BARC dispenses an antireflection film material. The nozzle transport mechanism 54A holds the nozzle 53A and causes the nozzle 53A to move between a standby position and a treatment position. When the nozzle 53A is in the standby position, the nozzle 53A does not overlap the substrate W in plan view that is held by the spin holder 51A. The nozzle 53A in a standby position is disposed, for example, at a lateral side of the liquid treatment chambers 42a to 42d far away from the transport chambers 44a, 44b. The lateral side of the liquid treatment chambers 42a to 42d, far from the transport chambers 44a, 44b, is right portion of the liquid treatment chambers 42a to 42d for example. The treatment position of the nozzle 53A is above the substrate W held by the spin holder 51A. When the nozzle 53A is in the treatment position, the nozzle 53A overlaps the substrate W in plan view that is held by the spin holder 51A.

The liquid treatment unit SB is disposed in the treatment block BB. The liquid treatment chambers 42e to 42h each accommodate the two liquid treatment units SB. The liquid treatment units SB disposed in the same liquid treatment chambers 42e to 42h are arranged horizontally (specifically, in the forward/backward direction X).

The liquid treatment units SB each perform developing treatment as the liquid treatment. In the developing treatment section, a developer is supplied to the substrate W. Specifically, the liquid treatment units SB correspond to the developing treatment units DEV.

The liquid treatment units SB each include a spin holder 51B, cups 52B, a nozzle 53B, and a nozzle transport mechanism 54B. The spin holder 51B and the cup 52B have the structure substantially equal to the spin holder 51A and the cup 52A, respectively. The nozzle 53B dispenses the developer. The nozzle 53B is, for example, a slit nozzle. The nozzle transport mechanism 54B causes the nozzle 53B to move between a standby position and a treatment position. When the nozzle 53B is in the standby position, the nozzle 53B does not overlap the substrate W in plan view that is held by the spin holder 51B. The treatment position of the nozzle 53B is above the substrate W held by the spin holder 51B. When the nozzle 53B is in the treatment position, the nozzle 53B overlaps the substrate W in plan view that is held by the spin holder 51B.

Reference is made to FIGS. 4 and 5. The treatment section 37 includes main transport mechanisms T1 to T4. The main transport mechanisms T1 to T4 each transport the substrate W. The main transport mechanism T1 is provided in the transport chamber 44a. Likewise, the main transport mechanisms T2 to T4 are provided in the transport chambers 44b to 44d, respectively. The main transport mechanisms T1 to T4 have substantially the same structure. The following describes the structure of the main transport mechanism T1.

Figure 10:
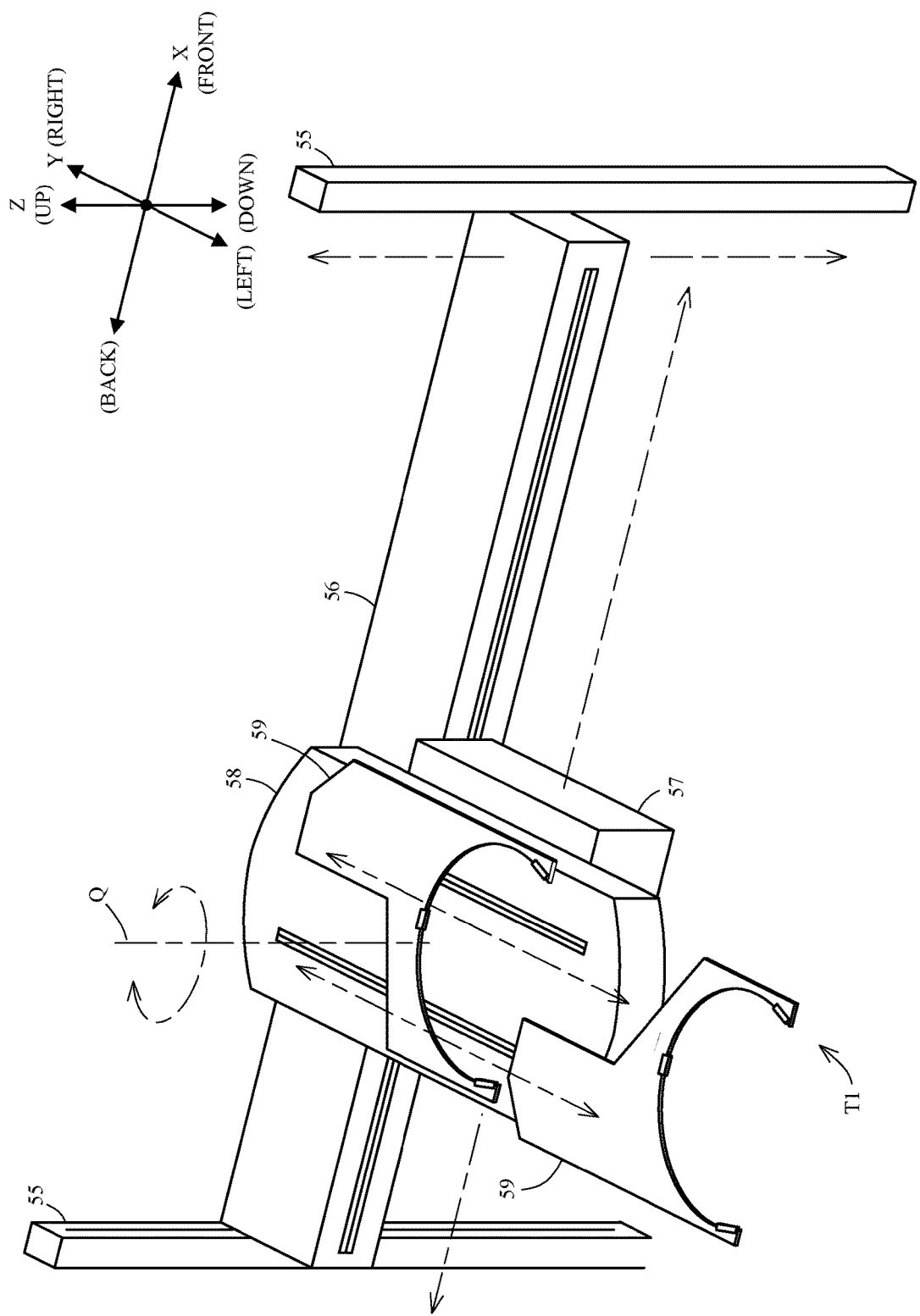
FIG. 10 is a perspective view of the main transport mechanism.

Reference is made to FIG. 10. FIG. 10 is a perspective view of the main transport mechanism. The main transport mechanism T1 includes paired first guide rails 55, a second guide rail 56, a base 57, a spin table 58, and two hands 59.

The first guide rails 55 are provided on a lateral side of the transport chamber 44a adjacent to the liquid treatment chambers 42a, 42b. Specifically, the lateral side of the transport chamber 44a adjacent to the liquid treatment chambers 42a, 42b is right side of the transport chamber 44a. More specifically, one of the first guide rails 55 is disposed in the right front portion of the transport chamber 44a, whereas the other of the first guide rails 55 is disposed in the right rear portion of the transport chamber 44a (see FIG. 1). The first guide rails 55 extend in the vertical direction Z.

The second guide rail 56 is supported by the paired first guide rails 55. The second guide rail 56 extends in the forward/backward direction X. The second guide rail 55 has a front end connected to one of the first guide rails 55, and a rear end connected to the other of the first guide rails 55. The second guide rail 56 is movable in the vertical direction Z relative to the paired first guide rails 55. The base 57 is supported by the second guide rail 56. The base 57 is movable in the forward/backward direction X relative to the second guide rail 56. The spin table 58 is supported on the base 57. The spin table 58 is capable of spinning relative to the base 57 around a longitudinal axis Q that is parallel to the vertical direction Z. The two hands 59 are supported by the spin table 58. The two hands 59 are each capable of reciprocating relative to the spin table 58 in one direction that is horizontal. The hands 59 each hold one substrate W.

The main transport mechanism T1 further includes various drive mechanisms that move the second guide rail 56, the base 57, the spin table 58, and the hands 59, respectively. The various drive mechanisms cause the second guide rail 56 to lift in the vertical direction Z, cause the base 57 to move in the forward/backward direction X, cause the spin table 58 to spin around the longitudinal axis Q, and cause the hands 59 to reciprocate, respectively. This allows the hands 59 to move in the forward/backward direction X, the width direction Y, and the vertical direction Z, and to spin around the longitudinal axis Q.

Reference is made to FIGS. 2 and 3. The treatment section 37 includes a plurality of heat treatment units HU. The heat treatment units HU each perform a heat treatment to the substrate W. The heat treatment chambers 45a to 45v, 46a to 46t each accommodate one of the heat treatment units HU.

Reference is made to FIG. 7. The heat treatment unit HU is classified by a heating and cooling unit PHP, a cooling unit CP, a hydrophobic treatment unit AHL, and a post exposure bake unit PEB.

The heating and cooling unit PHP is provided, for example, in the heat treatment chambers 45a to 45d, 45f to 45i, 45q to 45v, 46a to 46d, and 46f to 46i. The heating and cooling unit PHP performs heating and cooling treatment of heating the substrate W and subsequently cooling the substrate W. The cooling unit CP is provided, for example, in the heat treatment chambers 45e, 45j, 45m, 45p, 46e, and 46j to 46l. The cooling unit CP performs cooling treatment of cooling the substrate W. The hydrophobic treatment unit AHL is provided, for example, in the heat treatment chambers 45k, 45l, 45n, and 45o. The hydrophobic treatment unit AHL performs hydrophobic treatment of heating the substrate W under a vapor atmosphere of hexamethyldisilazane (HMDS) for obtaining enhanced adhesion of the substrate W to the coating film. The post exposure bake unit PEB is provided, for example, in the heat treatment chambers 46m to 46t. The post exposure bake unit PEP performs post exposure bake treatment to the substrate W subjected to the exposure treatment.

Reference is made to FIGS. 2, 3, and 8. The heat treatment units HU each include one or more plates 61 on which the substrate W is placed.

Reference is made to FIGS. 2, 3, and 7. The treatment block BB includes a plurality of (e.g., two) edge exposing units EEWa, EEWb. The edge exposing units EEWa, EEWb are disposed in the left portion of the treatment block BB. The edge exposing unit EEWa is disposed laterally (specifically, leftward) of the transport chamber 44c. The edge exposing unit EEWb is disposed laterally (specifically, leftward) of the transport chamber 44d. The edge exposing units EEWa, EEWb each expose a peripheral edge of the substrate W. The edge exposing units EEWa, EEWb each include a spin holder 62 (see FIGS. 2 and 3) and a light irradiator (not shown). The spin holder 62 holds the substrate W in a rotatable manner. The light irradiator irradiates the periphery of the substrate W held by the spin holder 62 with light to expose the periphery of the substrate W held by the spin holder 62.

Reference is made to FIGS. 2 and 3. The treatment section 37 includes mount tables P1 to P6 on which the substrate W is placed individually. The mount tables P1, P2 is disposed between the indexer 31 and the treatment block BA. The mount table P1 is disposed across the transport chamber 33 and the transport chamber 44a. The mount table P2 is disposed across the transport chamber 33 and the transport chamber 44b. The mount tables P3, P4 are disposed between the treatment blocks BA and BB. The mount table P3 is disposed across the transport chamber 44a and the transport chamber 44c. The mount table P4 is disposed across the transport chamber 44b and the transport chamber 44d. The mount tables P5, P6 are disposed in the rear left portion of the treatment block BB. The mount table P5 is disposed laterally (leftward) of the transport chamber 44c. The mount table P6 is disposed laterally (leftward) of the transport chamber 44d. The mount tables P1 to P6 each include a plate 63 on which the substrate W is placed respectively.

The main transport mechanism T1 transports the substrate W to the liquid treatment chambers 42a, 42b, and the heat treatment chambers 45a to 45e, 45k to 45m, and 45q to 45s. Specifically, the main transport mechanism T1 transports the substrate W to the liquid treatment units SA of the liquid treatment chambers 42a, 42b, and the heat treatment units HU of the heat treatment chambers 45a to 45e, 45k to 45m, and 45q to 45s. More specifically, the hands 59 of the main transport mechanism T1 place the substrate W on the spin holders 51A of the liquid treatment chambers 42a, 42b, and fetch the substrate W placed on the spin holders 51A of the liquid treatment chambers 42a, 42b. The hands 59 of the main transport mechanism T1 place the substrate W on the plates 61 of the heat treatment chambers 45a to 45e, 45k to 45m, and 45q and 45s, and fetch the substrate W placed on the 45a to 45e, 45k to 45m, and 45q and 45s. The main transport mechanism T1 transports the substrate W to the mount tables P1, P3. Specifically, the hands 59 of the main transport mechanism T1 place the substrate W on the plates 63 f the mount tables P1, P3, and fetch the substrate W placed on the plates 63 of the mount table P1, P3.

The main transport mechanism T2 transports the substrate W to the liquid treatment chambers 42c, 42d, the heat treatment chambers 45f to 45j, 45n to 45p, 45t to 45v, and the mount tables P2, P4. The main transport mechanism T3 transports the substrate W to the liquid treatment chambers 42e, 42f, the heat treatment chambers 46a to 46e, 46k, 46m to 46p, the edge exposing unit EEWa, and the mount tables P3, P5. The main transport mechanism T4 transports the substrate W to the liquid treatment chambers 42g, 42h, the heat treatment chambers 46f to 46j, 46l, 46q to 46t, the edge exposing unit EEWb, and the mount tables P4, P6.

The main transport mechanisms T1 and T3 transport the substrate W via the mount table P3 mutually. The main transport mechanisms T2 and T4 transport the substrate W via the mount table P4 mutually.

The indexer transport mechanism TID delivers the substrate W to the mount tables P1, P2. The indexer transport mechanism TID and the main transport mechanism T1 transport the substrate W via the mount table P1 mutually. The indexer transport mechanism TID and the main transport mechanism T2 transport the substrate W via the mount table P2 mutually.

When no distinction is particularly made among the main transport mechanisms T1 to T4, they are referred to as the "main transport mechanism T". When no distinction is particularly made between the cups 52A, 52B, they are referred to as the "cup 52". When no distinction is particularly made between the edge exposing units EEWa, EEWb, they are referred to as the "edge exposing unit EEW".

<Structure of Feed Channel for Liquid Treatment Chamber>

Reference is made to FIG. 6. The substrate treating apparatus 1 includes blowing units 65a to 65h. The blowing unit 65a blows gases into the liquid treatment chamber 42a. The blowing unit 65a is provided in the liquid treatment chamber 42a. The blowing unit 65a is disposed above the two liquid treatment units SA of the liquid treatment chamber 42a. The blowing unit 65a is disposed above the two spin holders 51A and the two cups 52A of the liquid treatment chamber 42a. Likewise, the blowing units 65b to 65h blow gases into the liquid treatment chambers 42b to 42h, respectively. The blowing units 65b to 65h are provided in the liquid treatment chambers 42b to 42h, respectively.

The blowing units 65a to 65h include blowout bores (not shown). The blowout bores are formed in the lower face of the blowing units 65a to 65h, respectively. The unit blowing units 65b to 65h blow gases downwardly through the blowout bores.

The substrate treating apparatus 1 includes feed channels 66a to 66h. The feed channel 66a supplies gases into the liquid treatment chamber 42a. More specifically, the feed channel 66a supplies gases to the liquid treatment chamber 42a without supplying gases to the liquid treatment chambers 42b to 42h. The feed channel 66a is in communication with the liquid treatment chamber 42a. The feed channel 66a is connected to the blowing unit 65a. Likewise, the feed channels 66b to 66h blow gases into the liquid treatment chambers 42b to 42h, respectively. The feed channels 66b to 66h are in communication with the liquid treatment chambers 42b to 42h, respectively. The feed channels 66b to 66h are connected to the blowing units 65b to 65h.

The feed channels 66a to 66h include horizontal members 67a to 67h, respectively. The horizontal member 67a is connected to the blowing unit 65a. Likewise, the horizontal members 67b to 67h are connected to the blowing units 65b to 65h, respectively.

The horizontal members 67a to 67d are disposed in the treatment block BA. The horizontal members 67e to 67h are disposed in the treatment block BB. The horizontal member 67a is disposed at the same position in level as that of the liquid treatment chamber 42a. Likewise, the horizontal members 67b to 67h are disposed at the same positions in level as positions of the liquid treatment chambers 42b to 42h, respectively.

The horizontal members 67a to 67h extends substantially horizontally (specifically, in the forward/backward direction X). The horizontal members 67a to 67d penetrate the unit casing 43A. The horizontal members 67e to 67h penetrate the unit casing 43B. The horizontal member 67a penetrates the unit casing 43A at substantially the same position in plan view as that where the horizontal part 67b to 67d penetrate the unit casing 43A. Likewise, the horizontal part 67e penetrates the unit casing 43B at substantially the same position in plan view as that where the horizontal member 67f to 67h penetrate the unit casing 43B.

The horizontal members 67a to 67h each include a first end. The first end of the horizontal member 67a is disposed in the liquid treatment chamber 42a. The first end of the horizontal member 67a is connected to the blowing unit 65a. Likewise, the first ends of the horizontal members 67b to 67h are disposed in the liquid treatment chambers 42b to 42h, respectively. The first ends of the horizontal members 67b to 67d are connected to the blowing units 65b to 65h, respectively.

The horizontal members 67a to 67h each include a second end. The second ends of the horizontal members 67a to 67h are disposed externally of the unit casings 43A, 43B. The second end of the horizontal member 67a is disposed laterally (specifically, backward) of the liquid treatment chamber 42a. Likewise, the second ends of the horizontal members 67b to 67h are disposed laterally (specifically, backward) of the liquid treatment chambers 42b to 42h, respectively.

The feed channels 66a to 66h include vertical members 68a to 68h, respectively. The vertical member 68a is connected to the horizontal member 67a. Likewise, the vertical members 68b to 68h are connected to the horizontal members 67b to 67h.

The vertical members 68a to 68d are disposed in the treatment block BA. The vertical members 68a to 68d are disposed laterally (specifically, backwardly) of the unit casing 43A. The vertical members 68e to 68h are disposed in the treatment block BB. The vertical members 68e to 68h are disposed laterally (specifically, backwardly) of the unit casing 43B. The vertical members 68a to 68h extend in the substantially vertical direction Z.

The vertical members 68a to 68h each include an upper end. The upper end of the vertical member 68a is disposed at the same position in level as the liquid treatment chamber 42a. The upper end of the vertical member 68a is connected to the second end of the horizontal member 67a. The vertical member 68a extends downwardly from the horizontal member 67a. Likewise, the upper ends of the vertical members 68b to 68h are disposed at the same positions in level as positions of the liquid treatment chambers 42b to 42h, respectively. The upper ends of the vertical members 68b to 68h are connected to the second ends of the horizontal members 67b to 67h, respectively. The vertical members 68b to 68h extend downwardly from the horizontal members 67b to 67h, respectively.

The vertical members 68a to 68d both extend to a position lower in level than the liquid treatment chamber 42d. The vertical members 68e to 68h both extend to a position lower in level than the liquid treatment chamber 42h.

The vertical members 68a to 68h each include a lower end. The lower ends of the vertical members 68a to 68d are disposed at positions lower in level than positions of the liquid treatment chambers 42a to 42d, respectively. The lower ends of the vertical members 68e to 68h are disposed at positions lower in level than positions of the liquid treatment chambers 42e to 42h, respectively.

The vertical members 68a to 68d are formed by one multi-tube unit 71a. The vertical members 68e to 68h are formed by one multi-tube unit 71b. The multi-tube units 71a, 71b have substantially the same structure. The following describes the structure of the multi-tube unit 71a.

Figure 11A:
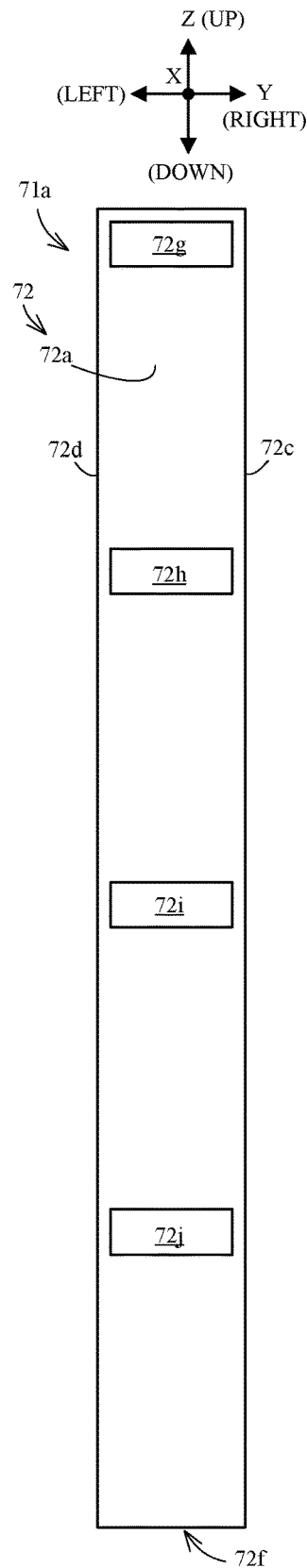
FIG. 11A is a front view of a multi-tube unit.
Figure 11B:
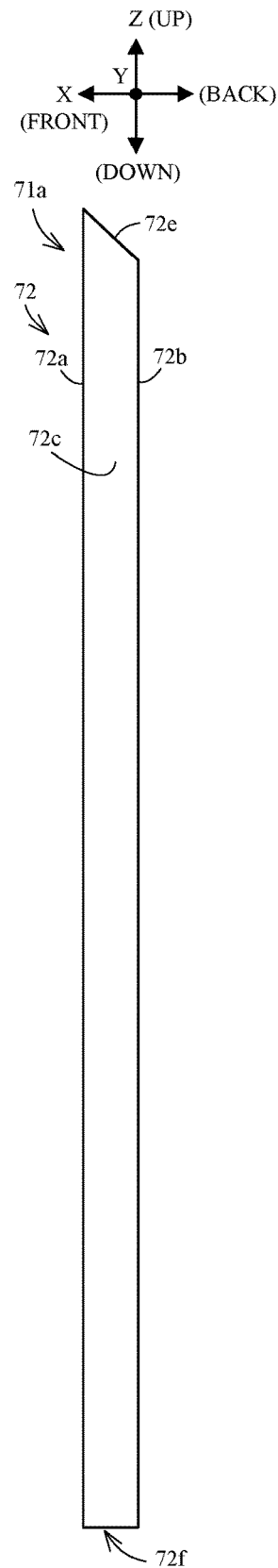
FIG. 11B is a side view of the multi-tube unit.
Figure 11C:
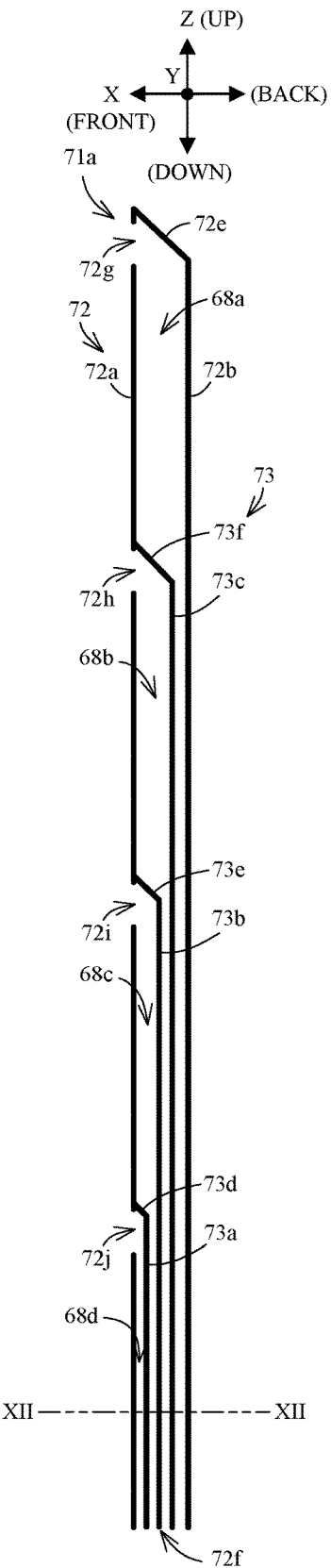
FIG. 11C is a vertical sectional view of the multi-tube unit.
Figure 12:
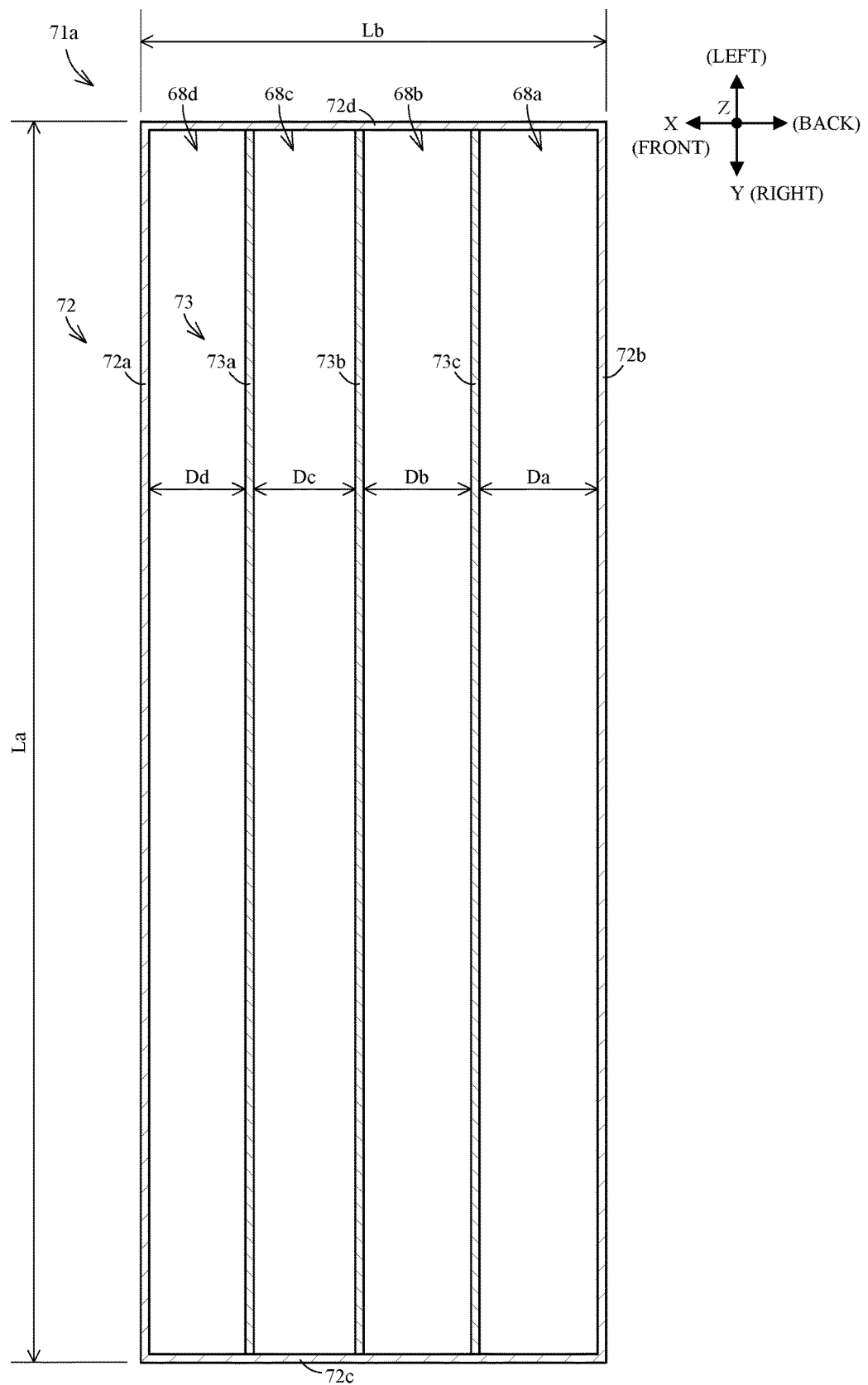
FIG. 12 is a horizontal sectional view along a line XII-XII of FIG. 11C.

Reference is made to FIGS. 11A, 11B, 11C, and 12. FIG. 11A is a front view of the multi-tube unit 71a. FIG. 11B is a side view of the multi-tube unit 71a. FIG. 11C is a vertical sectional view of the multi-tube unit 71a. FIG. 12 is a horizontal sectional view along a line XII-XII of FIG. 11C. The multi-tube unit 71a includes a box 72. The box 72 extends in the substantially vertical direction Z. The box 72 has an interior space formed therein. The box 72 is substantially rectangular in horizontal sectional view.

The box 72 includes a front wall 72a, a rear wall 72b, a right wall 72c, a left wall 72d, and a top wall 72e. The interior space of the box 72 is defined by the front wall 72a, the rear wall 72b, the right wall 72c, the left wall 72d, and the top wall 72e.

The front wall 72a extends in the substantially vertical direction Z. Specifically, the front wall 72a is a flat plate substantially parallel to the vertical direction Z and the width direction Y. The rear wall 72b is disposed backwardly of the front wall 72a. The rear wall 72b is a flat plate substantially parallel to the front wall 72a. The right wall 72a and the left wall 72d are substantially orthogonal to the front wall 72a. Specifically, the right wall 72c and the left wall 72d are each a flat plate substantially parallel to the vertical direction Z and the forward/backward direction X. The right wall 72c is connected to the front wall 72a and the rear wall 72b. Specifically, the right wall 72c is connected to a right edge of the front wall 72a and a right edge of the rear wall 72b. The left wall 72d is connected to the front wall 72a and the rear wall 72b. Specifically, the left wall 72d is connected to a left edge of the front wall 72a and a left edge of the rear wall 72b. The top wall 72e is connected to the front wall 72a, the rear wall 72b, the right wall 72c, and the left wall 72d. Specifically, the top wall 72e is connected to an upper edge of the front wall 72a, an upper edge of the rear wall 72b, an upper edge of the right wall 72c, and an upper edge of the left wall 72d. The upper edge of the front wall 72a is disposed at a position higher in level than the upper edge of the rear wall 72b. The top wall 72e is inclined upwardly from the rear wall 72b to the front wall 72a.

The front wall 72a has a width La longer than a width Lb of the right wall 72c and the left wall 72d. That is, the box 72 is thin in the forward/backward direction X. Here, the width La of the front wall 72a corresponds to the length of the front wall 72a in the width direction Y. Moreover, the width Lb of the right wall 72c and the left wall 72d corresponds to the length of the right wall 72c and the left wall 72d in the forward/backward direction X. The right wall 72c and the left wall 72d correspond to the lateral walls of the box 72.

The box 72 has an inlet 72f The inlet 72f is an opening formed in the lower end of the box 72. Gases enter into the interior space of the box 72 through the inlet 72f.

The box 72 has outlets 72g to 72j. The outlets 72g to 72j are arranged downwardly in this order. The outlets 72g to 72j are each an opening formed in the front wall 72a. Gases within the interior space of the box 72 are ejected through the outlets 72g to 72j.

The outlets 72g to 72j are disposed at substantially the same position as one another in the width direction Y. In other words, the outlets 72g to 72j are disposed at substantially the same position as one another in plan view.

The multi-tube unit 71a includes a partition member 73. The partition member 73 is disposed in the box 72. The partition member 73 divides the interior space of the box 72 into a plurality of spaces. The plurality of spaces divided by the partition member 73 correspond to flow paths of the vertical members 68a to 68d. That is, the vertical members 68a to 68d are formed in the box 72. The vertical members 68a to 68d are separated by the partition member 73.

The partition member 73 includes vertical plates 73a, 73b, 73c. The vertical plates 73a to 73c extend in the substantially vertical direction Z. Specifically, the vertical plates 73a to 73c are each a flat plate substantially parallel to front wall 72a. The vertical plates 73a to 73c are disposed backwardly of the front wall 72a and forwardly of the rear wall 72b. The vertical plate 73b is disposed backwardly of the vertical plate 73a. The vertical plate 73c is disposed backwardly of the vertical plate 73b.

The vertical plates 73a to 73c are connected to the right wall 72c and the left wall 72d. The vertical plates 73a to 73c each have a width equal to that of the front wall 72a. The right wall 72c connects a right edge of the vertical plate 73a, a right edge of the vertical plate 73b, and a right edge of the vertical plate 73c. The left wall 72d connects a left edge of the vertical plate 73a, a left edge of the vertical plate 73b, and a left edge of the vertical plate 73c.

The partition member 73 includes block plates 73d, 73e, and 73f The block plate 73d is connected to an upper edge of the vertical plate 73a. The block plate 73d extends from the vertical plate 73a to the front wall 72a. Specifically, the block plate 73d is inclined upwardly from the vertical plate 73a to the front wall 72a. The block plate 73d is connected to the front wall 72a. Specifically, the front wall 72a is connected to a front edge of the block plate 73d. The front wall 72a is connected to the block plate 73d at a position lower than the outlet 72i and higher than the outlet 72j. Specifically, the front wall 72a is connected to the block plate 73d at a position adjacent to an upper edge of the outlet 72j. Likewise, the block plates 73e, 73f are connected to the vertical plates 73b, 73c, respectively. The block plates 73e, 73f extend from the vertical plates 73b, 73c to the front wall 72a, respectively. The block plates 73e, 73f are connected to the front wall 72a. The front wall 72a is connected to the block plate 73e at a position lower than the outlet 72h and higher than the outlet 72i. The front wall 72a is connected to the block plate 73f at a position lower than the outlet 72g and higher than the outlet 72h.

The block plates 73d to 73f are connected to the right wall 72c and the left wall 72d. The block plates 73d to 73f each have a width equal to that of the front wall 72a. The right wall 72c connects a right edge of the block plate 73d, a right edge of the block plate 73e, and a right edge of the block plate 73f. The left wall 72d connects a left edge of the block plate 73d, a left edge of the block plate 73e, and a left edge of the block plate 73f.

The box 72, the vertical plate 73c, and the block plate 73f define the vertical member 68a. The box 72, the vertical plates 73b, 73c, and the block plates 73e, 73f define the vertical member 68b. The box 72, the vertical plates 73a, 73b, and the block plates 73d, 73e define the vertical member 68c. The box 72, the vertical plate 73a, and the block plate 73d define the vertical member 68d.

The vertical members 68a, 68b are separated by the vertical plate 73c and the block plate 73f. The vertical members 68b, 68c are separated by the vertical plate 73b and the block plate 73e. The vertical members 68c, 68d are separated by the vertical plate 73a and the block plate 73d.

The vertical plate 73c and the block plate 73f are not only a part of the vertical members 68a, but also a part of the vertical members 68b. That is, the vertical member 68a and the vertical member 68b are partially formed by the same member. Accordingly, this achieves reduction in size of the multi-tube unit 71. Specifically, this suppresses the length of the box 72 in the forward/backward direction X (i.e., the width Lb of the lateral wall of the box 72). Likewise, the vertical plate 73b and the block plate 73e are not only a part of the vertical members 68b, but also a part of the vertical members 68c. The vertical plate 73a and the block plate 73d are not only a part of the vertical members 68c, but also a part of the vertical members 68d. Accordingly, this achieves a much smaller thickness of the box 72 in the forward/backward direction X.

Lower edges of the vertical plates 73a to 73c correspond to the lower ends of the vertical members 68a to 68d. The lower edges of the vertical plates 73a to 73c are disposed at substantially the same position in level as one another. Accordingly, the lower ends of the vertical members 68a to 68d are disposed at substantially the same position in level as one another. The vertical member 68a is longer than the vertical member 68b. The vertical member 68b is longer than the vertical member 68c. The vertical member 68c is longer than the vertical member 68d.

The lower edges of the vertical plates 73a to 73c are disposed at substantially the same position in level as the lower end of the box 72. Accordingly, the lower end of the box 72 corresponds to the lower ends of the vertical members 68a to 68d.

The rear wall 72b is spaced away from the vertical plate 73c at a distance Da, which is larger than a distance Db at which the vertical plate 73c is spaced away from the vertical plate 73b. Accordingly, the vertical member 68a has a channel sectional area larger than that of the vertical member 68b. The distance Db between the vertical plate 73c and the vertical plate 73b is larger than a distance Dc at which the vertical plate 73b is spaced away from the vertical plate 73a. Accordingly, the vertical member 68b has a channel sectional area larger than that of the vertical member 68c. The distance Dc between the vertical plate 73b and the vertical plate 73a is larger than a distance Dd at which the vertical plate 73a is spaced away from the front wall 72a. Accordingly, the vertical member 68b has a channel sectional area larger than that of the vertical member 68a.

When no distinction is made among the vertical members 68a to 68d, they are referred to as the "vertical member 68". The longer the vertical member 68 is, the larger channel sectional area the vertical member 68 has.

Figure 13:
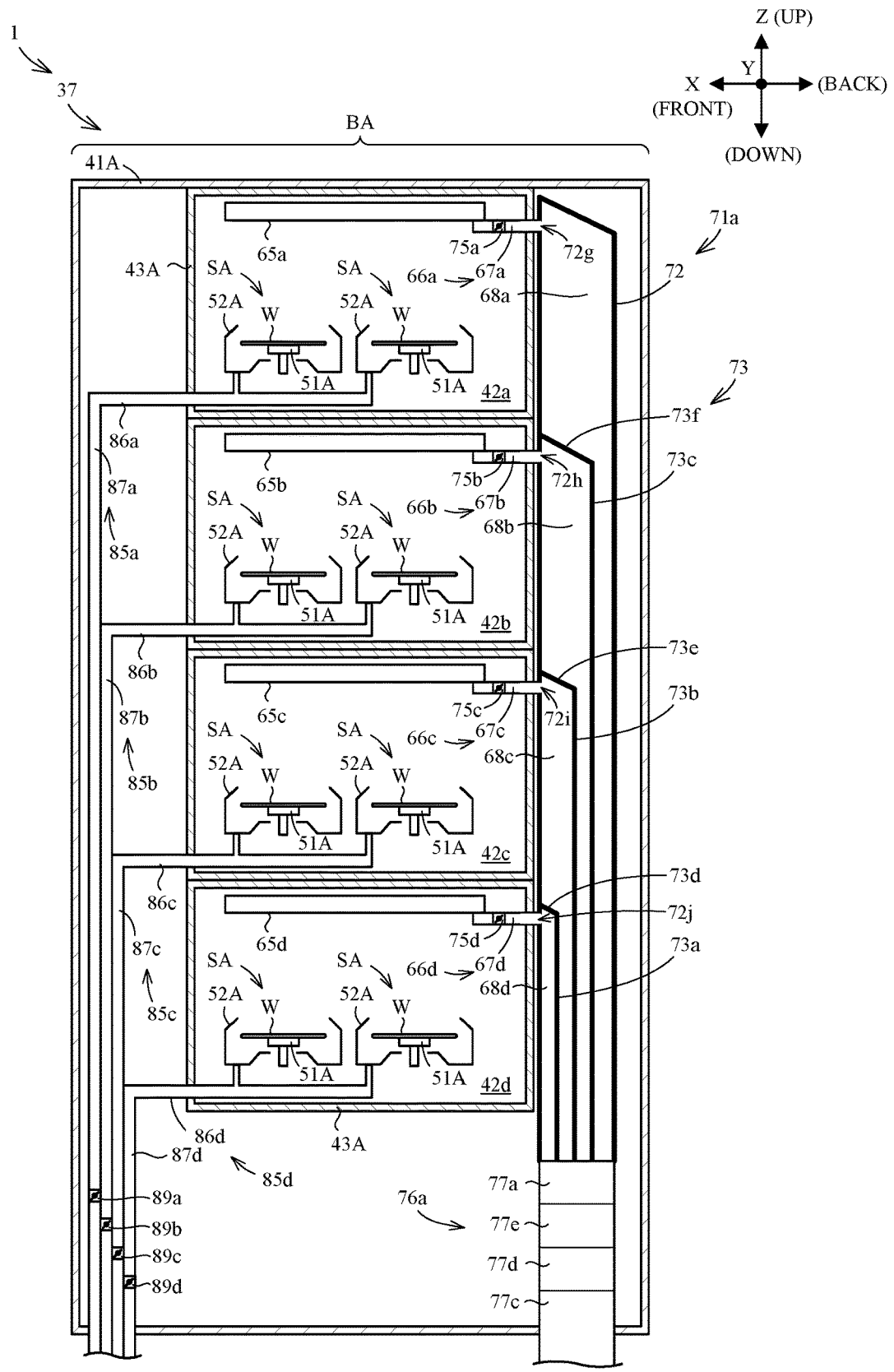
FIG. 13 is a detailed side view of a treatment block.

Reference is made to FIG. 13. FIG. 13 is a detailed side view of the treatment block BA. The box 72 is disposed laterally (specifically, backwardly) of the liquid treatment chambers 42a to 42d. The box 72 is disposed laterally (specifically, backwardly) of the unit casing 43A. The front wall 72a faces to the liquid treatment chambers 42a to 42d. The front wall 72a faces to the unit casing 43A. An upper end of the box 72 is disposed at the position same in level as the liquid treatment chamber 42a. The lower end of the box 72 is disposed at a position lower in level than the liquid treatment chamber 42d. The outlet 72g is disposed at the same position in level as the liquid treatment chamber 42a. Likewise, the outlets 72h to 72j are disposed at the same position in level as the liquid treatment chambers 42b to 42d, respectively.

The front wall 72a connects the horizontal members 67a to 67d. Specifically, the second end of the horizontal member 67a is connected to the front wall 72a around the outlet 72g. This achieves communication between the horizontal member 67a and the vertical member 68a via the outlet 72g. Likewise, the second ends of the horizontal members 67b to 67d are connected to the front wall 72a around the outlets 72h to 72j. This achieves communication between the horizontal members 67b to 67d and the vertical members 68b to 68d via the outlets 72h to 72j, respectively.

Reference is made to FIGS. 6 and 13. The substrate treating apparatus 1 further includes dampers 75a to 75h. The damper 75a is provided on the feed channel 66a. The damper 75a regulates a flow rate of gases that flow in the feed channel 66a. Likewise, the dampers 75b to 75h are provided on the feed channels 66b to 66h, respectively. The dampers 75b to 75h regulate a flow rate of gases that flow in the feed channels 66b to 66h, respectively.

The damper 75a is disposed downstream of the vertical member 68a. Specifically, the damper 75a is provided in the horizontal member 67a. The damper 75a is disposed in the liquid treatment chamber 42a. Likewise, the dampers 75b to 75h are disposed downstream of the vertical members 68b to 68h. Specifically, the dampers 75b to 75h are provided in the horizontal members 67b to 67h, respectively. The dampers 75b to 75h are disposed in the liquid treatment chambers 42b to 42h.

The substrate treating apparatus 1 further includes distributing pipes 76a, 76b. The distributing pipe 76a supplies gases into the feed channels 66a to 66d. The distributing pipe 76a is connected to the feed channels 66a to 66d. The distributing pipe 76b supplies gases into the feed channels 66e to 66h. The distributing pipe 76b is connected to the feed channels 66e to 66h.

The distributing pipes 76a, 76b have substantially the same structure. The following describes the structure of the distributing pipe 76a.

The distributing pipe 76a has a connector 77a. The connector 77a is connected to the multi-tube unit 71a. Specifically, the connector 77a is connected to the lower end of the box 72. In other words, the connector 77a is connected to the lower ends of the vertical members 68a to 68d. The lower ends of the vertical members 68a to 68d correspond to the upstream ends of the feed channels 66a to 66d.

The connector 77a is disposed in the treatment block BA. The connector 77a is disposed at a position lower in level than the liquid treatment chamber 42d. That is, the distributing pipe 76a is connected to the feed channels 66a to 66d at a position lower in level than the liquid treatment chamber 42d.

The connector 77a extends in the substantially vertical direction Z. The connector 77a has an upper end connected to the feed channels 66a to 66d. Consequently, the connector 77a extends in the direction substantially equal to that where the lower ends of the vertical members 68a to 68d extend. That is, the connector 77a extends in the direction substantially equal to that where the upstream ends of the feed channel 66a to 66d extend.

The distributing pipe 76a is connected to the gas controller 5 (see FIG. 1). The gas controller 5 is disposed externally of the treatment section 37, for example. The distributing pipe 76a extends from the inside of the treatment block BA to the outside of the treatment section 37. The distributing pipe 76a penetrates the block casing 41A (e.g., a bottom board of the block casing 41A). The distributing pipe 76a includes an upstream end (not shown). The upstream end of the distributing pipe 76a is connected to the gas controller 5.

When no distinction is particularly made among the blowing units 65a to 65h, they are referred to as the "blowing unit 65". When no distinction is particularly made among the feed channels 66a to 66h, they are referred to as the "feed channel 66".

Any two of the liquid treatment chambers 42a to 42d are one example of the first liquid treatment chamber 2a and the second liquid treatment chamber 2b described above (see FIG. 1). Any two of the feed channels 66a to 66d are one example of the first feed channel 3a and the second feed channel 3b. Any two of the vertical members 68a to 68d are one example of the first vertical member 4a and the second vertical member 4b. Any two of the blowing units 65a to 65d are one example of the first blowing unit and the second blowing unit in the present invention. Any two of the dampers 75a to 75d are one example of the first regulator and the second regulator in the present invention.

Likewise, any two of the liquid treatment chambers 42e to 42h are one example of the first liquid treatment chamber 2a and the second liquid treatment chamber 2b. Any two of the feed channels 66e to 66h are one example of the first feed channel 3a and the second feed channel 3b. Any two of the vertical members 68e to 68h are one example of the first vertical member 4a and the second vertical member 4b. Any two of the blowing units 65e to 65h are one example of the first blowing unit and the second blowing unit in the present invention. Any two of the dampers 75e to 75h are one example of the first regulator and the second regulator in the present invention.

<Structure of Feed Channel for Transport Chamber>

Reference is made to FIGS. 4 and 5. The substrate treating apparatus 1 includes blowing units 81a to 81d. The blowing unit 81a blows gases into the transport chamber 44a. The blowing unit 81a is provided in the transport chamber 44a. The blowing unit 81a is provided above of the main transport mechanism T1. The blowing unit 81a has a dimension substantially equal to that of the transport chamber 44a in plan view. Likewise, the blowing units 81b to 81d blow gases into the transport chambers 44b to 44d, respectively. The blowing units 81b to 81d are provided in the transport chambers 44b to 44d, respectively.

The blowing units 81a to 81d include blowout bores (not shown). The blowout bores are formed in the lower face of the blowing units 81a to 81d, respectively. The blowing units 81a to 81d blow gases downwardly through the blowout bores.

Reference is made to FIG. 4. The substrate treating apparatus 1 includes feed channels 82a to 82d. The feed channel 82a supplies gases to the transport chamber 44a. The feed channel 82a supplies gases to the transport chamber 44a without supplying gases to the transport chambers 44b to 44d. The feed channel 82a is in communication with the transport chamber 44a. The feed channel 82a is connected to the blowing unit 81a. Likewise, the feed channels 82b to 82d supply gases to the transport chambers 44b to 44d, respectively. The feed channels 82b to 82d are in communication with the transport chambers 44b to 44d, respectively. The feed channels 82b to 82d are connected to the blowing units 81b to 81d, respectively. Now, FIG. 4 illustrates the feed channels 82a to 82d at different positions from those in FIG. 1 for convenience.

The feed channels 82a to 82d include vertical members 83a to 83d, respectively. The vertical members 83a to 83d are connected to the blowing units 81a to 81d, respectively.

The vertical members 83a, 83b are disposed in the treatment block BA. The vertical members 83c, 83d are disposed in the treatment block BB. The vertical members 83a to 83d extend in the substantially vertical direction Z.

The vertical members 83a to 83d each include an upper end. The upper end of the vertical member 83a is disposed at the same position in level as the transport chamber 44a. The upper end of the vertical member 83a is connected to the blowing unit 81a. Likewise, the upper ends of the vertical members 83b to 83d are disposed at the same position in level as positions of the transport chambers 44b to 44d, respectively. The upper ends of the vertical member 83b to 83d are connected to the blowing units 81b to 81d.

Reference is made to FIG. 9. The vertical member 83a is connected to a lateral side of the blowing unit 81a adjacent to the liquid treatment chambers 42a, 42b. The lateral side of the blowing unit 81a adjacent to the liquid treatment chambers 42a, 42b is a right side of the blowing unit 81a, for example. Likewise, the vertical members 83b to 83d are connected to lateral sides of the blowing units 81b to 81d, respectively, adjacent to the liquid treatment chambers 42c to 42h.

The vertical member 83a extends downwardly from the blowing unit 81a. Likewise, the vertical members 83b to 83d extend downwardly from the blowing units 81b to 81d, respectively.

Reference is made to FIG. 2. The vertical member 83a passes through the transport chamber 44a. The vertical member 83a passes on the lateral side of the transport chamber 44a adjacent to the liquid treatment chambers 42a, 42b. Specifically, the lateral side of the transport chamber 44a adjacent to the liquid treatment chambers 42a, 42b is a right side of the transport chamber 44a. More specifically, the vertical member 83a passes through a right rear part of the transport chamber 44a. The vertical member 83a passes through a position rightward of the mount table P3. Likewise, the vertical member 83c passes through the transport chamber 44c.

Reference is made to FIG. 3. The vertical members 83a, 83b pass through the transport chamber 44b. The vertical members 83a, 83b pass on the lateral side of the transport chamber 44b adjacent to the liquid treatment chambers 42c, 42d. Specifically, the lateral side of the transport chamber 44b adjacent to the liquid treatment chambers 42c, 42d is a right side of the transport chamber 44b. More specifically, the vertical members 83a, 83b pass through a right rear part of the transport chamber 44b. The vertical members 83a, 83b pass through a position rightward of the mount table P4. In the transport chamber 44b, the vertical members 83a, 83b are arranged in the width direction Y. The vertical members 83a, 83b are arranged adjacent to each other in the transport chamber 44b. Likewise, the vertical members 83c, 83d pass through the transport chamber 44d.

Reference is made to FIGS. 4 and 9. The vertical members 83a, 83b both extend to a position lower in level than the transport chamber 44b. Likewise, the vertical members 83c, 83d both extend to a position lower in level than the transport chamber 44d.

The vertical members 83a to 83d each include a lower end. The lower ends of the vertical members 83a, 83b are disposed at a position lower in level than the transport chambers 44a, 44b, respectively. The lower ends of the vertical members 83c, 83d are disposed at a position lower in level than the transport chambers 44c, 44d, respectively.

The lower ends of the vertical members 83a, 83b are disposed at substantially the same position in level as each other. The lower ends of the vertical members 83c, 83d are disposed at substantially the same position in level as each other.

The vertical member 83a is longer than the vertical member 83b. The vertical member 83a has a channel sectional area larger than that of the vertical member 83b. Likewise, the vertical member 83c is longer than the vertical member 83d. The vertical member 83c has a channel sectional area larger than that of the vertical member 83d.

The substrate treating apparatus 1 further includes dampers 84a to 84d. The damper 84a is provided on the feed channel 82a. The damper 84a regulates a flow rate of gases that flow in the feed channel 82a. Likewise, the dampers 84b to 84d are provided on the feed channels 82b to 82d, respectively. The dampers 84b to 84d regulate a flow rate of gases that flow in the feed channel 82b to 82d, respectively.

The dampers 84a to 84d are provided in the vertical members 83a to 83d, respectively. The dampers 84a, 84b are disposed at a position lower in level than the transport chambers 44*a*, 44*b*, respectively. The dampers 84*c*, 84*d* are disposed at a position lower in level than the transport chambers 44*c*, 44*d*, respectively.

Reference is made to FIG. 9. The distributing pipe 76*a* further supplies gases into feed channels 82*a* to 82*b*. The distributing pipe 76*a* is connected to the feed channels 82*a* to 82*b*.

The following describes the structure of the distributing pipe 76*a*.

The distributing pipe 76*a* has a connector 77*b*. The connector 77*b* is connected to the lower ends of the vertical members 83*a*, 83*b*. The lower ends of the vertical members 83*a*, 83*b* correspond to upstream ends of the feed channels 82*a*, 82*b*.

The connector 77*b* is disposed in the treatment block BA. The connector 77*b* is disposed at a position lower in level than the transport chamber 44*b*. Accordingly, the distributing pipe 76*a* is connected to the feed channels 82*a*, 82*b* at a position lower in level than the transport chamber 44*b*. The connector 77*b* is disposed at a different position from that of the connector 77*a* in plan view.

The connector 77*b* extends substantially horizontally (e.g., in the width direction Y). Consequently, the connector 77*b* extends in the direction substantially orthogonal to that where the lower ends of the vertical members 83*a*, 83*b* extend. That is, the connector 77*b* extends in the direction substantially orthogonal to that where the upstream ends of the feed channels 81*a*, 81*b* extend.

The distributing pipe 76*a* further includes a main pipe 77*c*, a branched part 77*d*, and branch pipes 77*e*, 77*f*. The main pipe 77*c* extends from the inside of the treatment block BA to the outside of the treatment section 37. The main pipe 77*c* penetrates the block casing 41A (e.g., a bottom board of the block casing 41A). The main pipe 77*c* has an upstream end (not shown) that is connected to the gas controller 5. The main pipe 77*c* has a downstream end that is connected to the branched part 77*d*. The branched part 77*c* is also connected to the branch pipes 77*e*, 77*f*. The branched part 77*d*, and the branch pipes 77*e*, 77*f* are disposed in the treatment block BA. The connector 77*a* corresponds to the downstream end of the branch pipe 77*e*. The connector 77*b* corresponds to the downstream end of the branch pipe 77*f*.

The branched part 77*d* includes a main body 77*d*1. The main body 77*d*1 has a box shape. The main body 77*d*1 has an interior space formed therein. The main body 77*d*1 connects the main pipe 77*c* and the branch pipes 77*e*, 77*f*.

The branched part 77*d* includes a guiding part 77*d*2. The guiding part 77*d*2 guides a part of gases in the main body 77*d*1 to the branch pipe 77*e*, and guides the other part of the gases in the main body 77*d*1 to the branch pipe 77*f*. The guiding part 77*d*2 has a flat plate shape, for example. The guiding part 77*d*2 is disposed in the main body 77*d*1. The guiding part 77*d*2 is connected to an inner wall of the main body 77*d*1. The guiding part 77*d*2 is connected to the main body 77*d*1 at a position between a connection position of the main body 77*d*1 to the branch pipe 77*e* and a connection position of the main body 77*d*1 to the branch pipe 77*f*. The guiding part 77*d*2 extends from the inner wall of the main body 77*d*1 to a middle portion of the interior space of the main body 77*d*1.

Reference is made to FIG. 6. The distributing pipe 76*b* has substantially the same structure as the distributing pipe 76*a*. That is, the distributing pipe 76*b* supplies gases into the feed channels 82*c* to 82*d*. The distributing pipe 76*b* is connected to the feed channels 82*c* to 82*d*.

Reference is made to FIG. 9. The substrate treating apparatus 1 further includes dampers 78*a*, 78*b*. The damper 78*a* is provided in the branch pipe 77*e*. The damper 78*a* regulates a flow rate of gases that flow in the branch pipe 77*e*. That is, the damper 78*a* regulates a total amount of gases that flow in the feed channels 66*a* to 66*d*. The damper 78*b* is provided in the branch pipe 77*f*. The damper 78*b* regulates a flow rate of gases that flow in the branch pipe 77*f*. That is, the damper 78*b* regulates a total amount of gases that flow in the feed channels 82*a*, 82*b*.

When no distinction is particularly made among the blowing units 81*a* to 81*d*, they are referred to as the "blowing unit 81". When no distinction is particularly made among the feed channels 82*a* to 82*d*, they are referred to as the "feed channel 82".

The transport chamber 44*a* and the transport chamber 44*b* are one example of the first transport chamber 12*a* and the second transport chamber 12*b* (see FIG. 1). The feed channels 82*a*, 82*b* are one example of the first feed channel 13*a* and the second feed channel 13*b*. The vertical members 83*a*, 83*b* are one example of the first vertical member 14*a* and the second vertical member 14*b*.

Likewise, the transport chamber 44*c* and the transport chamber 44*d* are one example of the first transport chamber 12*a* and the second transport chamber 12*b*. The feed channels 82*c*, 82*d* are one example of the first feed channel 13*a* and the second feed channel 13*b*. The vertical members 83*c*, 83*d* are one example of the first vertical member 14*a* and the second vertical member 14*b*.

<Structure of Exhaust Channel for Liquid Treatment Chamber>

Reference is made to FIGS. 6 and 13. The substrate treating apparatus 1 further includes exhaust channels 85*a* to 85*h*. The exhaust channel 85*a* exhausts gases of the liquid treatment chamber 42*a*. More specifically, the exhaust channel 85*a* exhausts gases of the liquid treatment chamber 42*a* without exhausting gases of the liquid treatment chambers 42*b* to 42*h*. The exhaust channel 85*a* is in communication with the liquid treatment chamber 42*a*. Likewise, the exhaust channels 85*b* to 85*h* exhaust gases of the liquid treatment chambers 42*b* to 42*h*, respectively. The exhaust channels 85*a* to 85*h* are in communication with the liquid treatment chambers 42*b* to 42*h*, respectively.

The exhaust channels 85*a* to 85*h* include horizontal members 86*a* to 86*h*, respectively. The horizontal member 86*a* is connected to the two cups 52A provided in the liquid treatment chamber 42*a*. Likewise, the horizontal members 86*b* to 86*d* are connected to the cups 52A provided in the liquid treatment chambers 42*b* to 42*d*, respectively. The horizontal members 86*e* to 86*h* are connected to the cups 52B provided in the liquid treatment chambers 42*e* to 42*h*, respectively.

The horizontal members 86*a* to 86*d* are disposed in the treatment block BA. The horizontal members 86*e* to 86*h* disposed in the treatment block BB. The horizontal member 86*a* is disposed at the same position in level as that of the liquid treatment chamber 42*a*. Likewise, the horizontal members 86*b* to 86*h* are disposed at the same positions in level as positions of the liquid treatment chambers 42*b* to 42*h*, respectively.

The horizontal members 86*a* to 86*h* extend substantially horizontally (specifically, in the forward/backward direction X). The horizontal members 86*a* to 86*d* penetrate the unit casing 43A. Likewise, the horizontal members 86*e* to 86*h* penetrate the unit casing 43B. The horizontal member 86*a* penetrates the unit casing 43A at substantially the same position in plan view as that where the horizontal members 86*b* to 86*d* penetrate the unit casing 43A. Likewise, the horizontal member 86*e* penetrates the unit casing 43B at substantially the same position in plan view as that where the horizontal members 86f to 86h penetrate the unit casing 43B.

Reference is made to FIGS. 2 and 3. The horizontal members 86a to 86h each include a first end. The first end of the horizontal member 86a is disposed in the liquid treatment chamber 42a. A part of the horizontal member 86a located in the liquid treatment chamber 42a is disposed at the lateral side of the liquid treatment chamber 42a adjacent to the transport chamber 44a. Specifically, the lateral side of the liquid treatment chamber 42a adjacent to the transport chamber 44a is a left side of the liquid treatment chamber 42a. The first end of the horizontal member 86a is connected to the two cups 52A provided in the liquid treatment chamber 42a. Likewise, the first ends of the horizontal members 86b to 86h are disposed in the liquid treatment chambers 42b to 42h, respectively.

Reference is made to FIGS. 6 and 13. The horizontal members 86a to 86h each include a second end. The second ends of the horizontal members 86a to 86h are disposed externally of the unit casings 43A, 43B. The second end of the horizontal member 86a is disposed laterally (specifically, forward) of the liquid treatment chamber 42a. The second ends of the horizontal members 86b to 86h are disposed laterally (specifically, forward) of the liquid treatment chambers 42b to 42h, respectively.

The exhaust channels 85a to 85h include vertical members 87a to 87h, respectively. The vertical member 87a is connected to the horizontal member 86a. Likewise, the vertical members 87b to 87h are connected to the horizontal members 86b to 86h.

The vertical members 87a to 87d are disposed laterally (specifically, forward) of the unit casing 43A. The vertical members 87e to 87h are disposed laterally (specifically, forward) of the unit casing 43B. The vertical members 87a to 87h extend in the substantially vertical direction Z.

The vertical members 87a to 87h each include an upper end. The upper end of the vertical member 87a is disposed at the same position in level as the liquid treatment chamber 42a. The upper end of the vertical member 87a is connected to the second end of the horizontal member 86a. Likewise, the upper ends of the vertical members 87b to 87h are disposed at the same positions in level as positions of the liquid treatment chambers 42b to 42h, respectively. The upper ends of the vertical members 87b to 87h are connected to the second ends of the horizontal members 86b to 86h, respectively.

The vertical member 87a extends downwardly from the horizontal member 86a. Likewise, the vertical members 87b to 87h extend downwardly from the horizontal members 86b to 86h, respectively.

Reference is made to FIG. 8. More strictly, the horizontal members 86a to 86c are bent in the substantially width direction Y (e.g., to rightward) in front of the liquid treatment chambers 42a to 42c. The second ends of the horizontal members 86a to 86d are shifted from one another in the width direction Y in front view. Accordingly, no interference occurs among the vertical members 87a to 87d. For instance, the vertical members 87a to 87d are arranged in the substantially width direction Y. Likewise, the horizontal members 86e to 86g are bent in the substantially width direction Y (e.g., to rightward) in front of the liquid treatment chambers 42e to 42g. Accordingly, no interference occurs among the vertical members 87e to 87h.

Reference is made to FIGS. 6, 8, and 13. The vertical members 87a to 87d both extend to a position lower in level than the liquid treatment chamber 42d. The vertical members 87e to 87h both extend to a position lower in level than the liquid treatment chamber 42h.

The vertical members 87a to 87h each include a lower end. The lower ends of the vertical members 87a to 87d are disposed at positions lower in level than positions of the liquid treatment chambers 42a to 42d, respectively. The lower ends of the vertical members 87e to 87h are disposed at positions lower in level than positions of the liquid treatment chambers 42e to 42h, respectively.

The vertical members 87a to 87d each extend to a position lower in level than the treatment block BA. The vertical members 87a to 87d extend from the inside of the treatment block BA to the outside of the treatment section 37. The vertical members 87a to 87d penetrate the block casing 41A (e.g., a bottom board of the block casing 41A). Likewise, the vertical members 87e to 87h each extend to a position lower in level than the treatment block BB.

The lower ends of the vertical members 87a to 87d are disposed at substantially the same positions in level as one another. The lower ends of the vertical members 87e to 87h are disposed at substantially the same positions in level as one another.

The vertical member 87a is longer than the vertical member 87b. The vertical member 87a has a channel sectional area larger than that of the vertical member 87b. The vertical member 87b is longer than the vertical member 87c. The vertical member 87b has a channel sectional area larger than that of the vertical member 87c. The vertical member 87c is longer than the vertical member 87d. The vertical member 87c has a channel sectional area larger than that of the vertical member 87d.

A relationship between the lengths and the channel sectional areas of the vertical members 87e to 87h, respectively, is equal to a relationship between the lengths and the channel sectional areas of the vertical members 87a to 87d, respectively.

When any distinction is made among the vertical members 87a to 87h, they are referred to as the "vertical member 87". The longer the vertical member 87 is, the larger channel sectional area the vertical member 87 has.

Reference is made to FIG. 6. The exhaust channels 85a to 85h include downstream members 88a to 88h, respectively. The downstream members 88a to 88h are disposed externally of the treatment section 37 (e.g., below the treatment section 37). The downstream member 88a is connected to the vertical member 87a. Specifically, the downstream member 88a is connected to the lower end of the vertical member 87a. Likewise, the downstream members 88b to 88h are connected to the vertical members 87b to 87h.

The downstream members 88a to 88h are connected to the gas treatment equipment 8 (see FIG. 1). The gas treatment equipment 8 is disposed externally of the treatment section 37.

The substrate treating apparatus 1 further includes dampers 89a to 89h. The damper 89a is provided on the exhaust channel 85a. The damper 89a regulates a flow rate of gases that flow in the exhaust channel 85a. Likewise, the dampers 89b to 89h are provided on the exhaust channels 85b to 85h, respectively. The dampers 89b to 89h regulate flow rates of gases that flow in the exhaust channels 85b to 85h, respectively.

The dampers 89a to 89h are provided in the vertical members 87a to 87h, respectively. The dampers 89a to 89d are disposed at positions lower in level than positions of the liquid treatment chambers 42a to 42d, respectively. The dampers 89a to 89d are disposed in the treatment block BA. The dampers 89e to 89h are disposed at positions lower in level than positions of the liquid treatment chambers 42e to 42h, respectively. The dampers 89e to 89h are disposed in the treatment block BB.

When no distinction is particularly made among the exhaust channel 85a to 85h, they are referred to as the "exhaust channel 85".

Any two of the liquid treatment chambers 42a to 42d are one example of the first liquid treatment chamber 2a and the second liquid treatment chamber 2b (see FIG. 1). Any two of the exhaust channels 85a to 85d are one example of the first exhaust channel 6a and the second exhaust channel 6b. Any two of the vertical members 87a to 87d are one example of the first vertical member 7a and the second vertical member 7b.

Likewise, any two of the liquid treatment chambers 42e to 42h are one example of the first liquid treatment chamber 2a and the second liquid treatment chamber 2b. Any two of the exhaust channels 85e to 85h are one example of the first exhaust channel 6a and the second exhaust channel 6b. Any two of the vertical members 87e to 87h are one example of the first vertical member 7a and the second vertical member 7b.

<Structure of Exhaust Channel for Transport Chamber>

Reference is made to FIGS. 4 and 5. The substrate treating apparatus 1 includes suction units 91a to 91d. The suction unit 91a sucks gases within the transport chamber 44a. The suction unit 91a is provided in the transport chamber 44a. The suction unit 91a is provided below the main transport mechanism T1. The suction unit 91a has a dimension substantially equal to that of the transport chamber 44a in plan view. Likewise, the suction units 91b to 91d suck gases within the transport chambers 44b to 44d, respectively. The suction units 91b to 91d are provided in the transport chambers 44b to 44d, respectively.

The suction units 91a to 91d each include suction bores (not shown). The suction bores are formed in the top face of the suction units 91a to 91d, respectively. The suction units 91a to 91d suck gases thereabove through the suction bores.

Reference is made to FIG. 5. The substrate treating apparatus 1 further includes exhaust channels 92a to 92h. The exhaust channels 92a, 92b exhaust gases of the transport chamber 44a. More specifically, the exhaust channels 92a, 92b exhaust gases of the transport chamber 44a without exhausting gases of the transport chambers 44b to 44d. The exhaust channels 92a, 92b are in communication with the transport chamber 44a. The exhaust channels 92a, 92b are connected to the suction unit 91a. Likewise, the exhaust channels 92c 92d exhaust gases of the transport chamber 44b. The exhaust channels 92e, 92f exhaust gases of the transport chamber 44c. The exhaust channels 92g, 92h exhaust gases of the transport chamber 44d. Now, FIG. 5 illustrates the exhaust channels 92a to 92h at different positions from those in FIGS. 2 and 3 for convenience.

The exhaust channels 92a to 92d have substantially the same structure as the exhaust channels 92e to 92h. The following describes the structure of the exhaust channels 92a to 92d.

Figure 14:
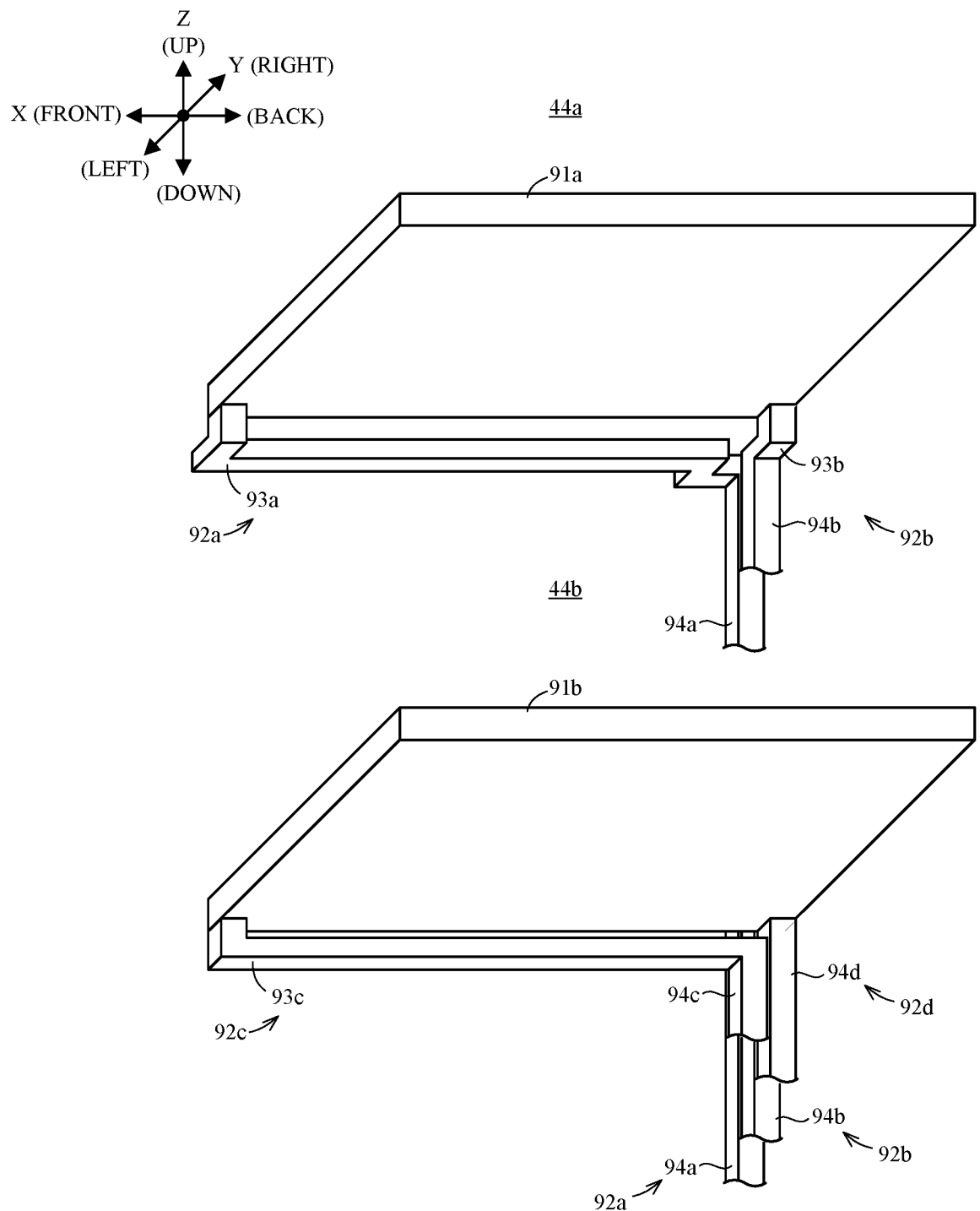
FIG. 14 is a perspective view of a suction unit and an exhaust channel seen from the bottom.

Reference is made to FIG. 14. FIG. 14 is a perspective view of the suction units 91a, 91b and the exhaust channels 92a to 92d seen from the bottom. The exhaust channels 92a, 92b include horizontal members 93a, 93b, respectively. The horizontal members 93a, 93b are connected to the suction unit 91a.

The horizontal members 93a, 93b are disposed in the treatment block BA. The horizontal members 93a, 93b are disposed at the same positions in level as a position of the suction unit 91a. The horizontal members 93a, 93b each extend substantially horizontally.

The horizontal members 93a, 93b each include a first end. The first ends of the horizontal members 93a, 93b are connected to the suction unit 91a. Specifically, the horizontal member 93a is connected to a front portion of the suction unit 91a, and the horizontal member 93b is connected to a rear portion of the suction unit 91a. More specifically, the horizontal members 93a, 93b are connected to a lateral side of the suction unit 91a adjacent to the heat treatment chambers 45a to 45e, 45k to 45m, 45q to 45s. The lateral side of the suction unit 91a adjacent to the heat treatment chambers 45a to 45e, 45k to 45m, 45q to 45s is a left portion of the suction unit 91a, for example. Consequently, the horizontal member 93a is connected to the left front portion of the suction unit 91a. The horizontal member 93b is connected to a left rear portion of the suction unit 91a.

The horizontal member 93a extends backwardly from the first end of the horizontal member 93a. The horizontal member 93b extends leftward from the first end of the horizontal member 93b. The horizontal members 93a, 93b each include a second end. The second ends of the horizontal members 93a, 93b are disposed externally of the transport chambers 44a, 44b. Specifically, the second ends of the horizontal members 93a, 93b are disposed adjacent to the left rear portion of the suction unit 91a.

The exhaust channels 92a, 92b include vertical members 94a, 94b, respectively. The vertical members 94a, 94b are connected to the horizontal members 93a, 93b, respectively.

The vertical members 94a, 94b are disposed in the treatment block BA. The vertical members 94a, 94b are provided externally of the transport chambers 44a, 44b, respectively. The vertical members 94a, 94b are provided leftward of the transport chambers 44a, 44b, respectively. The vertical members 94a, 94b are provided at a position adjacent to the left rear portion of the transport chambers 44a, 44b, respectively. The vertical members 94a, 94b are arranged in the width direction Y. The vertical members 94a, 94b are arranged adjacent to each other. The vertical members 94a, 94b extend in the substantially vertical direction Z.

The vertical members 94a, 94b each include an upper end. The upper ends of the vertical member 94a, 94b are disposed at the same positions in level as that of the suction unit 91a. The upper end of the vertical member 94a is connected to the second end of the horizontal member 93a. The upper end of the vertical member 94b is connected to the second end of the horizontal member 93b. The vertical members 94a, 94b extends downwardly from the horizontal members 93a, 93b, respectively.

The exhaust channel 92c includes a horizontal member 93c. The horizontal member 93c is connected to the suction unit 91b.

The horizontal member 93c is disposed in the treatment block BA. The horizontal member 93c is disposed at the same position in level as that of the suction unit 91b. The horizontal member 93c extends substantially horizontally.

The horizontal member 93c includes a first end. The first end of the horizontal member 93c is connected to the suction unit 91b. Specifically, the horizontal member 93b is connected to a front portion of the suction unit 91b. More specifically, the horizontal member 93c is connected to a lateral side of the suction unit 91b adjacent to the heat treatment chambers 45f to 45j, 45n to 45p, 45t to 45v. The lateral side of the suction unit 91b adjacent to the heat treatment chambers 45f to 45j, 45n to 45p, 45t to 45v is a left portion of the suction unit 91b, for example. Consequently, the horizontal member 93c is connected to a left front portion of the suction unit 91b.

The horizontal member 93c extends backwardly from the first end of the horizontal member 93c. The horizontal member 93c includes a second end. Specifically, the second end of the horizontal member 93c is disposed below the left rear portion of the suction unit 91b.

The exhaust channels 92c, 92d, include vertical members 94c, 94d, respectively. The vertical member 94c is connected to the horizontal member 93c. The vertical member 94d is directly connected to the suction unit 91b.

The vertical members 94c, 94d are disposed in the treatment block BA. The vertical members 94c, 94d are provided externally of the transport chambers 44a, 44b, respectively. The vertical members 94c, 94d are provided below the transport chamber 44b. The vertical members 94c, 94d are provided below the left rear portion of the suction unit 91b. The vertical members 94c, 94d are arranged in line in the forward/backward direction X. The vertical members 94c, 94d are arranged adjacent to each other. Moreover, the vertical member 94d is arranged in line with the vertical members 94a, 94b in the width direction Y. The vertical members 94a, 94b, 94d are arranged adjacent to each other. The vertical members 94c, 94d extend in the substantially vertical direction Z.

The vertical members 94c, 94d each include an upper end. The upper ends of the vertical member 94c, 94d are disposed at the same positions in level as that of the suction unit 91b. The upper end of the vertical member 94c is connected to the second end of the horizontal member 93c. The vertical member 94c extends downwardly from the horizontal member 93c. The upper end of the vertical member 94d is connected to the suction unit 91b. Specifically, the vertical member 94d is connected to a rear portion of the suction unit 91b. More specifically, the vertical member 94d is connected to a lateral side of the suction unit 91b adjacent to the heat treatment chambers 45f to 45j, 45n to 45p, 45t to 45v. Consequently, the vertical member 94d is connected to a left rear portion of the suction unit 91b. The vertical member 94d extends downwardly from the suction unit 91b.

Reference is made to FIG. 5. The exhaust channels 92e to 92h have substantially the same structure as the exhaust channels 92a to 92d. Specifically, the exhaust channels 92e to 92h include vertical members 94e to 94h, respectively.

Reference is made to FIGS. 5 and 9. The vertical members 94a to 94d both extend to a position lower in level than the transport chamber 44b. Likewise, the vertical members 94e to 94h both extend to a position lower in level than the transport chamber 44d.

The vertical members 94a to 94h each include a lower end. The lower ends of the vertical members 94a to 94d are disposed at a position lower in level than the transport chambers 44a, 44b, respectively. The lower ends of the vertical members 94e to 94h are disposed at a position lower in level than the transport chambers 44c, 44d, respectively.

The lower ends of the vertical members 94a to 94d are disposed at substantially the same positions in level as one another. The lower ends of the vertical members 94e to 94h are disposed at substantially the same positions in level as one another.

The vertical member 94a is longer than the vertical members 94c, 94d. The vertical member 94a has a channel sectional area larger than that of the vertical members 94c, 94d. The vertical member 94b is longer than the vertical members 94c, 94d. The vertical member 94b has a channel sectional area larger than that of the vertical members 94c, 94d.

A relationship between the lengths and the channel sectional areas of the vertical members 94e to 94h, respectively, is equal to a relationship between the lengths and the channel sectional areas of the vertical members 94a to 94d, respectively.

When any distinction is made among the vertical members 94a to 94h, they are referred to as the "vertical member 94". The longer the vertical member 94 is, the larger channel sectional area the vertical member 94 has.

Reference is made to FIG. 9. The exhaust channels 92a to 92d include downstream members 95a to 95d, respectively. The downstream member 95a is connected to the vertical member 94a. Specifically, the downstream member 95a is connected to the lower end of the vertical member 94a. Likewise, the downstream members 95b to 95d are connected to the vertical members 94b to 94d. The downstream members 95a to 95d are disposed in the treatment block BA. The downstream members 95a to 95d are disposed at a position lower in level than the transport chamber 44b.

The substrate treating apparatus 1 further includes a collecting duct 96. The collecting duct 96 is connected to the downstream members 95a to 95d. Specifically, the collecting duct 96 is connected to downstream ends of the downstream members 95a to 95d. The collecting duct 96 collects gases that flow in the downstream members 95a to 95d. In other words, the collecting duct 96 collects gases from the downstream members 95a to 95d. The downstream ends of the downstream member 95a to 95d correspond to the downstream ends of the exhaust channels 92a to 92d.

The collecting duct 96 is connected to the gas treatment equipment 18 (see FIG. 1). The gas treatment equipment 18 is disposed externally of the treatment section 37. The collecting duct 96 extends from the inside of the treatment block BA to the outside of the treatment section 37. The collecting duct 96 penetrates the block casing 41A (e.g., a bottom board of the block casing 41A).

Reference is made to FIGS. 5 and 9. The substrate treating apparatus 1 further includes fans 97a to 97h. The fan 97a is provided on the exhaust channel 92a. The fan 97a blows gases to the downstream of the exhaust channel 92a. In other words, the fan 97a blows gases toward the gas treatment equipment 18. Moreover, the fan 97a regulates a flow rate of gases that flow in the exhaust channel 92a. Likewise, the fans 97b to 97h are provided on the exhaust channels 97b to 97h.

The fans 97a to 97h are provided in the downstream members 95a to 95h. The fans 97a to 97d are disposed at a position lower in level than the transport chambers 44a to 44b. The fans 97e to 97h are disposed at a position lower in level than the transport chambers 44c to 44d.

When no distinction is particularly made among the suction units 91a to 91d, they are referred to as the "suction unit 91". When no distinction is particularly made among the exhaust channels 92a to 92h, they are referred to as the "exhaust channel 92". When no distinction is particularly made among the fans 97a to 97h, they are referred to as the "fan 97".

The transport chambers 44a, 44b are one example of the first transport chamber 12a and the second transport chamber 12b. The suction units 91a, 92b are one example of the first blowing unit and the second blowing unit in the present invention. Either the exhaust channel 92a or 92b is one example of the first exhaust channel 16a. Specifically, the exhaust channels 92a, 92b are one example of the first exhaust channel and the third exhaust channel in the present invention. Either the exhaust channel 92c or 92d is one example of the second exhaust channel 16b. More specifically, the exhaust channels 92c, 92d are one example of the second exhaust channel and the fourth exhaust channel in the present invention. Either the vertical member 94a or 94b is one example of the first vertical member 17a. More specifically, the vertical member 94a, 94b are one example of the first vertical member and the third vertical member in the present invention. Either the vertical member 94c or 94d is one example of the second vertical member 17b. More specifically, the vertical members 94c, 94d are one example of the second vertical member and the fourth vertical member in the present invention.

Likewise, the transport chambers 44c, 44d are one example of the first transport chamber 12a and the second transport chamber 12b. The suction units 91c, 92d are one example of the first blowing unit and the second blowing unit in the present invention. Either the exhaust channel 92e or 92f is one example of the first exhaust channel 16a. More specifically, the exhaust channels 92e, 92f are one example of the first exhaust channel and the third exhaust channel in the present invention. Either the exhaust channel 92g or 92h is one example of the second exhaust channel 16b. More specifically, the exhaust channels 92g, 92h are one example of the second exhaust channel and the fourth exhaust channel in the present invention. Either the vertical member 94e or 94f is one example of the first vertical member 17a. More specifically, the vertical members 94e, 94f are one example of the first vertical member and the third vertical member in the present invention. Either the vertical member 94g or 94h is one example of the second vertical member 17b. More specifically, the vertical members 94g, 94h are one example of the second vertical member and the fourth vertical member in the present invention.

<Structure of Exhaust Channel for Heat Treatment Chamber>

Reference is made to FIG. 7. The substrate treating apparatus 1 further includes exhaust channels 101a to 101l. The exhaust channel 101a exhausts gases of the heat treatment chambers 45a to 45e. The exhaust channel 101a exhausts gases of the heat treatment chambers 45a to 45e without exhausting gases of the heat treatment chambers 45f to 45v, 46a to 46t. The exhaust channel 101a is in communication with the heat treatment chambers 45a to 45e. Likewise, the exhaust channel 101b exhausts gases of the heat treatment chambers 45f to 45j. The exhaust channel 101c exhausts gases of the heat treatment chambers 45k to 45m. The exhaust channel 101d exhausts gases of the heat treatment chambers 45n to 45p. The exhaust channel 101e exhausts gases of the heat treatment chambers 45q to 45s. The exhaust channel 101f exhausts gases of the heat treatment chambers 45t to 45v. The exhaust channel 101g exhausts gases of the heat treatment chambers 46a to 46e. The exhaust channel 101h exhausts gases of the heat treatment chambers 46f to 46j. The exhaust channel 101i exhausts gases of the heat treatment chamber 46k. The exhaust channel 101j exhausts gases of the heat treatment chamber 46l. The exhaust channel 101k exhausts gases of the heat treatment chambers 46m to 46p. The exhaust channel 101l exhausts gases of the heat treatment chambers 46q to 46t.

The exhaust channel 101a has substantially the same structure as the exhaust channels 101c, 101e, 101g, 101i, 101k. The exhaust channel 101b has substantially the same structure as the exhaust channels 101d, 101f, 101h, 101j, 101l. The following describes the structure of the exhaust channels 101a, 101b.

Reference is made to FIG. 8. The exhaust channel 101a includes horizontal members 102a to 102e. The exhaust channel 101b includes horizontal members 102f to 102j. The horizontal member 102a is connected to the heat treatment chamber 45a. Likewise, the horizontal members 102b to 102j are connected to the heat treatment chambers 45b to 45j, respectively.

The horizontal members 102a to 102j are disposed in the treatment block BA. The horizontal member 102a is disposed at the same position in level as that of the heat treatment chamber 45a. Likewise, the horizontal members 102b to 102j are disposed at the same positions in level as positions of the heat treatment chambers 45b to 45j, respectively.

The horizontal members 102a to 102j extend substantially horizontally (specifically, in the width direction Y). The horizontal members 102a to 102j penetrate the unit casing 47A. The horizontal member 102a penetrates the unit casing 47A at substantially the same position in plan view as that where the horizontal members 102b to 102j penetrate the unit casing 47A.

The horizontal members 102a to 102j each include a first end. The first end of the horizontal member 102a is disposed in the heat treatment chamber 45a. Likewise, the first ends of the horizontal member 102b to 102j are disposed in the heat treatment chambers 45b to 45j.

The horizontal members 102a to 102j each include a second end. The second ends of the horizontal members 102a to 102j are disposed externally of the unit casing 47A. The second end of the horizontal member 102a is disposed laterally (specifically, leftward) of the heat treatment chamber 45a. Likewise, the second ends of the horizontal members 102b to 102j are disposed laterally (specifically, leftward) of the heat treatment chambers 45b to 45j, respectively.

The exhaust channels 101a, 101b include vertical members 103a, 103b, respectively. The vertical member 103a is connected to the horizontal members 102a to 102e. The vertical member 103b is connected to the horizontal members 102f to 102j.

The vertical members 103a, 103b are disposed in the treatment block BA. The vertical members 103a, 103b are disposed laterally (specifically, leftward) of the unit casing 47A. The vertical members 103a, 103b extend in the substantially vertical direction Z.

The vertical members 103a, 103b each include an upper end.

The upper end of the vertical member 103a is disposed at the same position in level as the heat treatment chamber 45a. The vertical member 103a is connected to the second ends of the horizontal members 102a to 102e. The upper end of the vertical member 103b is disposed at the same position in level as the heat treatment chamber 45f. The vertical member 103b is connected to the second ends of the horizontal members 102f to 102j.

The vertical member 103a extends downwardly from the horizontal members 102a to 102e. Likewise, the vertical member 103b extends downwardly from the horizontal members 102f to 102j.

Reference is made to FIG. 7. More strictly, the vertical member 103a includes a curved portion that curves in the substantially forward/backward direction X (e.g., to forward). The curved portion is formed at a position lower than the horizontal member 102e and higher than the horizontal member 102f. Accordingly, no interference occurs among the vertical members 103a, 103b. For instance, the vertical members 103a, 103b are arranged in the forward/backward direction X.

The vertical members 103a, 103b both extend to a position lower in level than the heat treatment chamber 45j.

Reference is made to FIG. 8. The vertical members 103a, 103b each include a lower end. The lower ends of the vertical members 103a, 103b are disposed at a position lower in level than the heat treatment chambers 45a to 45j, respectively.

The lower ends of the vertical members 103a, 103b are disposed at substantially the same positions in level as each other.

The vertical member 103a is longer than the vertical member 103b. The vertical member 103a has a channel sectional area larger than that of the vertical member 103b.

When any distinction is made among the vertical members 103a to 103l, they are referred to as the "vertical member 103". The longer the vertical member 103 is, the larger channel sectional area the vertical member 103 has.

The exhaust channels 101a, 101b include downstream members 104a, 104b, respectively. The downstream member 104a is connected to the vertical member 103a. Specifically, the downstream member 104a is connected to the lower end of the vertical member 103a. Likewise, the downstream member 104b is connected to the vertical member 103b.

The downstream members 104a, 104b are connected to the gas treatment equipment 28 (see FIG. 1). The gas treatment equipment 28 is disposed externally of the treatment section 37. The downstream members 104a, 104b extend from the inside of the treatment block BA to the outside of the treatment section 37. The downstream members 104a, 104b penetrate the block casing 41A (e.g., a bottom board of the block casing 41A).

The substrate treating apparatus 1 further includes dampers 105a to 105j. The dampers 105a to 105e are provided on the exhaust channel 101a. The dampers 105a to 105e entirely regulate a flow rate of gases that flow in the exhaust channel 101a. The dampers 105f to 105j are provided on the exhaust channel 101b. The dampers 105f to 105j entirely regulate a flow rate of gases that flow in the exhaust channel 101b.

The damper 105a is disposed upstream of the vertical member 103a. Specifically, the damper 105a is provided in the horizontal member 102a. The damper 105a regulates a flow rate of gases that flow in the horizontal member 102a. Likewise, the dampers 105b to 105e are disposed upstream of the vertical member 103a. The dampers 105f to 105j are disposed upstream of the vertical member 103b. Specifically, the dampers 105b to 105j are provided in the horizontal members 102b to 102j, respectively. The dampers 105b to 105j regulate a flow rate of gases that flow in the horizontal members 102b to 102j, respectively.

The substrate treating apparatus 1 includes dampers 105a to 105e that are provided on the exhaust channels 101c, 101e, 101g, 101i, 101k in the same manner as the exhaust channel 101a. The substrate treating apparatus 1 includes dampers 105f to 105j that are provided on the exhaust channels 101d, 101f, 101h, 101j, 101l in the same manner as the exhaust channel 101b.

When no distinction particularly is made among the exhaust channels 101a to 101l, they are referred to as the "exhaust channel 101".

Any one of the heat treatment chambers 45a to 45e is one example of the first heat treatment chamber 22a. Any one of the heat treatment chambers 45f to 45j is one example of the second heat treatment chamber 22b. The exhaust channels 101a, 101b are one example of the first exhaust channel 26a and the second exhaust channel 26b. The vertical members 103a, 103b are one example of the first vertical member 27a and the second vertical member 27b.

Likewise, the heat treatment chambers 45k to 45m, 45q to 45s, 46a to 46e, 46k, 46m to 46p are one example of the first heat treatment chamber 22a. The heat treatment chambers 45n to 45p, 45t to 45v, 46f to 46j, 46l, 46q to 46t are one example of the second heat treatment chamber 22b. The exhaust channels 101c, 101e, 101g, 101i, 101k are one example of the first exhaust channel 26a. The exhaust channels 101d, 101f, 101h, 101j, 101l are one example of the second exhaust channel 26b. The vertical members 103a, 103b are one example of the first vertical member 27a and the second vertical member 27b.

<Interface 39>

Reference is made to FIGS. 2 and 3. The interface 39 includes an interface transport mechanism TIF. In the present embodiment, the interface transport mechanism TIF includes two transport mechanisms TIFa, TIFb. The transport mechanisms TIFa, TIFb each transport the substrate W.

Reference is made to FIGS. 4 and 5. The interface 39 includes mount tables P7, P8, and a buffer BF. The mount tables P7, P8 and the buffer BF are disposed between the transport mechanism TIFa and the transport mechanism TIFb. The mount table P7 receives the substrate W and cools the substrate W. The mount table P8 simply receives the substrate W. The buffer BF is capable of having a plurality of substrates W placed thereon.

The transport mechanisms TIFa, TIFb each access the mount tables P7, P8, and the buffer BF. The transport mechanisms TIFa, TIFb transport the substrate W via the mount tables P7, P8 mutually.

The transport mechanism TIFa is further capable accessing the mount tables P5, P6 and post exposure bake unit PEB of the treatment block BB. The transport mechanism TIFa and the main transport mechanism T3 transport the substrate W via the mount table P5 mutually. The transport mechanism TIFa and the main transport mechanism T4 transport the substrate W via the mount table P6 mutually. The transport mechanism TIFa transports the substrate W to the post exposure bake unit PEB.

The transport mechanism TIFb further transports the substrate W to the exposing machine EXP.

Reference is made to FIGS. 2 and 3. The transport mechanisms TIFa, TIFb each include two hands 107 that hold the substrate W, and a hand drive mechanism 108 that drives the hands 107. The hands 107 each hold one substrate W. The hand drive mechanism 108 causes the hands 107 to move in the forward/backward direction X, the width direction Y, and the vertical direction Z, and causes the hands 107 to rotate around the vertical direction Z. This causes the hands 107 to access the mount tables P5, P6, and the like.

<Structure of Control System>

Figure 15:
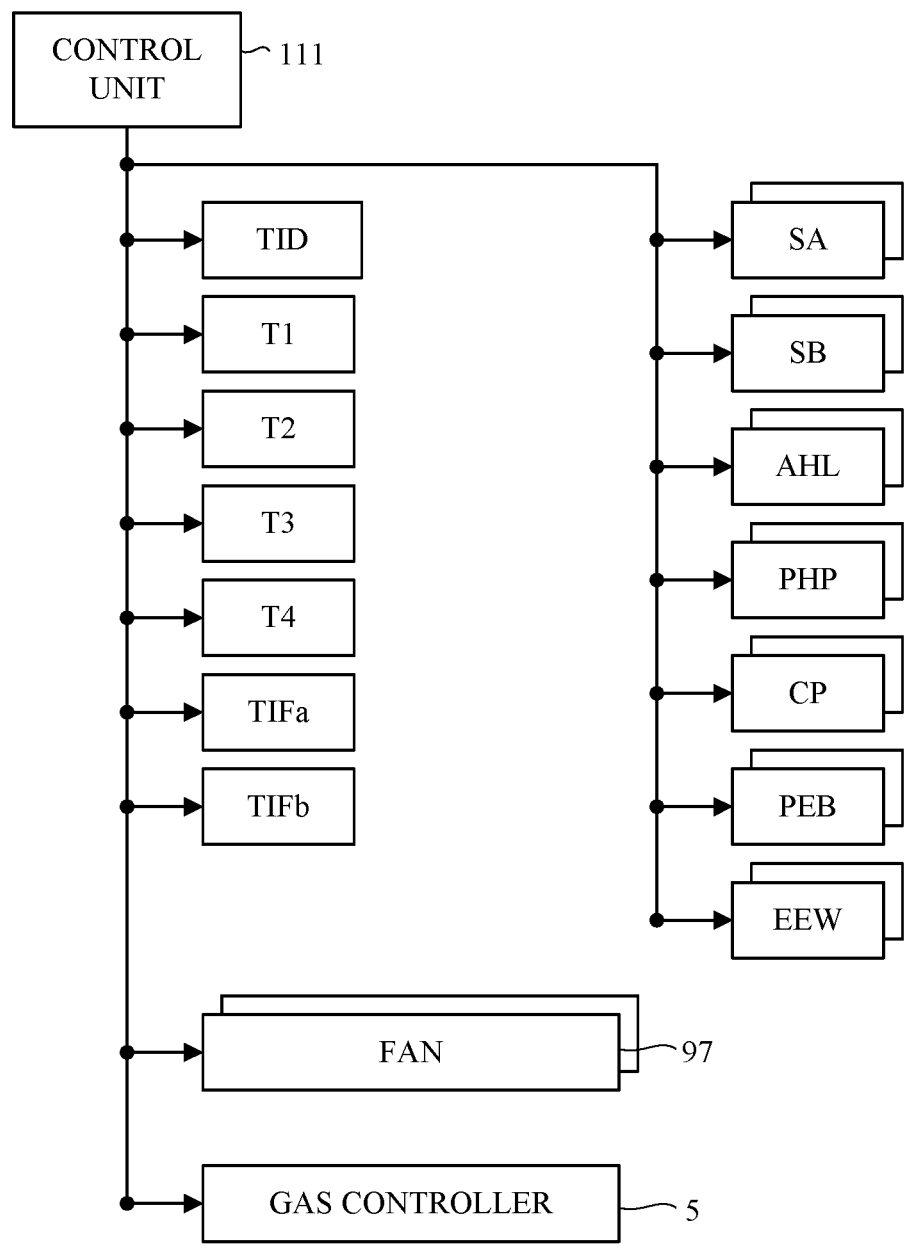
FIG. 15 is a control block diagram of the substrate treating apparatus.

Reference is made to FIG. 15. FIG. 15 is a control block diagram of the substrate treating apparatus 1. The substrate treating apparatus 1 further includes a control unit 111.

The control unit 111 is disposed in the indexer 31, for example.

The control unit 111 controls en bloc the substrate treating apparatus 1. Specifically, the control unit 111 performs control of operation of the following elements: the transport mechanisms TID, T1 to T4, TIFa, TIFb, the liquid treatment units SA, SB, the heat treatment unit HU, the edge exposing unit EEW, the gas controller 5, and the fan 97. The heat treatment unit HU corresponds to the hydrophobic treatment unit AHL, the cooling unit CP, the heating and cooling unit PHP, and the post exposure bake unit PEB.

Moreover, the control unit 111 may perform control of at least any of the following elements: dampers 75a to 75h, 84a to 84d, 89a to 89h, 105a to 105j. Alternatively, the user may perform manual operation of at least any of the dampers 75a to 75h, 84a to 84d, 89a to 89h, 105a to 105j without using the control unit 111.

The control unit 111 is implemented by a central processing unit (CPU) that performs various processes, a RAM (Random-Access Memory) as a workspace of arithmetic processing, and a storage medium such as a fixed disk. The storage medium stores various types of information such as treatment recipes for treating the substrate W (treatment programs) and information about identification of the substrates W.

<Operational Example of Transporting and Treating Substrate W>

The substrate W moves between the indexer 31 and the exposing machine EXP in a reciprocating manner. An interval from the indexer 31 to the exposing machine EXP is referred to as a "forward path". An interval from the exposing machine EXP to the indexer 31 is referred to as a "return path".

The following describes operation on the forward path. In the indexer 31, the indexer transport mechanism TID delivers the substrate W from the carrier C to the mount tables P1, P2.

In the treatment block BA, the main transport mechanism T1 receives the substrate W on the mount table P1, and transports the substrate W to the liquid treatment chambers 42a, 42b, and the heat treatment chambers 45a to 45e, 45k to 45m, 45q to 45s. Likewise, the main transport mechanism T2 receives the substrate W on the mount table P2, and transports the substrate W to the liquid treatment chambers 42c, 42d, and the heat treatment chambers 45f to 45j, 45n to 45p, 45t to 45v.

The liquid treatment unit SA performs coating treatment to the substrate W. The heat treatment unit HU disposed in the treatment block BA performs the heat treatment to the substrate W. This achieves formation of the antireflection film and the resist film on the substrate W.

The order of the treatment units to which the substrate W is transported is, for example, as under: the hydrophobic treatment unit AHL, the cooling unit CP, the antireflection film coating unit BARC, the heating and cooling unit PHP, the cooling unit CP, the resist film coating unit RESIST, the heating and cooling unit PHP, and the cooling unit CP.

Thereafter, the main transport mechanism T1 transports the substrate W to the mount table P3. The main transport mechanism T2 transports the substrate W to the mount table P4.

In the treatment block BB, the main transport mechanism T3 transports the substrate W from the mount table P3 to the edge exposing unit EEWa. The edge exposing units EEWa expose a peripheral edge of the substrate W. Thereafter, the main transport mechanism T3 transports the substrate W from the edge exposing unit EEWa to the mount table P5. Likewise, the main transport mechanism T4 transports the substrate W from the mount table P4 to the edge exposing unit EEWb, and transports the substrate W from the edge exposing unit EEWb to the mount table P6.

In the interface 39, the transport mechanism TIFa transports the substrate W from the mount tables P5, P6 to the mount table P7. The transport mechanism TIFb transports the substrate W from the mount table P7 to the exposing machine EXP. The exposing machine EXP performs exposure treatment to the substrate W.

The following describes operation on the return path. The transport mechanism TIFb transports the substrate W from the exposing machine EXP to the mount table P8. The transport mechanism TIFa transports the substrate W from the mount table P8 to the heat treatment chambers 46m to 46t. The post exposure bake unit PEB performs post exposure bake treatment to the substrate W. The transport mechanism TIFa transports the substrate W subjected to the post exposure bake treatment from the heat treatment chambers 46m to 46t to the mount tables P5, P6.

In the treatment block BB, the main transport mechanism T3 receives the substrate W on the mount table P5, and transports the substrate W to the liquid treatment chambers 42e, 42f, and the heat treatment chambers 46a to 46e, 46k. Likewise, the main transport mechanism T4 receives the substrate W on the mount table P6, and transports the substrate W to the liquid treatment chambers 42g, 42h, and the heat treatment chambers 46f to 46j, 46l.

The liquid treatment unit SB performs the developing treatment to the substrate W. The heat treatment unit HU disposed in the treatment block BB performs the heat treatment to the substrate W. This obtains the substrate W subjected to the developing treatment.

The order of the treatment units to which the substrate W is transported is, for example, as under: the cooling unit CP, the developing treatment unit DEV, the heating and cooling unit PHP, the cooling unit CP.

Thereafter, the main transport mechanism T3 transports the substrate W to the mount table P3. The main transport mechanism T4 transports the substrate W to the mount table P4.

In the treatment block BA, the main transport mechanism T1 transports the substrate W from the mount table P3 to the mount table P1. The main transport mechanism T2 transports the substrate W from the mount table P4 to the mount table 2.

The indexer transport mechanism TID delivers the substrate W from the mount tables P1, P2 to the carrier C.

<Operational Example of Feeding and Exhausting Gases to Liquid Treatment Chamber 42, Transport Chamber 44, Heat Treatment Chamber 45, 46>

The gas controller 5 controls a temperature and humidity of gases, and feed the gases with the regulated temperature and humidity to the distributing pipes 76a, 76b. Specifically, gases flows from the main pipe 77c to the branched part 77d in the distributing pipe 76a. A part of the gases flows from the branched part 77d to the connector 77a via the branch pipe 77e, and the other part of the gases flows from the branched part 77d to the connector 77b via the branch pipe 77f. The gases flows in the same manner as above in the distributing pipe 76b.

The distributing pipe 76a supplies gases into the feed channels 66a to 66d. Specifically, the connector 77a of the distributing pipe 76a distributes the gases to the vertical members 68a to 68d. Likewise, the distributing pipe 76b supplies gases into the feed channels 66e to 66h.

The feed channels 66a to 66h supply gases into the liquid treatment chambers 42a to 42h. The dampers 75a to 75h regulate a flow rate of gases that flow in the feed channel 66a to 66h, respectively. Specifically, gases flows from the vertical member 68a to the horizontal member 67a, and from the horizontal member 67a to the blowing unit 65a in the feed channel 66a. Then, the blowing unit 65a blows gases into the liquid treatment chamber 42a. The gases flow in the same manner as above in the feed channels 66b to 66h.

This achieves supply of the gases with the controlled temperature and humidity to the liquid treatment chambers 42a to 42h.

The distributing pipe 76a supplies gases into the feed channels 82a, 82b. Specifically, the connector 77b of the distributing pipe 76a distributes the gases to the vertical members 83a, 83b. Likewise, the distributing pipe 76b supplies gases into the feed channels 82c, 82d.

The feed channels 82a to 82d supply gases to the transport chambers 44a to 44d, respectively. The dampers 84a to 84d regulate a flow rate of gases that flow in the feed channels 82a to 82d, respectively. Specifically, gases flows from the vertical member 83a to the blowing unit 81a in the feed channel 82a. Then, the blowing unit 81a blows gases into the transport chamber 44a. The gases flow in the same manner as above in the feed channels 82b to 82d.

This achieves supply of the gases with the controlled temperature and humidity to the transport chambers 44a to 44d.

The gas treatment equipment 8 sucks gases. Accordingly, the exhaust channels 85a to 85h exhaust gases of the liquid treatment chambers 42a to 42h. The dampers 89a to 89h regulate flow rates of gases that flow in the exhaust channels 85a to 85h, respectively. Specifically, the gases flow from the cups 52A provided in the liquid treatment chamber 42a to the horizontal member 86a in the exhaust channel 85a. The gases flow from the horizontal member 86a to the vertical member 87a, from the vertical member 87a to the downstream member 88a, and from the downstream member 88a to the gas treatment equipment 8. The gases flow in the same manner as above in the exhaust channels 85b to 85h.

The gas treatment equipment 8 treats the gases exhausted from the exhaust channels 85a to 85h.

The gas treatment equipment 18 sucks gases, and the fans 97a to 97h feed the gases to the downstream side. Accordingly, the exhaust channels 92a to 92h exhaust the gases of the transport chambers 44a to 44d. The fans 97a to 97h regulate flow rates of gases that flow in the exhaust channels 85a to 85h, respectively. Specifically, gases flows from the transport chamber 44a to the suction unit 91a in the exhaust channels 92a, 92b. A part of the gases flows from the suction unit 91a to the horizontal member 93a, and the other part of the gases flows from the suction unit 91a to the horizontal member 93b. One part of the gases further flows from the horizontal member 93a to the vertical member 94a, from the vertical member 94a to the downstream member 95a, and from the downstream member 95a to the collecting duct 96. The other part of the gases further flows from the horizontal member 93b to the vertical member 94b, from the vertical member 94b to the downstream member 95b, and from the downstream member 95b to the collecting duct 96. That is, the one part of the gases and the other part of the gases meet at the collecting duct 96. Furthermore, the gases flow from the collecting duct 96 to the gas treatment equipment 18. The gases flow in the same manner as above in the exhaust channels 92c to 92h.

The gas treatment equipment 18 treats the gases exhausted from the exhaust channels 92a to 92h.

The gas treatment equipment 28 sucks gases. Accordingly, the exhaust channels 101a to 101l exhaust gases of the heat treatment chambers 45a to 45v, 46a to 46t. The dampers 105a to 105j regulate flow rates of gases that flow in the exhaust channels 101a to 101l, respectively. Specifically, the gases flow from the heat treatment chamber 45a to the horizontal member 102a in the exhaust channel 101a. Likewise, the gases flow from the heat treatment chambers 45b to 45e to the horizontal members 102b to 102e, respectively. The gases flow from the horizontal members 102a to 102e to the vertical member 103a. That is, the gases that flow through the horizontal members 102a to 102e meet at the vertical member 103e. Moreover, the gases flow from vertical member 103a to the downstream member 104a, and from the downstream member 104a to the gas treatment equipment 28. The gases flow in the same manner as above in the exhaust channels 101b to 101l.

The gas treatment equipment 28 treats the gases exhausted from the exhaust channels 101a to 101l.

<Effect>

The present embodiment produces the following effects.

The feed channels 66a to 66d include vertical members 68a to 68d, respectively. Here, the liquid treatment chambers 42a to 42d are arranged in the substantially vertical direction Z. Accordingly, it is easily possible to combine the vertical members 68a to 68d into one pipe. When the vertical members 68a to 68d are replaced with one pipe, a simplified structure of the vertical members 68a to 68d are obtainable. Despite that, it is dared not to replace the feed channels 66a to 66d with one pipe in the present embodiment. In addition, the vertical members 68a to 68d both extend to a position lower in level than the liquid treatment chambers 42a to 42d. Consequently, the feed channels 66a to 66d are each relatively long. Consequently, this achieves suitable suppression in mutual influence among a supply amount of gases from the feed channel 66a to the liquid treatment chamber 42a, a supply amount of gases from the feed channel 66b to the liquid treatment chamber 42b, a supply amount of gases from the feed channel 66c to the liquid treatment chamber 42c, and a supply amount of gases from the feed channel 66d to the liquid treatment chamber 42d. For instance, it is possible to suitably suppress the variation of a supply amount of gases of the feed channel 66a depending on variation in supply amount of gases of at least any of the feed channels 66b to 66d. Consequently, this achieves suitable suppression in mutual influence between the supply amounts of gases to the liquid treatment chambers 42a to 42d.

Likewise, the feed channels 66e to 66h include vertical members 68e to 68h, respectively. The vertical members 68e to 68h each extend to a position lower in level than positions of the liquid treatment chambers 42e to 42h. Consequently, the feed channels 66e to 66h are relatively long. Consequently, this achieves suitable suppression in mutual influence between the supply amounts of gases to the liquid treatment chambers 42e to 42h.

The longer the vertical member 68 is, the larger channel sectional area the vertical member 68 has. This achieves suppressed difference in pressure loss of the vertical member 68. Consequently, the feed channels 66a to 66h are each capable of supplying gases suitably.

The dampers 75a to 75d are disposed downstream of the vertical members 68a to 68d, respectively. Accordingly, parts of the feed channels 66a to 66d disposed upstream of the dampers 75a to 75d include the vertical members 68a to 68d. Accordingly, parts of the feed channels 66a to 66d disposed upstream of the dampers 75a to 75d are relatively long. Consequently, this achieves suitable suppression in mutual influence between the supply amounts of gases of the feed channels 66a to 66d to the liquid treatment chambers 42a to 42d. Likewise, the dampers 75e to 75h are disposed downstream of the vertical members 68e to 68h. Consequently, this achieves more suitable suppression in mutual influence between the supply amounts of gases to the liquid treatment chambers 42e to 42h.

The distributing pipe 76a is connected to the feed channels 66a to 66d at a position lower than positions of the liquid treatment chambers 42a to 42d. Consequently, this achieves suitable connection between the feed channels 66a to 66d and the distributing pipe 76a although the feed channels 66a to 66d include the vertical members 68a to 68d, respectively. Likewise, the distributing pipe 76b is connected to the feed channels 66e to 66h at a position lower than the liquid treatment chambers 42e to 42h. Consequently, this achieves suitable connection between the feed channels 66e to 66h and the distributing pipe 76b although the feed channels 66e to 66h include the vertical members 68e to 68h, respectively.

The connector 77a of the distributing pipe 76a extends in the direction substantially equal to that where the upstream ends of the feed channel 66a to 66d extend. Accordingly, this achieves smooth flow of gases from the connector 77a of the distributing pipe 76a to the upstream ends of the feed channels 66a to 66d. In other words, the distributing pipe 76a is capable of supplying the gases to the feed channels 66a to 66d smoothly. Likewise, the connector 77a of the distributing pipe 67b extends in the direction substantially equal to that where the upstream ends of the feed channel 66e to 66h extend. Accordingly, this achieves smooth flow of gases from the connector 77a of the distributing pipe 76b to the upstream ends of the feed channels 66e to 66h.

The distributing pipe 76a is connected to the feed channels 82a, 82b, and supplies gases into the feed channels 82a, 82b. In such a manner, one distributing pipe 76a is capable of supplying gases not only into the feed channels 66a to 66d but also into the feed channels 82a, 82b. This achieves a simplified structure of the substrate treating apparatus 1. Likewise, the distributing pipe 76b is connected to the feed channels 82c, 82d, and supplies gases into the feed channels 82c, 82d. This achieves a more simplified structure of the substrate treating apparatus 1.

The distributing pipe 76a includes the branched part 77d. Accordingly, the connectors 77a, 77b are arrangeable at different positions. Consequently, the distributing pipe 76a is connectable to the feed channels 66a to 66d at appropriate positions and to the feed channels 82a, 82b at appropriate positions.

The branched part 77d includes the guiding part 77d2. Accordingly, the branched part 77d is capable of distributing gases into the branch pipes 77e, 77f smoothly.

The vertical members 68a to 68d are formed in the box 72 of the multi-tube unit 71a. The partition member 73 of the multi-tube unit 71a separates the vertical members 68a to 68d. This achieves a simplified structure of the vertical members 68a to 68d. Likewise, the vertical members 68e to 68h are formed in the box 72 of the multi-tube unit 71b. The partition member 73 of the multi-tube unit 71b separates the vertical members 68e to 68h. This achieves a simplified structure of the vertical members 68e to 68h.

The front wall 72a has the width La longer than the width Lb of the right wall 72c and the left wall 72d. Accordingly, this obtains a smaller thickness of the box 72 suitably. Accordingly, an installation space for the box 72 is easily obtainable with suppressed upsizing of the substrate treating apparatus 1.

The outlets 72g to 72j are disposed at substantially the same positions as one another in plan view. This achieves suitable prevention of a complicated structure of the feed channels 66a to 66d.

The top wall 72e is inclined upwardly from the rear wall 72b to the front wall 72a. Consequently, gases are capable of flowing from the vertical member 68a to the horizontal member 67a smoothly.

The block plate 73f is inclined upwardly from the vertical plate 73c to the front wall 72a. Consequently, gases are capable of flowing from the vertical member 68b to the horizontal member 67b smoothly. Likewise, the block plates 73e, 73d are inclined upwardly from the vertical plates 73b, 73a to the front wall 72a. Consequently, gases are capable of flowing from the vertical members 68c, 68d to the horizontal members 67c, 67d smoothly.

The substrate treating apparatus 1 includes a gas controller 5.

This achieves supply of the gases with the controlled temperature and humidity to the liquid treatment chambers 42a to 42h and the transport chambers 44a to 44d.

The feed channels 66a to 66d penetrate the unit casing 43A at substantially the same position in plan view. This achieves suitable prevention of a complicated structure of the feed channels 66a to 66d and the unit casing 43A. Likewise, the feed channels 66e to 66h penetrate the unit casing 43B at substantially the same position in plan view. This achieves suitable prevention of a complicated structure of the feed channels 66e to 66h and the unit casing 43B.

Although the transport chamber 44b is disposed below the transport chamber 44a, the feed channels 82a, 82b include vertical members 83a, 83b, respectively. The vertical members 83a, 83b both extend to a position lower in level than the transport chambers 44a, 44b. Accordingly, the feed channels 82a, 82b are relatively long.

Consequently, this achieves suitable suppression in mutual influence between the supply amount of gases of the feed channel 82a to the transport chamber 44a and the supply amount of gases of the feed channel 82b to the transport chamber 44b. Consequently, this achieves suitable suppression in mutual influence between the supply amounts of gases to the transport chamber 44a, 44b.

Likewise, the feed channels 82c, 82d include vertical members 83c, 83d, respectively. The vertical members 83c, 83d both extend to a position lower in level than the transport chambers 44c, 44d. Accordingly, the feed channels 82c, 82d are relatively long. Consequently, this achieves suitable suppression in mutual influence between the supply amounts of gases to the transport chamber 44c, 44d.

The vertical member 83a is longer than the vertical member 83b, and has a channel sectional area larger than that of the vertical member 83b. Consequently, this achieves suppression of excessive increase in pressure loss of the vertical member 83a relative to pressure loss of the vertical member 83b. Consequently, not only the vertical member 83b but also the vertical member 83a is capable of supplying gases suitably. Likewise, the vertical member 83c is longer than the vertical member 83d, and has a channel sectional area larger than that of the vertical member 83d. Consequently, this achieves suppression of excessive increase in pressure loss of the vertical member 83c relative to pressure loss of the vertical member 83d. Consequently, not only the vertical member 83d but also the vertical member 83c is capable of supplying gases suitably.

The vertical member 83a is connected to a lateral side of the blowing unit 81a adjacent to the liquid treatment chambers 42a, 42b. In other words, the vertical member 83a is connected to a lateral side of the blowing unit 81a away from the heat treatment chambers 45a to 45v. Moreover, the vertical member 83a passes on the lateral side of the transport chamber 44a adjacent to the liquid treatment chambers 42a, 42b. In other words, the vertical member 83a passes through a lateral side of the transport chamber 44a away from the heat treatment chambers 45a to 45v. This achieves suitable prevention of thermal influences on the feed channel 82a from the heat treatment chambers 45a to 45v. This is similarly applicable to the vertical members 83b to 83d.

The dampers 84a, 84b are disposed at positions lower in level than positions of the transport chambers 44a, 44b. Accordingly, the user is able to access the dampers 84a, 84b suitably. This achieves enhanced operability and maintenance of the dampers 84a, 84b. This is similarly applicable to the dampers 84c, 84d.

Although the liquid treatment chambers 42a to 42d are arranged in the substantially vertical direction Z, the exhaust channels 85a to 85d include the vertical members 87a to 87d. The vertical members 87a to 87d both extend to a position lower in level than the liquid treatment chambers 42a to 42d. Accordingly, the exhaust channels 85a to 85d are relatively long. Consequently, this achieves suitable suppression in mutual influence among an exhaust amount of gases of the exhaust channel 85a from the liquid treatment chamber 42a, an exhaust amount of gases of the exhaust channel 85b from the liquid treatment chamber 42b, an exhaust amount of gases of the exhaust channel 85c from the liquid treatment chamber 42c, and an exhaust amount of gases of the exhaust channel 85d from the liquid treatment chamber 42d. Consequently, this achieves suitable suppression in mutual influence between the exhaust amount of gases from the liquid treatment chambers 42a to 42d.

Likewise, the exhaust channels 85e to 85h include vertical members 87e to 87h, respectively. The vertical members 87e to 87h both extend to a position lower in level than the liquid treatment chambers 42e to 42h. Accordingly, the exhaust channels 85e to 85h are relatively long. Consequently, this achieves suitable suppression in mutual influence between the exhaust amount of gases from the liquid treatment chambers 42e to 42h.

The longer the vertical member 87 is, the larger channel sectional area the vertical member 87 has. This achieves suppressed difference in pressure loss of the vertical member 87. Consequently, the exhaust channels 85a to 85h are each capable of exhausting gases suitably.

The exhaust channels 85a to 85d penetrate the unit casing 43A at substantially the same position in plan view. This achieves suitable prevention of a complicated structure of the exhaust channels 85a to 85d and the unit casing 43A. Likewise, the exhaust channels 85e to 85h penetrate the unit casing 43B at substantially the same position in plan view. This achieves suitable prevention of a complicated structure of the exhaust channels 85e to 85h and the unit casing 43B.

A part of the exhaust channel 85a located in the liquid treatment chamber 42a is disposed at the lateral side of the liquid treatment chamber 42a adjacent to the transport chamber 44a. The nozzle 53A at a standby position is disposed at the lateral side of the liquid treatment chamber 42a far away from the transport chamber 44a. This achieves suitable prevention of interference between the exhaust channel 85a and the nozzle 53A. This is similarly applicable to the exhaust channels 85b to 85h.

The dampers 89a to 89d are disposed at positions lower in level than positions of the liquid treatment chambers 42a to 42d, respectively. Accordingly, the user is able to access the dampers 89a to 89d suitably. This achieves enhanced operability and maintenance of the dampers 89a to 89d. This is similarly applicable to the dampers 89e to 89h.

Although the transport chamber 44b is disposed below the transport chamber 44a, the exhaust channels 92a to 92d include vertical members 94a to 94d, respectively. The vertical members 94a to 94d both extend to a position lower in level than the transport chambers 44a, 44b. Accordingly, the exhaust channels 92a to 92d are relatively long. Consequently, this achieves suitable suppression in mutual influence among an exhaust amount of gases of the exhaust channel 92a from the transport chamber 44a, an exhaust amount of gases of the exhaust channel 92b from the transport chamber 44a, an exhaust amount of gases of the exhaust channel 92c from the transport chamber 44b, and an exhaust amount of gases of the exhaust channel 92d from the transport chamber 44b. Consequently, this achieves suitable suppression in mutual influence between the exhaust amount of gases from the transport chamber 44a, 44b.

Likewise, the exhaust channels 92e to 92h include vertical members 94e to 94h, respectively. The vertical members 94e to 94h each extend to a position lower in level than the transport chambers 44c, 44d. Accordingly, the exhaust channels 92e to 92h are relatively long. Consequently, this achieves suitable suppression in mutual influence between the exhaust amounts of gases from the transport chamber 44c, 44d.

The longer the vertical member 94 is, the larger channel sectional area the vertical member 94 has. This achieves suppressed difference in pressure loss of the vertical member 94. Consequently, the exhaust channels 92a to 92h are each capable of exhausting gases suitably.

The exhaust channels 92a, 92b exhaust gases of the transport chamber 44a. Consequently, efficient exhaust of gases is performable from the transport chamber 44a. Likewise, efficient exhaust of gases is performable from the transport chambers 44b to 44d.

The exhaust channels 92a, 92b are both connected to the suction unit exhaust 91a, and exhaust the gases of the transport chamber 44a through the suction unit 91a. Accordingly, the exhaust channels 92a, 92b are capable of exhausting the gases from the transport chamber 44a in the same manner. For instance, the suction unit 91a is capable of sucking gases over the top face thereof in a more uniform manner. Likewise, more appropriate exhaust of gases is performable from the transport chambers 44b to 44d.

The exhaust channel 92a is connected to the front portion of the suction unit exhaust 91a, and the exhaust channel 92b is connected to a rear portion of the suction unit 91a. Accordingly, the suction unit 91a is capable of sucking gases over the top face thereof in a more uniform manner. This is similarly applicable to the suction units 91b to 91d.

The fans 97a to 97d are disposed at a position lower in level than the transport chambers 44a to 44b. Accordingly, the user is able to access the fans 97a to 97d suitably. This achieves enhanced operability and maintenance of the fans 97a to 97d. This is similarly applicable to the fans 97e to 97h.

The fans 97a to 97h prohibit reverse flow of the gases in the exhaust channels 92a to 92h. Specifically, the fans 97a to 97h prohibit flow of the gases from the exhaust channels 92a to 92h to the transport chambers 44a to 44d. Consequently, this allows prevention of a lowered degree of cleanness of the transport chambers 44a to 44d.

Although the heat treatment chambers 45a to 45j are arranged in the substantially vertical direction Z, the exhaust channels 101a, 101b include the vertical members 103a, 103b. The vertical members 103a, 103b both extend to a position lower in level than the heat treatment chambers 45a to 45j. Accordingly, the exhaust channels 101a 101b are relatively long. Consequently, this achieves suitable suppression in mutual influence between the exhaust amount of gases of the exhaust channel 101*a* from the heat treatment chambers 45*a* to 45*e* and the exhaust amount of gases of the exhaust channel 101*b* from the heat treatment chambers 45*f* to 45*j*. Consequently, this achieves suitable suppression in mutual influence between the exhaust amounts of gases from the heat treatment chambers 45*a* to 45*j*.

Likewise, the exhaust channels 101*c* to 101*l* include vertical members 103*a*, 103*b*, respectively. The vertical members 103*a*, 103*b* both extend to a position lower in level than the heat treatment chambers 45*k* to 45*v*, 46*a* to 46*t*. Accordingly, the exhaust channels 101*c* to 101*l* are relatively long. Consequently, this achieves suitable suppression in mutual influence between the exhaust amounts of gases from the heat treatment chambers 45*k* to 45*v*, 46*a* to 46*t*.

The vertical member 103*a* is longer than the vertical member 103*b*, and has a channel sectional area larger than that of the vertical member 103*b*. Consequently, this achieves suppression of excessive increase in pressure loss of the vertical member 103*a* relative to pressure loss of the vertical member 103*b*. Consequently, not only the vertical member 103*b* but also the vertical member 103*a* is capable of exhausting gases suitably.

The exhaust channels 101*a*, 101*b* penetrate the unit casing 47A at substantially the same positions in plan view. This achieves suitable prevention of a complicated structure of the exhaust channels 101*a*, 101*b* and the unit casing 47A.

The dampers 105*a* to 105*j* are disposed upstream of the vertical members 103*a*, 103*b*. Accordingly, parts of the exhaust channels 101*a*, 101*b* disposed downstream of the dampers 105*a* to 105*j* include the vertical members 103*a*, 103*b*. Accordingly, parts of the exhaust channels 101*a*, 101*b* disposed downstream of the dampers 105*a* to 105*j* are relatively long. Consequently, this achieves more suitable suppression in mutual influence between the exhaust amount of gases of the exhaust channel 101*a* from the heat treatment chambers 45*a* to 45*e* and the exhaust amount of gases of the exhaust channel 101*b* from the heat treatment chambers 45*f* to 45*j*. Likewise, this achieves more suitable suppression in mutual influence between the exhaust amounts of gases of the exhaust channels 101*c* to 101*l* from the heat treatment chambers 45, 46.

The present invention is not limited to the foregoing examples, but may be modified as follows.

(1) In the present embodiment, the vertical members 68*a* to 68*d* both extend to a position lower in level than the liquid treatment chamber 42*d*. However, this is not limitative. The vertical members 68*a* to 68*d* may both extend to a position higher in level than the liquid treatment chamber 42*a*. The vertical members 68*a* to 68*d* may both extend to a position higher in level than the liquid treatment chamber 42*a* and a position lower in level than the liquid treatment chamber 42*d*. This is similarly applicable to the vertical members 68*e* to 68*h*.

(2) In the present embodiment, the number of feed channels 66 that supply gases into one liquid treatment chamber 42 is one. However, this is not limitative. The number of feed channels 66 that supply gases into one liquid treatment chamber 42 may be plural. In the present embodiment, the number of feed channels 66 that are connected to one blowing unit 65 is one. However, this is not limitative. The number of feed channels 66 that are connected to one blowing unit 65 may be plural.

Figure 16:
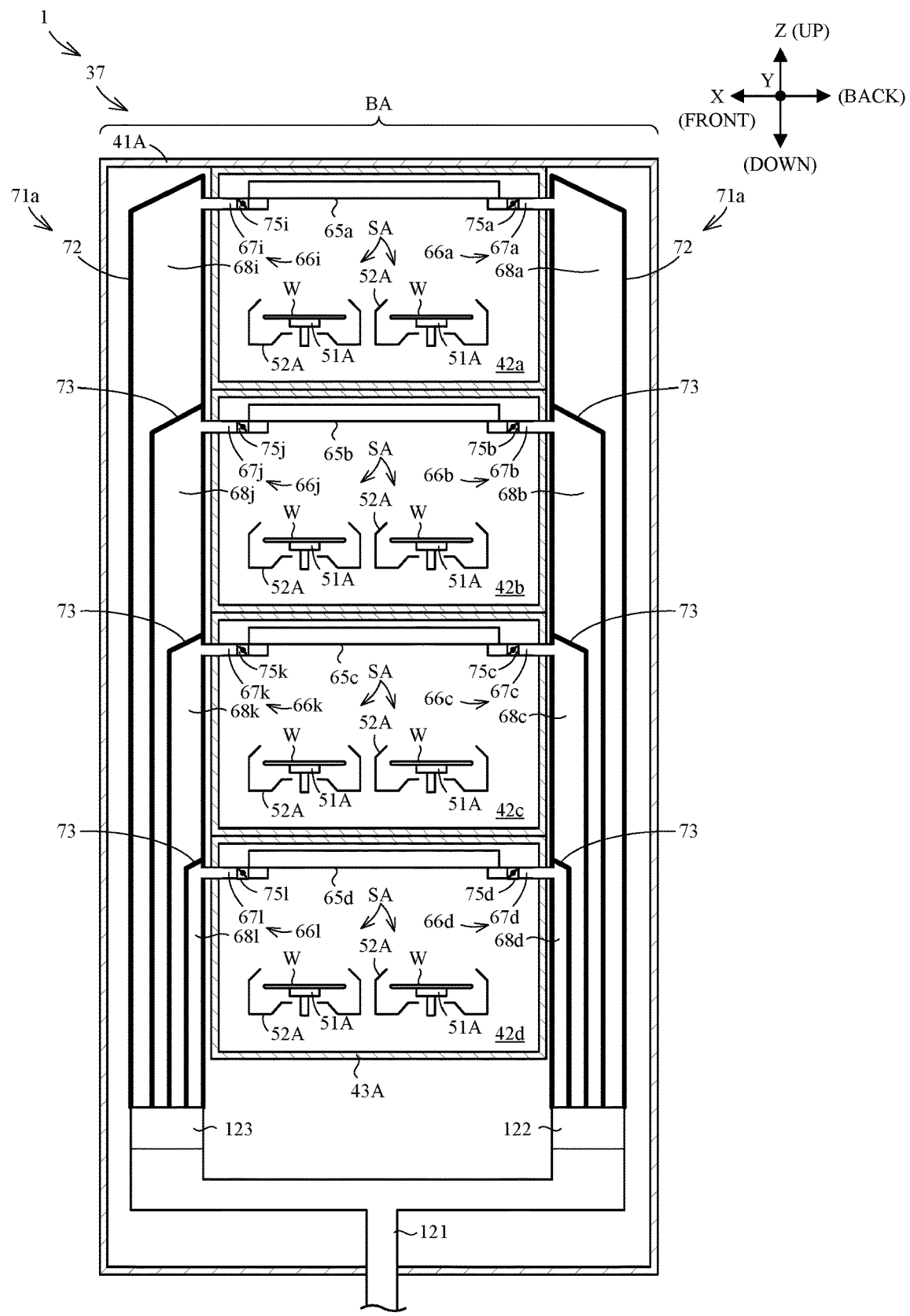
FIG. 16 is a side view of a treatment block according to one modification.

Reference is made to FIG. 16. FIG. 16 is a side view of a treatment block BA according to another modification. Like numerals are used to identify like components which are the same as in the present embodiment, and the components will not particularly be described. In FIG. 16, the illustration of the exhaust channels 85*a* to 85*d* is omitted for convenience.

In the modification, the substrate treating apparatus 1 includes feed channels 66*i* to 66*l* in addition to the feed channels 66*a* to 66*h*. The feed channels 66*a*, 66*i* supply gases into the liquid treatment chamber 42*a*. More specifically, the feed channels 66*a*, 66*i* supply gases to the liquid treatment chamber 42*a* without supplying gases to the liquid treatment chambers 42*b* to 42*h*. The feed channels 66*a*, 66*i* are in communication with the liquid treatment chamber 42*a*. The feed channels 66*a*, 66*i* are connected to the blowing unit 65*a*. Likewise, the feed channels 66*b*, 66*j* supply gases into the liquid treatment chamber 42*b*. The feed channels 66*c*, 66*k* supply gases into the liquid treatment chamber 42*c*. The feed channels 66*d*, 66*l* supply gases into the liquid treatment chamber 42*d*.

The feed channels 66*i* to 66*l* include horizontal members 67*i* to 67*l*, respectively. The horizontal members 67*a*, 67*i* are connected to the blowing unit 65*a*. The horizontal member 67*a* is connected to the rear portion of the blowing unit 65*a*. The horizontal member 67*i* is connected to the front portion of the blowing unit 65*a*. Likewise, the horizontal members 67*b*, 67*j* are connected to the blowing unit 65*b*. The horizontal members 67*c*, 67*k* are connected to the blowing unit 65*c*. The horizontal members 67*d*, 67*l* are connected to the blowing unit 65*d*.

The horizontal members 67*a* to 67*d*, 67*i* to 67*l* extend externally of the unit casing 43A from the blowing units 65*a* to 65*d*. The horizontal members 67*a* to 67*d* extend from the blowing units 65*a* to 65*d* in a direction different from that where the horizontal members 67*i* to 67*l* extend from the blowing units 65*a* to 65*d*. The horizontal members 67*a* to 67*d* extend from the blowing units 65*a* to 65*d* in a direction opposite to that where the horizontal members 67*i* to 67*l* extend from the blowing units 65*a* to 65*d*. The horizontal members 67*a* to 67*d* extend backwardly from the blowing units 65*a* to 65*d*, and the horizontal members 67*i* to 67*l* extend forwardly from the blowing units 65*a* to 65*d*.

The feed channels 66*i* to 66*l* include vertical members 68*i* to 68*l*, respectively. The vertical members 68*i* to 68*l* are connected to the horizontal members 67*i* to 67*l*. The vertical members 68*i* to 68*l* extend in the substantially vertical direction Z. The vertical members 68*i* to 68*l* both extend to a position lower in level than the liquid treatment chamber 42*d*.

The vertical members 68*a* to 68*d* are disposed in a first lateral direction (e.g., backward) of the liquid treatment chambers 42*a* to 42*d*, and the vertical members 68*i* to 68*l* are disposed in a second lateral direction (e.g., forward) of the liquid treatment chambers 42*a* to 42*d*. The second lateral direction is different from the first lateral direction. The second lateral direction is opposite to the first lateral direction.

The substrate treating apparatus 1 further includes dampers 75*i* to 75*l*. The dampers 75*i* to 75*l* are provided on the feed channels 66*i* to 66*l*, respectively. The dampers 75*i* to 75*l* regulate a flow rate of gases that flow in the feed channels 66*i* to 66*l*, respectively. The dampers 75*i* to 75*l* are disposed downstream of the vertical members 68*i* to 68*l*, respectively. The dampers 75*i* to 75*l* are provided in the horizontal members 67*i* to 67*l*, respectively.

The substrate treating apparatus 1 further includes a distributing pipe 121 instead of the distributing pipe 76*a*. The distributing pipe 121 supplies gases into the feed channels 66*a* to 66*d*, 66*i* to 66*l*. The distributing pipe 121 is connected to the feed channels 66*a* to 66*d*, 66*i* to 66*l*.

For instance, the distributing pipe 121 includes a first connecting part 122 and a second connecting part 123. The first connecting part 122 is connected to the feed channels 66*a* to 66*d*. The second connecting part 123 is connected to the feed channels 66*i* to 66*l*. The distributing pipe 121 further includes an upstream end (not shown). The upstream end of the distributing pipe 121 is connected to the gas controller 5 (see FIG. 1).

According to the modification, although the liquid treatment chambers 42*a* to 42*d* are arranged in the substantially vertical direction Z, the feed channels 66*a* to 66*d*, 66*i* to 66*l* include the vertical members 68*a* to 68*d*, 68*i* to 68*l*, respectively. The vertical members 68*a* to 68*d*, 68*i* to 68*l* both extend to a position lower in level than the liquid treatment chamber 42*d*. Consequently, the feed channels 66*a* to 66*d*, 66*i* to 66*l* are relatively long. Consequently, this achieves suitable suppression in mutual influence between the supply amounts of gases of the feed channels 66*a* to 66*d*, 66*i* to 66*l* to the liquid treatment chambers 42*a* to 42*d*.

The feed channels 66*a*, 66*i* supply gases into the liquid treatment chamber 42*a*. Accordingly, the feed channels 66*a*, 66*i* achieve effective supply of gases to the liquid treatment chamber 42*a*. Likewise, efficient supply of gases is performable to the liquid treatment chambers 42*b* to 42*d*.

The feed channels 66*a*, 66*i* supply gases into the liquid treatment chamber 42*a* through the blowing unit 65*a*. Accordingly, the feed channels 66*a*, 66*i* supply gases into the liquid treatment chamber 42*a* in the same manner. For instance, the blowing unit 65*a* is capable of blowing gases in a more uniform manner over the lower face thereof.

The feed channel 66*a* is connected to the rear portion of the blowing unit 65*a*, and the feed channel 66*i* is connected to a front portion of the blowing unit 65*a*. Accordingly, the blowing unit 65*a* is capable of blowing gases in a more uniform manner over the lower face thereof.

The vertical members 68*a* to 68*d* are disposed in a first lateral direction of the liquid treatment chambers 42*a* to 42*d*, and the vertical members 68*i* to 68*l* are disposed in the second lateral direction of the liquid treatment chambers 42*a* to 42*d*. This achieves suitable prevention of interference between the vertical members 68*a* to 68*d* and the vertical members 68*i* to 68*l*.

Any two of the feed channels 66*i* to 66*l* are one example of the third feed channel and the fourth feed channel in the present invention.

Any two of the vertical members 68*i* to 68*l* are one example of the third vertical member and the fourth vertical member in the present invention.

(3) In the present embodiment, the number of liquid treatment chambers 42 into which one feed channel 66 supplies gases is one.

However, this is not limitative. For instance, the number of liquid treatment chambers 42 into which one feed channel 66 supplies gases may be plural.

Figure 17:
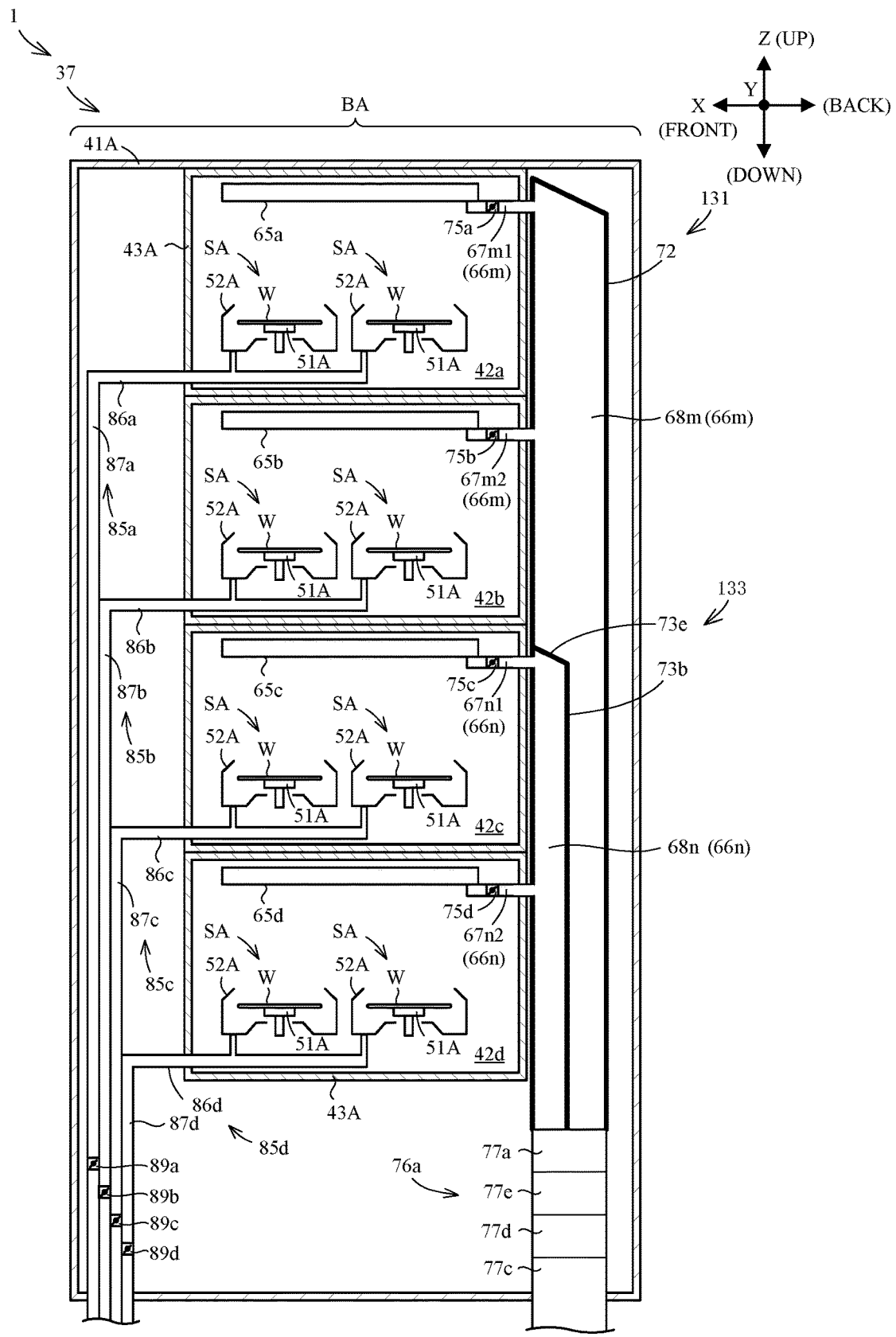
FIG. 17 is a side view of a treatment block according to another modification.

Reference is made to FIG. 17. FIG. 17 is a side view of a treatment block BA according to another modification. Like numerals are used to identify like components which are the same as in the present embodiment, and the components will not particularly be described.

In the modification, the substrate treating apparatus 1 includes feed channels 66*m*, 66*n* instead of the feed channels 66*a* to 66*d*. The feed channel 66*m* supplies gases into the liquid treatment chambers 42*a*, 42*b*. More specifically, the feed channel 66*m* supplies gases to the liquid treatment chambers 42*a*, 42*b* without supplying gases to the liquid treatment chambers 42*c* to 42*h*. The feed channel 66*m* is in communication with the liquid treatment chambers 42*a*, 42*b*. The feed channel 66*m* is connected to the blowing units 65*a*, 65*b*. Likewise, the feed channel 66*n* supplies gases into the liquid treatment chambers 42*c*, 42*d*.

The feed channel 66*m* includes horizontal members 67*m*1, 67*m*2, and a vertical member 68*m*. The feed channel 66*n* includes horizontal members 67*n*1, 67*n*2, and a vertical member 68*n*. The horizontal members 67*m*1, 67*m*2, 67*n*1, 67*n*2 have substantially the same structure as the horizontal members 67*a* to 67*d* in the present embodiment. The vertical member 68*m* is connected to the horizontal members 67*m*1, 67*m*2. The vertical member 68*n* is connected to the horizontal members 67*n*1, 67*n*2. The vertical members 68*m*, 68*n* extend in the substantially vertical direction Z. The vertical members 68*m*, 68*n* both extend to a position lower in level than the liquid treatment chamber 42*d*.

The feed channels 66*m*, 66*n* are formed by a multi-tube unit 131. The multi-tube unit 131 corresponds to a multi-tube unit 71*a* with the vertical plates 73*a*, 73*c* and the block plates 73*d*, 73*f* being omitted. That is, the multi-tube unit 131 includes a box 72 and a partition member 133. The partition member 133 includes a vertical plate 73*b* and a block plate 73*e*.

The partition member 133 divides the interior space of the box 72 into two spaces. The two spaces correspond to flow paths of the vertical members 68*m*, 68*n*. That is, the vertical members 68*m*, 68*n* are formed in the box 72. The vertical members 68*m*, 68*n* are separated by the partition member 133. Specifically, the vertical members 68*m*, 68*n* are separated by the vertical plate 73*b* and the block plate 73*e*.

According to the modification, although the liquid treatment chambers 42*a* to 42*d* are arranged in the substantially vertical direction Z, the feed channels 66*m*, 66*n* include the vertical members 68*m*, 68*n*, respectively. The vertical members 68*m*, 68*n* both extend to a position lower in level than the liquid treatment chamber 42*d*. Accordingly, the feed channels 66*m*, 66*n* are relatively long. Consequently, this achieves suitable suppression in mutual influence between the supply amount of gases of the feed channel 66*m* to the liquid treatment chambers 42*a*, 42*b* and the supply amount of gases of the feed channel 66*n* to the liquid treatment chambers 42*c*, 42*d*.

(4) in the present embodiment, the vertical member 68*a* is disposed externally of the liquid treatment chambers 42*a* to 42*h*. However, this is not limitative. For instance, at least a part of the vertical members 68*a* may be disposed in at least any of the liquid treatment chambers 42*a* to 42*h*. In other words, a part of the vertical members 68*a* may be disposed in at least any of the unit casings 43A, 44B. This is similarly applicable to the vertical members 68*b* to 68*h*.

(5) In the present embodiment, the vertical member 68*a* is disposed in the treatment block BA. However, this is not limitative. For instance, at least a part of the vertical member 68*a* may be disposed externally of the treatment block BA. For instance, the vertical member 68*a* may extend to a position lower in level than the treatment block BA.

(6) In the present embodiment, the vertical plates 73*a* to 73*c* are a flat plate each substantially parallel to the front wall 72*a*. However, this is not limitative. For instance, the vertical plates 73*a* to 73*c* are each a flat plate substantially orthogonal to the front wall 72*a*. For instance, the vertical plates 73*a* to 73*c* are each a flat plate substantially parallel to at least either the right wall 72*c* or the left wall 72*d*. In this modification, the vertical plate 73*a* to 73*c* are disposed leftward of the right wall 72*c* and rightward of the left wall 72*d*.

(7) In the present embodiment, the vertical members 68a to 68d are formed by the box 72 and the partition member 73. However, this is not limitative. The vertical members 68a to 68d may be formed by four individual pipes. This is similarly applicable to the vertical members 68e to 68h.

(8) In the present embodiment, the distributing pipe 76a supplies gases into the feed channels 66a to 66d, and feed channels 82a, 82b. However, this is not limitative.

The distributing pipe 76a may not supply gases into the feed channels 82a, 82b. That is, the distributing pipe 76a may supply gases only into the feed channels 66a to 66d. The substrate treating apparatus 1 may further include an individual distributing pipe that is different from the distributing pipe 76a and supplies gases into feed channels 82a, 82b. Alternatively, the feed channels 82a, 82b may be connected to the gas controller 5 directly.

The distributing pipe 76a may not necessarily supply gases into the feed channels 66a to 66d. That is, the distributing pipe 76a may supply gases only into the feed channels 82a, 82b. The feed channels 66a to 66d may be connected to the gas controller 5 directly.

The distributing pipe 76a is omittable. The feed channels 66a to 66d and the feed channel 82a, 82b may be connected to the gas controller 5 directly.

This is similarly applicable to the distributing pipe 76b.

(9) In the present embodiment, the distributing pipe 76a supplies no gas into the feed channels 66e to 66h. However, this is not limitative. For instance, the distributing pipe 76a may supply gases into the feed channels 66e to 66h. In the present embodiment, the distributing pipe 76a supplies no gas into the feed channels 82c, 82d. However, this is not limitative. For instance, the distributing pipe 76a may supply gases into the feed channels 82c, 82d.

(10) In the present embodiment, the gases regulated by the gas controller 5 are fed into the feed channels 66. However, this is not limitative. For instance, gases outside the substrate treating apparatus 1 may be fed into the feed channel 66. Here, the gases outside the substrate treating apparatus 1 correspond to gases, for example, in a clean room where the substrate treating apparatus 1 is installed. The gases outside the substrate treating apparatus 1 correspond to gases, for example, around the substrate treating apparatus 1.

(11) In the present embodiment, the gas controller 5 supplies gases into the feed channels 66, 82. However, this is not limitative.

The gas controller 5 may not necessarily supply gases into the feed channel 82. The gas controller 5 may supply gases only into the feed channel 66. This modification may further include a gas controller that is different from the gas controller 5 and supplies gases into the feed channel 82.

The gas controller 5 may not necessarily supply gases into the feed channel 66. The gas controller 5 may supply gases only into the feed channel 82.

(12) In the present embodiment, the number of liquid treatment units SA that are provided in one liquid treatment chamber 42 is two.

However, this is not limitative. Alternatively, the number of liquid treatment units SA that are provided in one liquid treatment chamber 42 may be one or three or more. In the present embodiment, the number of liquid treatment units SB that are provided in one liquid treatment chamber 42 is two. However, this is not limitative. Alternatively, the number of liquid treatment units SB that are provided in one liquid treatment chamber 42 may be one or three or more.

(13) In the present embodiment, the vertical members 83a, 83b both extend to a position lower in level than the transport chamber 44b. However, this is not limitative. The vertical members 83a, 83b may both extend to a position higher in level than the transport chamber 44a. The vertical members 83a, 83b may both extend to a position higher in level than the transport chamber 44a and a position lower in level than the transport chamber 44b. This is similarly applicable to the vertical members 83c, 83d.

(14) In the present embodiment, the number of feed channels 82 that supply gases into one transport chambers 44 is one. However, this is not limitative. Alternatively, the number of feed channels 82 that supply gases into one transport chamber 44 may be plural. The modification achieves effective supply of gases to the transport chamber 44.

(15) In the present embodiment, the number of feed channels 82 that are connected to one blowing unit 81 is one. However, this is not limitative. Alternatively, the number of feed channels 82 that are connected to one blowing unit 81 may be plural. According to this modification, a plurality of feed channels 82 each supply gases into the transport chamber 44 through the one blowing unit 81. Consequently, the feed channels 82 supply gases into the transport chamber 44 in the same manner. For instance, the blowing unit 81 is capable of blowing gases in a more uniform manner over the lower face thereof.

(16) In the present embodiment, the number of transport chambers 44 into which one feed channel 82 supplies gases is one.

However, this is not limitative. Alternatively, the number of transport chambers 44 into which one feed channel 82 supplies gases may be plural. For instance, when the substrate treating apparatus 1 includes four transport chambers 44 that are arranged in the substantially vertical direction Z, the feed channel 82a may supply gases into the upper two transport chambers 44, and the feed channel 82b may supply gases into the lower two transport chambers 44.

(17) In the present embodiment, a part of the vertical member 83a is provided in the transport chamber 44a. However, this is not limitative. For instance, the vertical members 83a may entirely be disposed externally of the transport chamber 44a. In the present embodiment, a part of the vertical member 83a is provided in the transport chamber 44b. However, this is not limitative. For instance, the vertical members 83a may entirely be disposed externally of the transport chamber 44b. This is similarly applicable to the vertical members 83b to 83d.

(18) In the present embodiment, the vertical member 83a is disposed in the treatment block BA. However, this is not limitative. For instance, at least a part of the vertical member 83a may be disposed externally of the treatment block BA. For instance, the vertical member 83a may extend to a position lower in level than the treatment block BA.

(19) In the present embodiment, the gases regulated by the gas controller 5 are fed into the feed channels 82. However, this is not limitative. Gases outside the substrate treating apparatus 1 may be fed into the feed channel 82.

Figure 18:
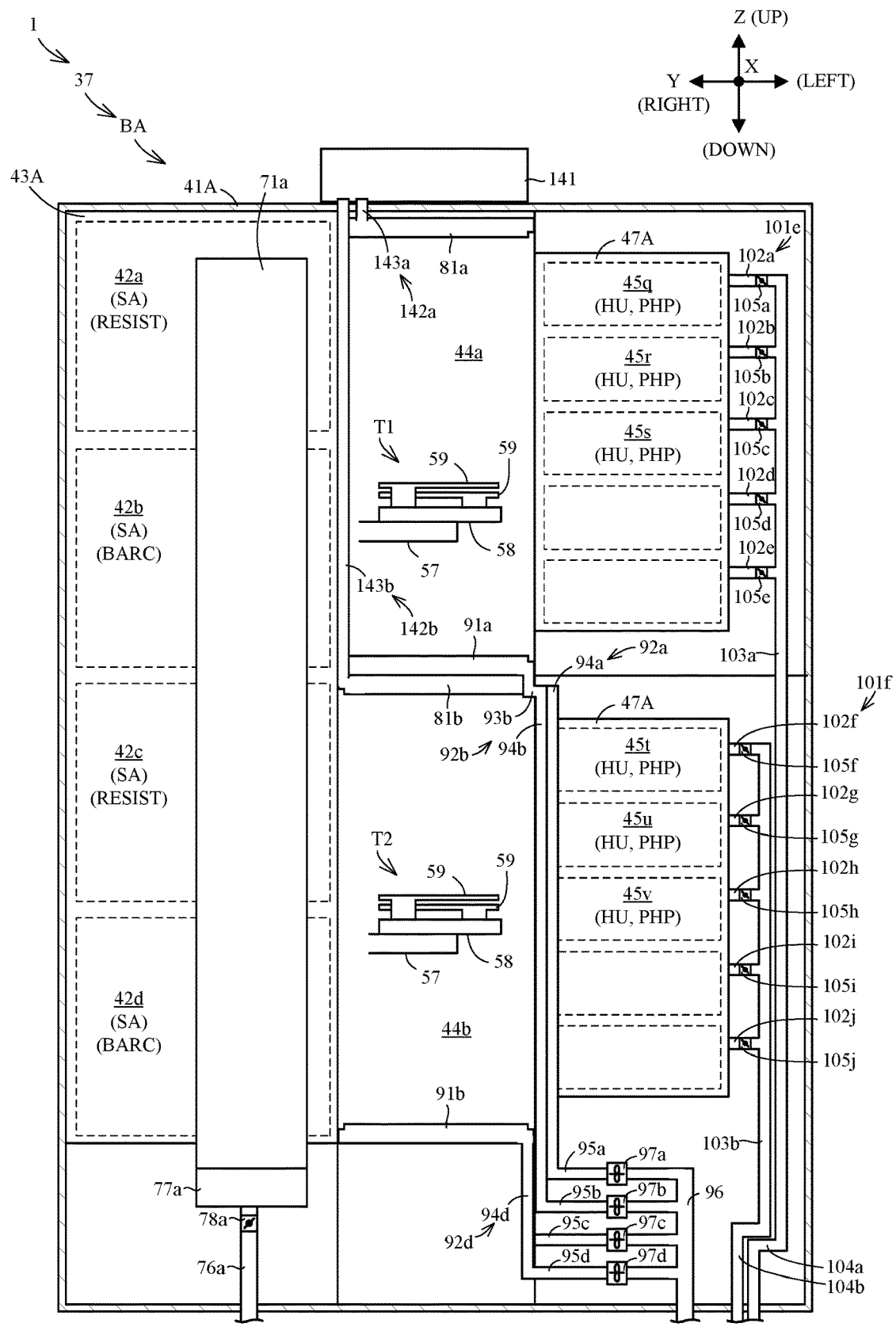
FIG. 18 is a front view of the treatment block according to the other modification.

Reference is made to FIG. 18. FIG. 18 is a front view of the treatment block BA according to the other modification. Like numerals are used to identify like components which are the same as in the present embodiment, and the components will not particularly be described. The substrate treating apparatus 1 further includes a gas supplying unit 141. The gas supplying unit 141 takes the gases outside the substrate treating apparatus 1. Here, the gases outside the substrate treating apparatus 1 correspond to gases, for example, inside a clean room where the substrate treating apparatus 1 is installed. The gas supplying unit 141 is disposed above the treatment section 37 (e.g., the block casing 41A). However, such arrangement of the gas supplying unit 141 is not limitative. For instance, the gas supplying unit 141 may be disposed in the treatment block BA. In this case, the gas supplying unit 141 takes the gases of the clean room through an opening formed in the block casing 41A.

The gas supplying unit 141 includes a fan for blowing gases. Moreover, the gas supplying unit 141 preferably includes a filter. An example of the filter is a chemisorption filter or an Ultra-Low Penetration Air Filter (ULPA) filter.

The substrate treating apparatus 1 includes feed channels 142a, 142b. The feed channel 142a supplies gases to the transport chamber 44a. The feed channel 142a supplies gases to the transport chamber 44a without supplying gases to the transport chambers 44b to 44d. The feed channel 142a is in communication with the transport chamber 44a. The feed channel 142a is connected to the gas supplying unit 141 and the blowing unit 81a. Likewise, the feed channel 142b supplies gases to the transport chamber 44b.

The feed channels 142a, 142b include vertical members 143a, 143b, respectively. The vertical member 143a is connected to the gas supplying unit 141 and the blowing unit 81a. The vertical member 143b is connected to the gas supplying unit 141 and the blowing unit 81b.

The vertical members 143a, 143b extend in the substantially vertical direction Z. The vertical members 143a, 143b both extend to a position higher in level than the transport chamber 44a. The vertical members 143a, 143b extend from the inside of the treatment block BA to the outside of the treatment block BA. The vertical member 143a, 143b penetrate the block casing 41A (e.g., a top board of the block casing 41A).

The vertical members 143a, 143b each include an upper end. The upper ends of the vertical members 143a, 143b are disposed above the treatment section 37. The upper ends of the vertical members 143a, 143b are connected to the gas supplying unit 141.

The vertical members 143a, 143b each include a lower end. The lower ends of the vertical members 143a, 143b are disposed in the treatment block BA. The lower end of the vertical member 143a is disposed at the same position in level as the transport chamber 44a. The lower end of the vertical member 143a is connected to the blowing unit 81a. The lower end of the vertical member 143b is disposed at the same position in level as the transport chamber 44b. The lower end of the vertical member 143b is connected to the blowing unit 81b.

The gas supplying unit 141 supplies the gases above the substrate treating apparatus 1 to the feed channels 142a, 142b. Specifically, gases flows from the gas supplying unit 141 to the vertical member 143a, and from the vertical member 143a to the blowing unit 81a. Then, the blowing unit 81a blows gases into the transport chamber 44a. Likewise, gases flows from the gas supplying unit 141 to the vertical member 143b, and from the vertical member 143b to the blowing unit 81b. Then, the blowing unit 81b blows gases into the transport chamber 44b.

According to this modification, the feed channels 142a, 142b include vertical members 143a, 143b, respectively. The vertical members 143a, 143b both extend to a position higher in level than the transport chamber 44a. Accordingly, the feed channels 142a, 142b are relatively long. Consequently, this achieves suitable suppression in mutual influence between the supply amount of gases of the feed channel 142a to the transport chamber 44a and the supply amount of gases of the feed channel 142b to the transport chamber 44b. Consequently, this achieves suitable suppression in mutual influence between the supply amounts of gases to the transport chamber 44a, 44b.

The gas supplying unit 141 allows suitable supply of the gases outside the substrate treating apparatus 1 (specifically, the gases around the substrate treating apparatus 1) to the first the transport chambers 44a, 44b.

(20) In the present embodiment, the number of main transport mechanisms T that are provided in one transport chamber 44 is one.

However, this is not limitative. The number of main transport mechanisms T that are provided in one transport chamber 44 may be two or more.

(21) In the present embodiment, the vertical members 87a to 87d both extend to a position lower in level than the liquid treatment chamber 42d. However, this is not limitative. The vertical members 87a to 87d both may extend to a position higher in level than the liquid treatment chamber 42a. The vertical members 87a to 87d may both extend to a position higher in level than the liquid treatment chamber 42a and a position lower in level than the liquid treatment chamber 42d. This is similarly applicable to the vertical members 87e to 87h.

(22) In the present embodiment, the number of exhaust channels 85 that exhaust gases from one liquid treatment chamber 42 is one.

However, this is not limitative. The number of exhaust channels 85 that exhaust gases from one liquid treatment chamber 42 may be plural. In the present embodiment, the number of exhaust channels 85 that are connected to one cup 52 is one. However, this is not limitative. Alternatively, the number of exhaust channels 85 that are connected to one cup 52 may be plural.

(23) In the present embodiment, the number of liquid treatment chambers 42 from which one exhaust channel 85 exhausts gases is one. However, this is not limitative. For instance, the number of liquid treatment chambers 42 from which one exhaust channel 85 exhausts gases may be plural.

(24) In the present embodiment, the vertical member 87a is disposed externally of the liquid treatment chambers 42a to 42h. However, this is not limitative. For instance, at least a part of the vertical members 87a may be disposed in at least any of the liquid treatment chambers 42a to 42h. In other words, a part of the vertical members 87a may be disposed in at least any of the unit casing 43A, 44B. This is similarly applicable to the vertical members 87b to 87h.

(25) In the present embodiment, the vertical member 87a extends from the inside of the treatment block BA to the outside of the treatment section 37. However, this is not limitative. For instance, the vertical member 87a may entirely be disposed in the treatment block BA.

(26) In the present embodiment, the exhaust channels 85a to 85h are connected to the gas treatment equipment 8 without being collected to one another. However, this is not limitative. For instance, the substrate treating apparatus 1 may include a first collecting duct that is connected to the exhaust channels 85a to 85d to collect gases flowing through the exhaust channels 85a to 85d, and a second collecting duct that is connected to the exhaust channels 85e to 85h to collect gases flowing through the exhaust channels 85e to 85h. For instance, the substrate treating apparatus 1 may include a collecting duct that is connected to the exhaust channels 85a to 85h to collect gases flowing through the exhaust channels 85a to 85h. For instance, the collecting duct 96 may be connected to the exhaust channels 85a to 85d in addition to the exhaust channels 92a to 92d. That is, the collecting duct 96 may not necessarily collect the gases that are exhausted from the liquid treatment chambers 42a to 42d through the exhaust channels 85a to 85d, and the gases that are exhausted from the transport chambers 44a, 44b through the exhaust channels 92a to 92d.

(27) In the present embodiment, the substrate treating apparatus 1 further includes dampers 89a to 89h. However, this is not limitative. For instance, the dampers 89a to 89h may be replaced by the fans.

(28) In the present embodiment, the vertical members 94a to 94d both extend to a position lower in level than the transport chamber 44b. However, this is not limitative. The vertical members 94a to 94d may both extend to a position higher in level than the transport chamber 44a. The vertical members 94a to 94d may both extend to a position higher in level than the transport chamber 44a and a position lower in level than the transport chamber 44b. This is similarly applicable to the vertical members 94a to 94d.

(29) In the present embodiment, the number of exhaust channels 92 that exhaust gases from one transport chamber 44 is two. However, this is not limitative. For instance, the number of exhaust channels 92 that exhaust gases from one transport chamber 44 may be one. This modification achieves a simplified structure of the exhaust channel 92. For instance, the number of exhaust channels 92 that exhaust gases from one transport chamber 44 may be three or more. The modification achieves more effective exhaust of gases from the transport chamber 44.

(30) In the present embodiment, the number of exhaust channels 92 that are connected to one suction unit 91 is two. However, this is not limitative. Alternatively, the number of exhaust channels 92 that are connected to one suction unit 91 may be one or three or more.

(31) In the present embodiment, the number of transport chambers 44 from which one exhaust channel 92 exhausts gases is one. However, this is not limitative. Alternatively, the number of transport chambers 44 from which one exhaust channel 92 exhausts gases may be plural. For instance, when the substrate treating apparatus 1 includes four transport chambers 44 that are arranged in the substantially vertical direction Z, the exhaust channel 92a may exhaust gases from the upper two transport chambers 44, and the exhaust channel 92c may exhaust gases from the lower two transport chambers 44.

(32) In the present embodiment, the vertical member 94a is provided externally of the transport chamber 44a. However, this is not limitative. For instance, a part of the vertical members 94a may be disposed in the transport chamber 44a. In the present embodiment, the vertical member 94a is provided externally of the transport chamber 44b. However, this is not limitative. For instance, a part of the vertical members 94a may be disposed in the transport chamber 44b. This is similarly applicable to the vertical members 94b to 94h.

(33) In the present embodiment, the vertical member 94a is disposed in the treatment block BA. However, this is not limitative. For instance, at least a part of the vertical member 94a may be disposed externally of the treatment block BA. For instance, the vertical member 94a may extend to a position lower in level than the treatment block BA. This is similarly applicable to the vertical members 94b to 94h.

(34) In the present embodiment, the substrate treating apparatus 1 further includes a collecting duct 96. However, this is not limitative. For instance, the collecting duct 96 is omittable. The exhaust channels 92a to 92d may be connected to the gas treatment equipment 18 without being collected to one another. For instance, the downstream ends of the downstream members 95a to 95d may be connected to the gas treatment equipment 18 directly. This is similarly applicable to the exhaust channels 92e to 92h.

(35) In the present embodiment, the substrate treating apparatus 1 further includes fans 97a to 97h. However, this is not limitative. For instance, the fans 97a to 97h may be replaced by the dampers.

(36) In the present embodiment, the exhaust channel 92 is in communication with the gas treatment equipment 18. However, this is not limitative. For instance, the exhaust channel 92 may be in communication with the gas treatment equipment 8. That is, the gas treatment equipment 8 may treat the gases that are exhausted from the liquid treatment chamber 42 through the exhaust channel 85, and the gases that are exhausted from the transport chamber 44 through the exhaust channel 92. For instance, the exhaust channel 92 may be opened to the outside of the substrate treating apparatus 1. That is, the exhaust channel 92 may discharge the gases exhausted from the transport chamber 44 to the outside of the substrate treating apparatus 1.

(37) In the present embodiment, the vertical members 103a, 103b of the exhaust channels 101a, 101b both extend to a position lower in level than the heat treatment chambers 45a to 45j. However, this is not limitative. The vertical members 103a, 103b of the exhaust channels 101a, 101b may both extend to a position higher in level than the heat treatment chambers 45a to 45j. The vertical members 103a, 103b of the exhaust channels, 101a, 101b may both extend to a position higher in level than the heat treatment chambers 45a to 45j, and a position lower in level than the heat treatment chambers 45a to 45j. This is similarly applicable to the vertical members 103a, 103b of the exhaust channels 101c to 101l.

(38) In the present embodiment, the number of exhaust channels 101 that exhaust gases from one heat treatment chamber 45 is one.

However, this is not limitative. The number of exhaust channels 101 that exhaust gases from one heat treatment chamber 45 may be plural. Likewise, the number of exhaust channels 101 that exhaust gas from one heat treatment chamber 46 may be plural.

(39) In the present embodiment, the number of heat treatment chambers 45 from which one exhaust channel 101 exhausts gases is plural. However, this is not limitative. For instance, the number of heat treatment chambers 45 from which one exhaust channel 101 exhausts gases is one. Likewise, the number of heat treatment chambers 46 from which one exhaust channel 101 exhausts gases may be one.

(40) In the present embodiment, one exhaust channel 101 exhausts gases from a plurality of heat treatment chambers 45 that are arranged in the substantially vertical direction Z. However, this is not limitative.

For instance, one exhaust channel 101 may exhaust gases from a plurality of heat treatment chambers 45 that are arranged in the substantially horizontal direction (e.g., the forward/backward direction X).

Now description is made of a substrate treating apparatus 1 according to one modification with reference to FIG. 7 for convenience. The substrate treating apparatus 1 includes a first exhaust channel (not shown) and a second exhaust channel (not shown). The first exhaust channel exhausts gases of the heat treatment chambers 45a, 45k, 45q. The second exhaust channel exhausts gases of the heat treatment chambers 45b, 45l, 45r. The first exhaust channel includes a first vertical member that extends in the substantially vertical direction Z. The second exhaust channel includes a second vertical member that extends in the substantially vertical direction Z. The first and second vertical members both extend to a position lower in level than the heat treatment chambers 45b, 45l, 45r.

This modification achieves suitable suppression in mutual influence between an exhaust amount of gases that the first exhaust channels exhausts from the heat treatment chamber 45a, 45k, 45q and an exhaust amount of gases that the second exhaust channels exhausts from the heat treatment chamber 45b, 45l, 45r.

Any one of the heat treatment chambers 45a, 45k, 45q is one example of the first heat treatment chamber in the present invention. Any one of the heat treatment chambers 45b, 45l, 45r is one example of the second heat treatment chamber in the present invention.

For instance, one exhaust channel 101 may exhaust gases from a plurality of heat treatment chambers 45 that are arranged in the substantially vertical direction Z and the substantially horizontal direction (e.g., the forward/backward direction X) in a matrix array.

Now description is made of a substrate treating apparatus 1 according to one modification with reference to FIG. 7 for convenience. The substrate treating apparatus 1 includes a first exhaust channel and a second exhaust channel. The first exhaust channel exhausts gases of the heat treatment chambers 45a to 45e, 45k to 45m, 45q to 45s. The second exhaust channel exhausts gases of the heat treatment chambers 45f to 45j, 45n to 45p, 45t to 45v. The first exhaust channel includes a first vertical member that extends in the substantially vertical direction Z. The second exhaust channel includes a second vertical member that extends in the substantially vertical direction Z. The first and second vertical members both extend to a position lower in level than the heat treatment chambers 45f to 45j, 45n to 45p, 45t to 45v.

This modification achieves suitable suppression in mutual influence between an exhaust amount of gases that the first exhaust channels exhausts from the heat treatment chamber 45a to 45e, 45k to 45m, 45q to 45s and an exhaust amount of gases that the second exhaust channels exhausts from the heat treatment chamber 45f to 45j, 45n to 45p, 45t to 45v.

Any one of the heat treatment chambers 45a to 45e, 45k to 45m, 45q to 45s is one example of the first heat treatment chamber in the present invention. Any one of the heat treatment chambers 45f to 45j, 45n to 45p, 45t to 45v is one example of the second heat treatment chamber in the present invention.

(41) In the present embodiment, the vertical member 103a of the exhaust channel 101a is provided externally of the heat treatment chambers 45, 46. However, this is not limitative. For instance, at least a part of the vertical members 103a of the exhaust channel 101a may be disposed in at least any of the heat treatment chambers 45, 46. In other words, a part of the vertical members 103a of the exhaust channel 101a may be disposed in at least any of the unit casings 47A, 47B. This is similarly applicable to the vertical members 103a, 103b of the exhaust channels 101b to 101l.

(42) In the present embodiment, the vertical member 103a of the exhaust channel 101a is disposed in the treatment block BA. However, this is not limitative. For instance, at least a part of the vertical member 103a may be disposed externally of the treatment block BA. For instance, the vertical member 103a of the exhaust channel 101a may extend to a position lower in level than the treatment block BA. This is similarly applicable to the vertical members 103a, 103b of the exhaust channels 101b to 101l.

(43) In the present embodiment, the exhaust channels 101a to 101l are connected to the gas treatment equipment 28 without being collected to one another. However, this is not limitative. For instance, the substrate treating apparatus 1 may include a first collecting duct that is connected to the exhaust channels 101a to 101f to collect gases flowing through the exhaust channels 101a to 101f, and a second collecting duct that is connected to the exhaust channels 101g to 101l to collect gases flowing through the exhaust channels 101g to 101l. For instance, the substrate treating apparatus 1 may include a collecting duct that is connected to the exhaust channels 101a to 101l to collect gases flowing through the exhaust channels 101a to 101l.

(44) In the present embodiment, the substrate treating apparatus 1 further includes dampers 105a to 105j. However, this is not limitative. For instance, the dampers 105a to 105j may be replaced by the fans.

(45) In the present embodiment, the exhaust channel 101 is in communication with the gas treatment equipment 28. However, this is not limitative. For instance, the exhaust channel 101 may be in communication with the gas treatment equipment 8. For instance, the exhaust channel 101 may be in communication with the gas treatment equipment 18.

(46) In the present embodiment, the number of heat treatment units HU that are provided in one heat treatment chamber 45 is one. However, this is not limitative. The number of heat treatment units HU that are provided in one heat treatment chamber 45 may be two or more.

(47) In the present embodiment, the substrate treating apparatus 1 performs the liquid treatment and the heat treatment to the substrate W. However, this is not limitative. The substrate treating apparatus 1 may perform either the liquid treatment or the heat treatment to the substrate W. In the present embodiment, the substrate treating apparatus 1 includes the liquid treatment chamber 42, the transport chamber 44, and the heat treatment chambers 45, 46. However, this is not limitative. The substrate treating apparatus 1 may include at least any of the liquid treatment chamber 42, the transport chamber 44, and the heat treatment chambers 45, 46.

(48) In the present embodiment, all of the connection positions of the distributing pipe 76a and the feed channels 66a to 66d are arranged at a position lower in level than the liquid treatment chamber 42b. However, this is not limitative. All of the connection positions of the distributing pipe 76a and the feed channels 66a to 66d may be arranged at a position higher in level than the liquid treatment chamber 42a. All of the connection positions of the distributing pipe 76a and the feed channels 66a to 66d may be arranged at a position lower in level than the liquid treatment chamber 42b, and a position higher in level than the liquid treatment chamber 42a. This is similarly applicable to the connection positions of the distributing pipe 76b and the feed channels 66e to 66h.

(49) The elements of the present embodiments and the modifications as described above may be variably combined appropriately.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus comprising:
   a first liquid treatment chamber;
   a second liquid treatment chamber that is disposed below the first liquid treatment chamber;

a first liquid treatment unit that is disposed in the first liquid treatment chamber and performs a liquid treatment to a substrate;

a second liquid treatment unit that is disposed in the second liquid treatment chamber and performs a liquid treatment to a substrate;

a first feed channel that supplies gases to the first liquid treatment chamber; and a second feed channel that supplies gases to the second liquid treatment chamber, the first feed channel including a first vertical member that extends substantially vertically, the second feed channel including a second vertical member that extends substantially vertically, the first vertical member and the second vertical member both extending to at least either a position higher in level than the first liquid treatment chamber or a position lower in level than the second liquid treatment chamber, and one of the first vertical member and the second vertical member is longer than the other of the first vertical member and the second vertical member, and the one of the first vertical member and the second vertical member has a channel sectional area larger than that of the other of the first vertical member and the second vertical member.

2. The substrate treating apparatus according to claim 1, further comprising:

a first regulator that is provided on the first feed channel and regulates a flow rate of the gases flowing in the first feed channel; and a second regulator that is provided on the second feed channel and regulates a flow rate of the gases flowing in the second feed channel, wherein the first regulator is disposed downstream of the first vertical member, and the second regulator is disposed downstream of the second vertical member.

3. The substrate treating apparatus according to claim 1, further comprising a distributing pipe that is connected to the first feed channel and the second feed channel for supplying gases to the first feed channel and the second feed channel, wherein the distributing pipe is connected to both the first feed channel and the second feed channel at either a position higher in level than the first liquid treatment chamber or a position lower in level than the second liquid treatment chamber.

4. The substrate treating apparatus according to claim 3, wherein the first feed channel includes a upstream end, the second feed channel includes a upstream end, the distributing pipe includes a connector that connects the upstream end of the first feed channel and the upstream end of the second feed channel, the connector extends in a direction substantially equal to a direction where the upstream end of the first feed channel extends, and the connector extends in a direction substantially equal to a direction where the upstream end of the second feed channel extends.

5. The substrate treating apparatus according to claim 3, further comprising:

a first transport chamber that is disposed laterally of the first liquid treatment chamber;

a second transport chamber that is disposed below the first transport chamber and laterally of the second liquid treatment chamber;

a first transport mechanism that is disposed in the first transport chamber and transports the substrate to the first liquid treatment chamber;

a second transport mechanism that is disposed in the second transport chamber and transports the substrate to the second liquid treatment chamber;

a feed channel that supplies gases to the first transport chamber; and a feed channel that supplies gases to the second transport chamber, wherein the distributing pipe is connected to the feed channel for the first transport chamber and the feed channel for the second transport chamber to supply gases to the feed channel for the first transport chamber and the feed channel for the second transport chamber.

6. The substrate treating apparatus according to claim 1, further comprising:

a box that extends substantially vertically; and a partition member arranged in the box, wherein the first vertical member and the second vertical member are formed in the box, and the partition member separates the first vertical member from the second vertical member.

7. The substrate treating apparatus according to claim 6, wherein the box includes a front wall that faces the first liquid treatment chamber and the second liquid treatment chamber, and extends substantially vertically, and lateral walls that are connected to the front wall and are substantially perpendicular to the front wall, and the front wall has a width larger than a width of each of the lateral walls.

8. The substrate treating apparatus according to claim 1, further comprising:

a third feed channel that supplies gases to the first liquid treatment chamber; and a fourth feed channel that supplies gases to the second liquid treatment chamber, wherein the third feed channel includes a third vertical member that extends substantially vertically, the fourth feed channel includes a fourth vertical member that extends substantially vertically, and the third vertical member and the fourth vertical member both extend to at least either a position higher in level than the first liquid treatment chamber or a position lower in level than the second liquid treatment chamber.

9. The substrate treating apparatus according to claim 8, further comprising:

a first blowing unit that is provided in the first liquid treatment chamber and blows gases into the first liquid treatment chamber; and a second blowing unit that is provided in the second liquid treatment chamber and blows gases into the second liquid treatment chamber, wherein both the first feed channel and the third feed channel are connected to the first blowing unit to supply gases through the first blowing unit to the first liquid treatment chamber, and both the second feed channel and the fourth feed channel are connected to the second blowing unit to supply gases through the second blowing unit to the second liquid treatment chamber.

10. The substrate treating apparatus according to claim 1, further comprising
a gas controller that controls a temperature and a humidity of gases, and supplies gases with a controlled temperature and humidity to the first feed channel and the second feed channel.

11. A substrate treating apparatus, comprising:
a first transport chamber;
a second transport chamber that is disposed below the first transport chamber;
a first transport mechanism that is disposed in the first transport chamber and transports a substrate;
a second transport mechanism that is disposed in the second transport chamber and transports a substrate;
a first feed channel that supplies gases to the first transport chamber; and
a second feed channel that supplies gases to the second transport chamber,
the first feed channel including a first vertical member that extends substantially vertically,
the second feed channel including a second vertical member that extends substantially vertically, and
the first vertical member and the second vertical member both extending to at least either a position higher in level than the first transport chamber or a position lower in level than the second transport chamber.

12. The substrate treating apparatus according to claim 11, wherein
one of the first vertical member and the second vertical member is longer than the other of the first vertical member and the second vertical member, and the one of the first vertical member and the second vertical member has a channel sectional area larger than that of the other of the first vertical member and the second vertical member.

13. The substrate treating apparatus according to claim 11, further comprising:
an gas supplying unit that supplies gases, outside the substrate treating apparatus, into the first feed channel and the second feed channel.

14. The substrate treating apparatus according to claim 11, further comprising:
a first blowing unit that is provided in the first transport chamber and blows gases into the first transport chamber; and
a second blowing unit that is provided in the second transport chamber and blows gases into the second transport chamber, wherein
the first feed channel is connected to the first blowing unit to supply gases through the first blowing unit to the first transport chamber, and
the second feed channel is connected to the second blowing unit to supply gases through the second blowing unit to the second transport chamber.

15. A substrate treating apparatus, comprising:
a first liquid treatment chamber;
a second liquid treatment chamber that is disposed below the first liquid treatment chamber;
a first liquid treatment unit that is disposed in the first liquid treatment chamber and performs a liquid treatment to a substrate;
a second liquid treatment unit that is disposed in the second liquid treatment chamber and performs a liquid treatment to a substrate;
a first exhaust channel that exhausts gases of the first liquid treatment chamber; and
a second exhaust channel that exhausts gases of the second liquid treatment chamber,
the first exhaust channel including a first vertical member that extends substantially vertically,
the second exhaust channel including a second vertical member that extends substantially vertically,
the first vertical member and the second vertical member both extending to at least either a position higher in level than the first liquid treatment chamber or a position lower in level than the second liquid treatment chamber, and
one of the first vertical member and the second vertical member is longer than the other of the first vertical member and the second vertical member, and the one of the first vertical member and the second vertical member has a channel sectional area larger than that of the other of the first vertical member and the second vertical member.

16. A substrate treating apparatus, comprising:
a first transport chamber;
a second transport chamber that is disposed below the first transport chamber;
a first transport mechanism that is disposed in the first transport chamber and transports a substrate;
a second transport mechanism that is disposed in the second transport chamber and transports a substrate;
a first exhaust channel that exhausts gases of the first transport chamber; and
a second exhaust channel that exhausts gases of the second transport chamber,
the first exhaust channel including a first vertical member that extends substantially vertically,
the second exhaust channel including a second vertical member that extends substantially vertically, and
the first vertical member and the second vertical member both extending to at least either a position higher in level than the first transport chamber or a position lower in level than the second transport chamber.

17. The substrate treating apparatus according to claim 16, wherein
one of the first vertical member and the second vertical member is longer than the other of the first vertical member and the second vertical member, and the one of the first vertical member and the second vertical member has a channel sectional area larger than that of the other of the first vertical member and the second vertical member.

18. The substrate treating apparatus according to claim 16, further comprising:
a third exhaust channel that exhausts gases of the first transport chamber; and
a fourth exhaust channel that exhausts gases of the second transport chamber, wherein
the third exhaust channel includes a third vertical member that extends substantially vertically,
the fourth exhaust channel includes a fourth vertical member that extends substantially vertically, and
the third vertical member and the fourth vertical member both extend to at least either a position higher in level than the first transport chamber or a position lower in level than the second transport chamber.

19. The substrate treating apparatus according to claim 18, further comprising:
a first suction unit that is provided in the first transport chamber and sucks gases of the first transport chamber; and a second suction unit that is provided in the second transport chamber and sucks gases of the second transport chamber, both the first exhaust channel and the third exhaust channel being connected to the first suction unit, and exhausting gases of the first transport chamber through the first suction unit, and both the second exhaust channel and the fourth exhaust channel being connected to the second suction unit, and exhausting gases of the second transport chamber through the second suction unit.

20. A substrate treating apparatus, comprising:
a first heat treatment chamber;
a second heat treatment chamber that is disposed below the first heat treatment chamber;
a first heat treatment unit that is disposed in the first heat treatment chamber and performs a heat treatment to a substrate;
a second heat treatment unit that is disposed in the second heat treatment chamber and performs a heat treatment to a substrate;
a first exhaust channel that exhausts gases in the first heat treatment chamber; and
a second exhaust channel that exhausts gases in the second heat treatment chamber,
the first exhaust channel including a first vertical member that extends substantially vertically,
the second exhaust channel including a second vertical member that extends substantially vertically, and
the first vertical member and the second vertical member both extending to at least either a position higher in level than the first heat treatment chamber or a position lower in level than the second heat treatment chamber.

21. The substrate treating apparatus according to claim 20, wherein
one of the first vertical member and the second vertical member is longer than the other of the first vertical member and the second vertical member, and the one of the first vertical member and the second vertical member has a channel sectional area larger than that of the other of the first vertical member and the second vertical member.

22. A substrate treating apparatus comprising:
a first liquid treatment chamber;
a second liquid treatment chamber that is disposed below the first liquid treatment chamber;
a first liquid treatment unit that is disposed in the first liquid treatment chamber and performs a liquid treatment to a substrate;
a second liquid treatment unit that is disposed in the second liquid treatment chamber and performs a liquid treatment to a substrate;
a first feed channel that supplies gases to the first liquid treatment chamber; and
a second feed channel that supplies gases to the second liquid treatment chamber,
the first feed channel including a first vertical member that extends substantially vertically,
the second feed channel including a second vertical member that extends substantially vertically, and
the first vertical member and the second vertical member both extending to at least either a position higher in level than the first liquid treatment chamber or a position lower in level than the second liquid treatment chamber,
the substrate treating apparatus further comprising:
a box that extends substantially vertically; and
a partition member arranged in the box, wherein
the first vertical member and the second vertical member are formed in the box,
the partition member separates the first vertical member from the second vertical member, and
an upper end of the partition member is located lower than an upper end of the first vertical member and higher than an upper end of the second vertical member.

* * * * *